United States Patent
Itabashi et al.

(10) Patent No.: US 6,620,674 B1
(45) Date of Patent: Sep. 16, 2003

(54) SEMICONDUCTOR DEVICE WITH SELF-ALIGNED CONTACT AND ITS MANUFACTURE

(75) Inventors: Kazuo Itabashi, Kawasaki (JP); Osamu Tsuboi, Kawasaki (JP); Yuji Yokoyama, Kawasaki (JP); Kenichi Inoue, Kawasaki (JP); Koichi Hashimoto, Kawasaki (JP); Wataru Futo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/638,139

(22) Filed: Aug. 15, 2000

Related U.S. Application Data

(62) Division of application No. 08/890,991, filed on Jul. 10, 1997.

(30) Foreign Application Priority Data

Jul. 10, 1996 (JP) .............................................. 8-181057

(51) Int. Cl.[7] .......................................... H01L 21/8242
(52) U.S. Cl. ...................................................... 438/241
(58) Field of Search ................................ 438/253, 241, 438/244, 387, 395, 396, 397, 398, 675, 691, 692

(56) References Cited

U.S. PATENT DOCUMENTS

| | | |
|---|---|---|
| 4,443,932 A | 4/1984 | Mastrolanni et al. |
| 4,832,789 A | 5/1989 | Cochran et al. |
| 4,958,318 A | 9/1990 | Harai |
| 5,185,282 A | 2/1993 | Lee et al. |
| 5,753,551 A * | 5/1998 | Sung ........................ 438/253 |
| 5,818,110 A | 10/1998 | Cronin |
| 5,835,337 A | 11/1998 | Wantanbe et al. |
| 6,251,726 B1 * | 6/2001 | Huang ........................ 438/253 |

FOREIGN PATENT DOCUMENTS

| | | |
|---|---|---|
| JP | 06-236972 | 8/1994 |
| JP | 8097378 A | 4/1996 |
| JP | 08-125138 | 5/1996 |
| JP | 8-125138 | 5/1996 |
| JP | 08-125141 | 5/1996 |

OTHER PUBLICATIONS

Korean Office Action dated Jul. 30, 2001.

* cited by examiner

*Primary Examiner*—David Nelms
*Assistant Examiner*—Reneé R. Berry
(74) *Attorney, Agent, or Firm*—Armstrong, Westerman & Hattori, LLP.

(57) ABSTRACT

A semiconductor memory device comprising: a first insulating film covering the upper and side surfaces of a gate electrode; a second insulating film formed on the substrate covering the first insulating film; a pair of contact holes formed through the second insulating film and reaching the impurity diffusion regions; a conductive plug embedded in one of the contact holes; a third insulating film formed on the second insulating film covering the conductive plug, and having a first aperture on the other contact hole; a bit line formed on the third insulating film and connected to the other impurity diffusion region through the first aperture and the other contact hole; a fourth insulating film covering the upper and side surfaces of the bit line; a second aperture formed through the third insulating film in alignment with the fourth insulating film covering the side surface of the bit line; a storage electrode formed to extend over the bit line, insulated from the bit line by the third and fourth insulating films, and electrically connected to the conductive plug through the second aperture.

20 Claims, 55 Drawing Sheets

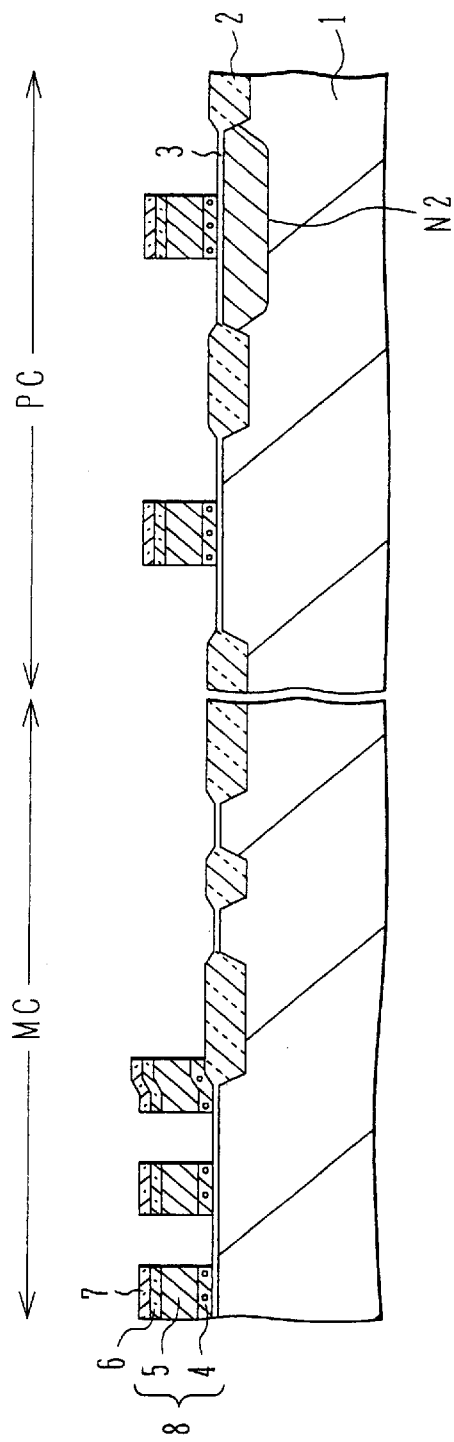
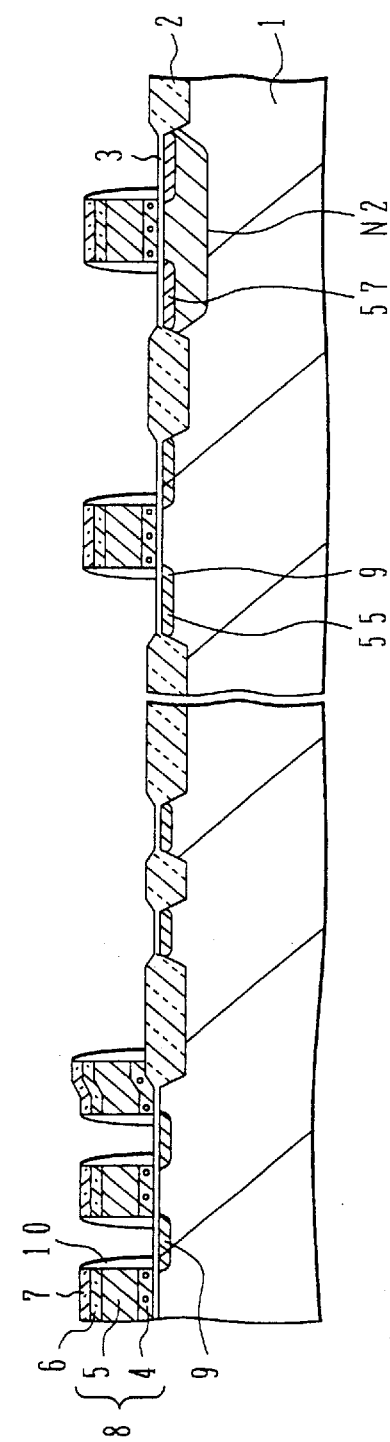

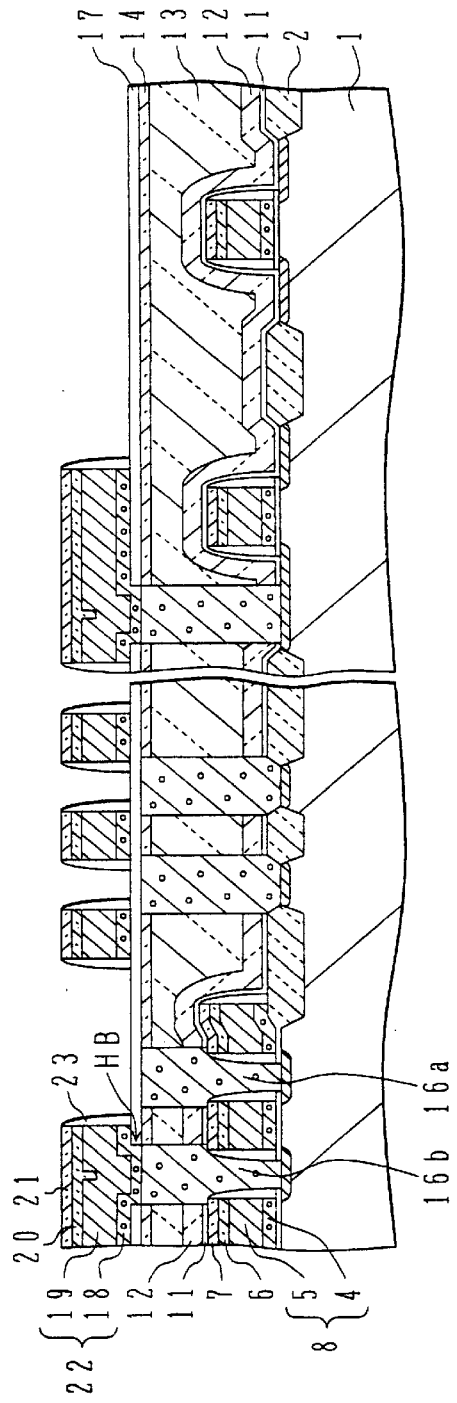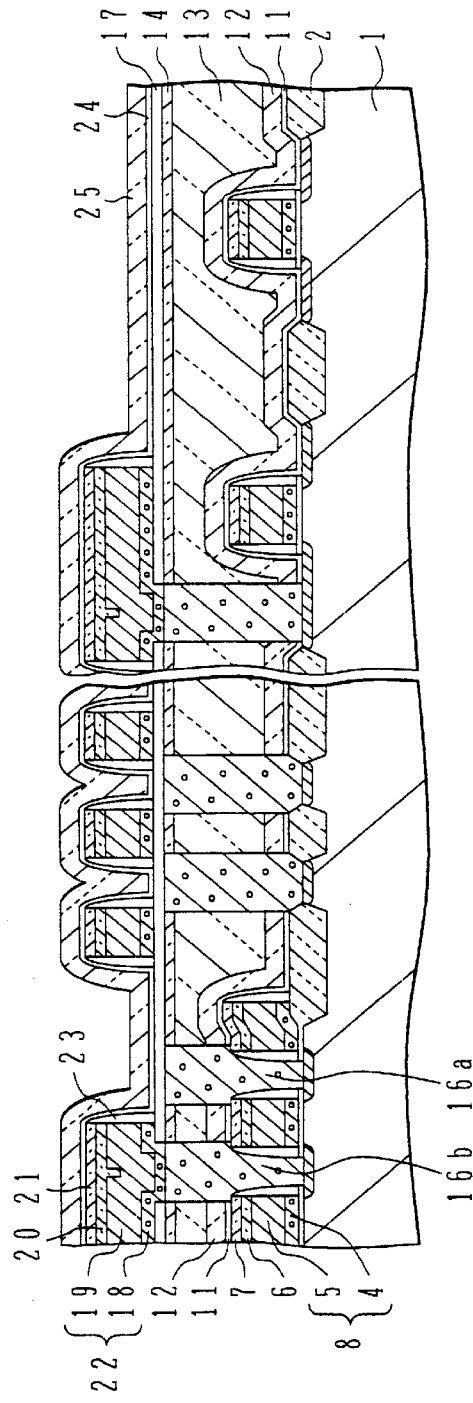

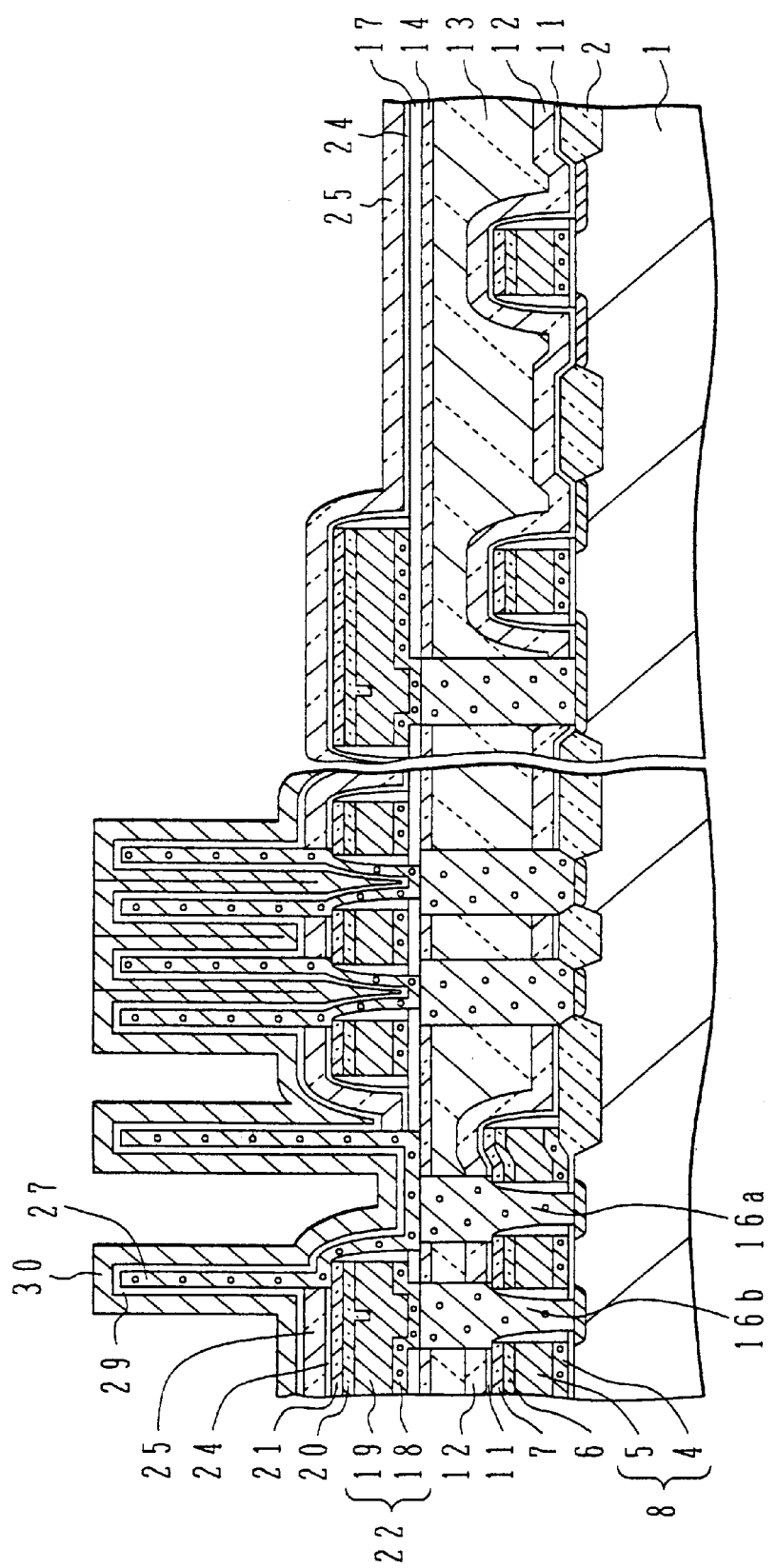

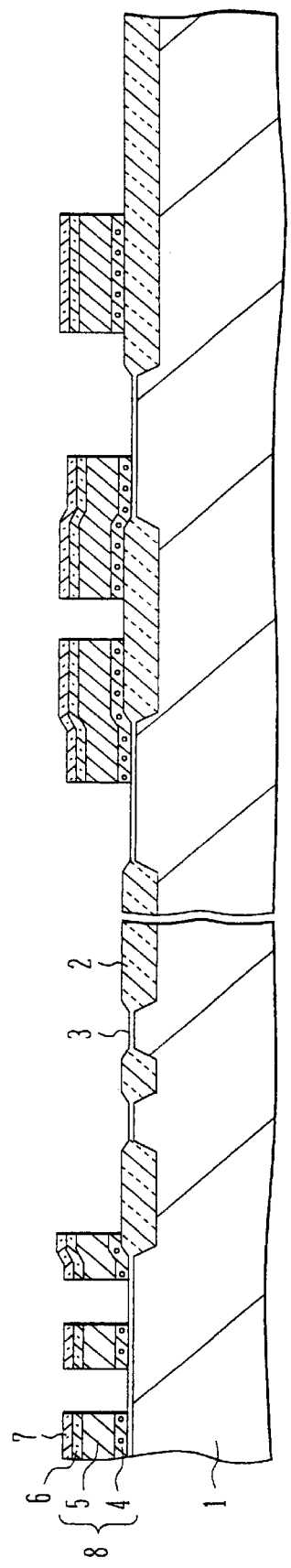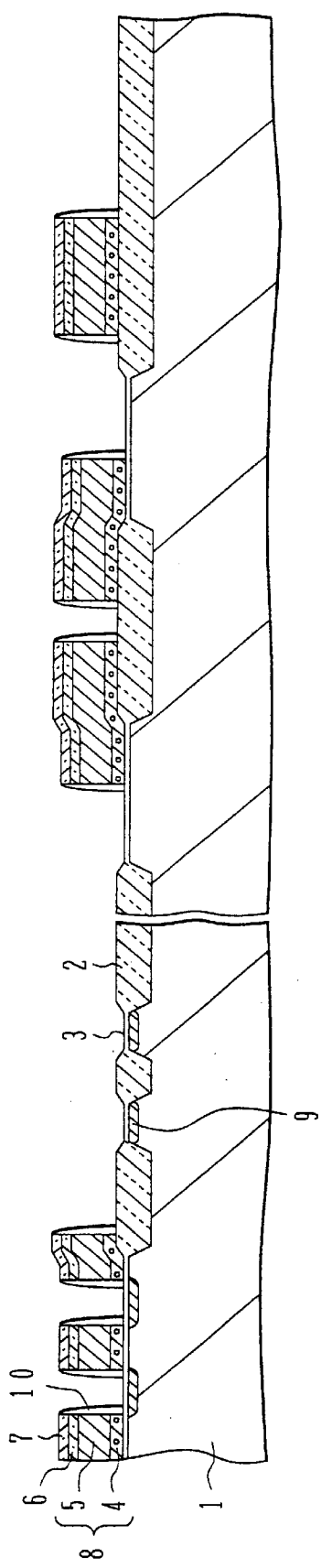

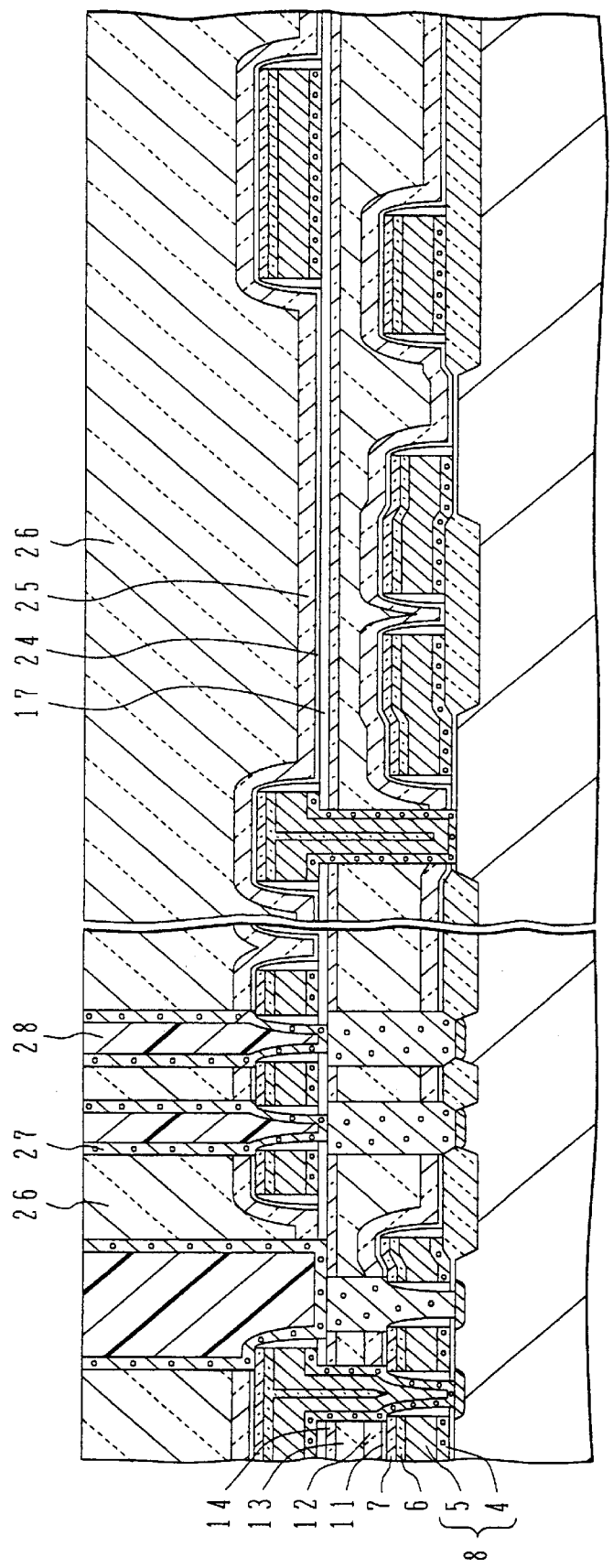

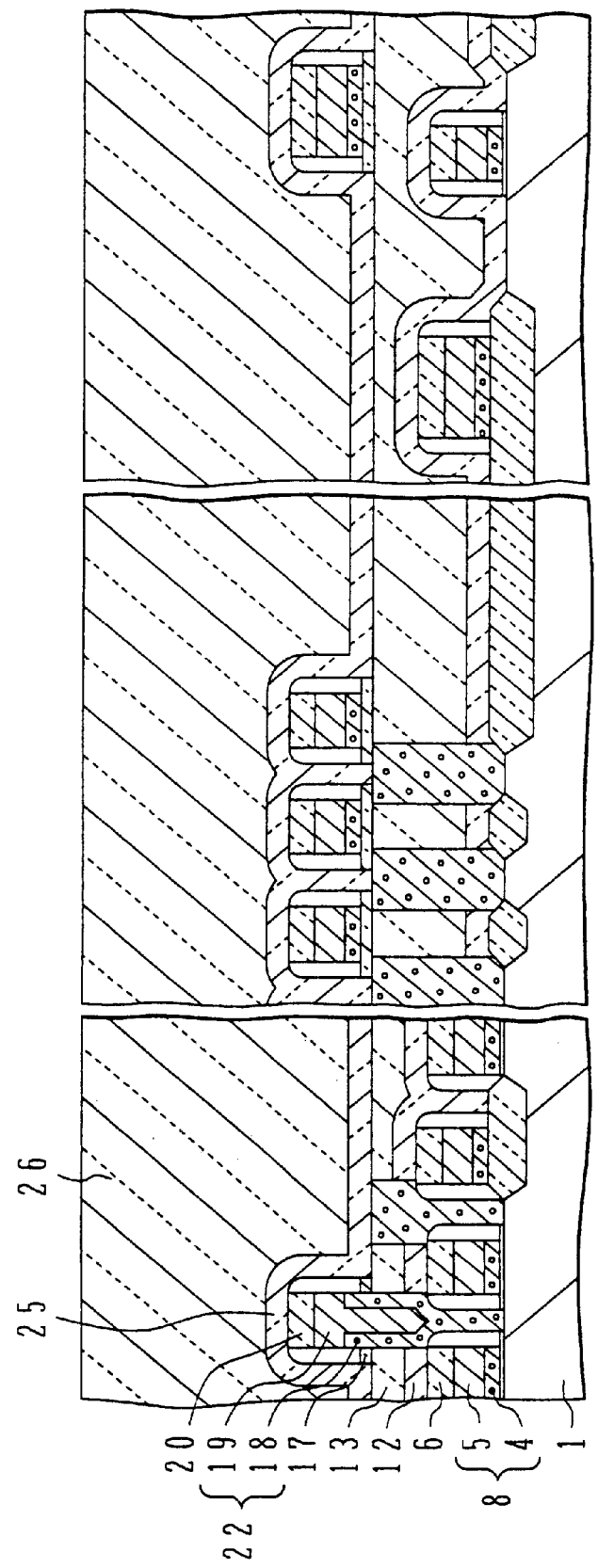

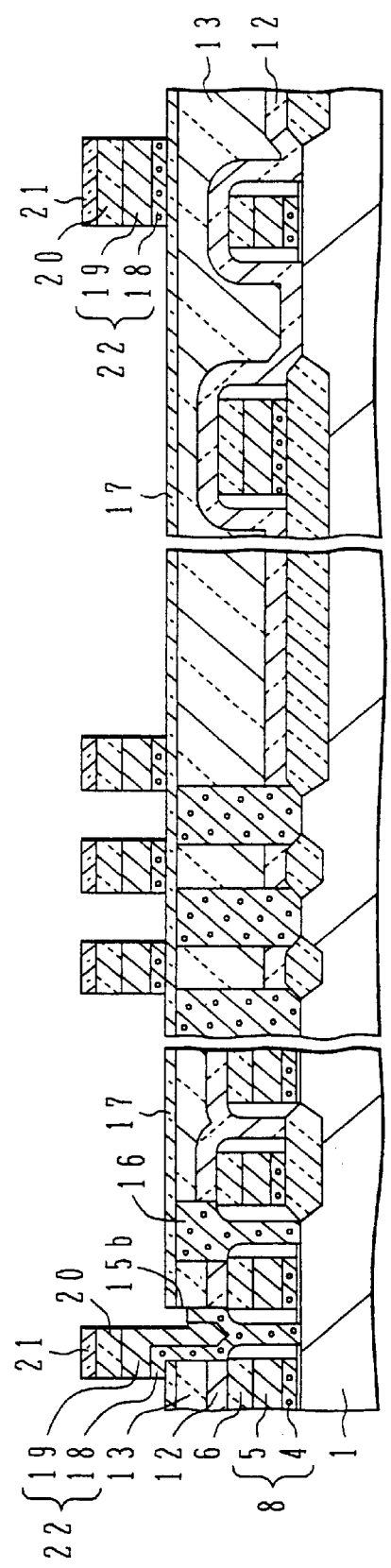

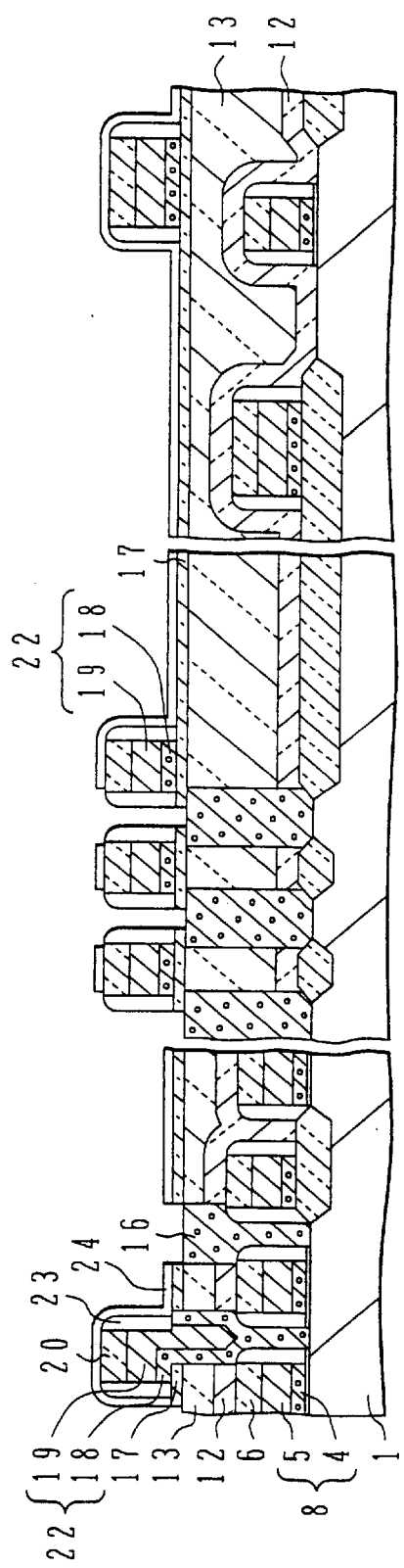
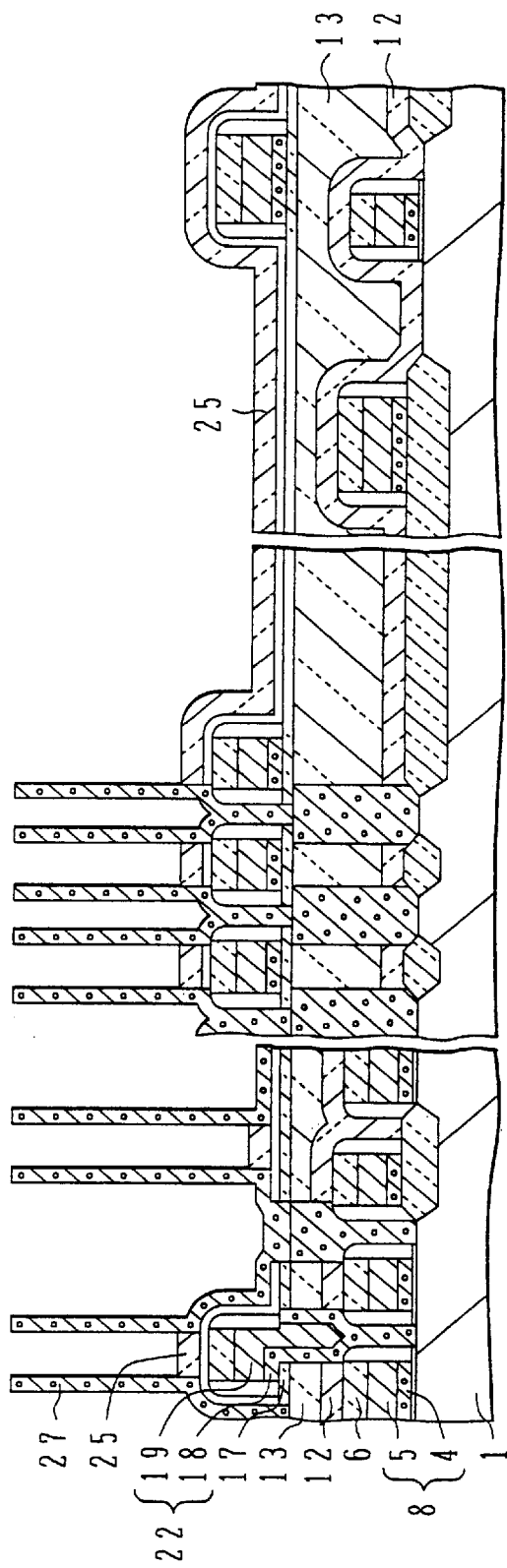
FIG.25A
FIG.25B

SEMICONDUCTOR DEVICE WITH SELF-ALIGNED CONTACT AND ITS MANUFACTURE

This a division of application Ser. No. 08/890,991, filed Jul. 10, 1997

BACKGROUND OF THE INVENTION a) Field of the Invention

The present invention relates to a semiconductor device and its manufacture, and more particularly to a semiconductor device and its manufacture suitable for highly integrated and reliable DRAMs (Dynamic Random Access Memories).

b) Description of the Related Art

It is essential to make a fundamental constituent, a memory cell of DRAM, more and more smaller or finer in order to realize high integration and low cost. A general DRAM cell is constituted of one MOS transistor and one capacitor.

In order to make a memory cell finer, it is therefore substantial that how a large capacitance is obtained from a small cell size.

As a method of procuring a capacitance of a memory cell, a trench type cell and a stack type cell have recently been proposed and adopted as the cell structure of current DRAMs. A trench type cell has a capacitor formed in a trench in the substrate. A stack type cell has a capacitor three-dimensionally stacked over the MOS transistor. More improved cell structures have also been proposed, particularly for stack type cells, such as a fin type cell and a cylinder type cell. A fin type cell has a plurality of storage electrodes disposed generally in parallel with the substrate and upper and lower surfaces of each storage electrode are used as a capacitor. A cylinder type cell has a cylindrical storage electrode disposed generally vertically to the substrate.

By using these cell structures and their manufacture processes, it becomes possible to realize DRAMs of 64 Mbit class.

However, a voltage applied to the capacitor electrode of a trench type capacitor forms a depletion layer near the trench so that the charge accumulating region broadens greatly. If trenches of adjacent capacitors are formed near to each other, leak of stored charges may occur and stored data may be lost. It is therefore necessary to broaden the width of an isolation area between cells, i.e., the width of a field oxide film area. This hinders high integration.

From this reason, stack type capacitors are promising devices which may contribute to high integration and high reliability of DRAMs.

A fine stack type capacitor is reported in "A 0.29-H$\mu$m$^2$ MIM-CROWN Cell and Process Technologies for 1-Gigabit DRAMs", 1994, pp. 927–929.

A cross sectional view of this memory cell is shown in FIG. 29.

In FIG. 28, reference numeral 100 represents a word line or gate electrode, reference numeral 101 represents a first polysilicon plug, reference numeral 102 represents a bit line, reference numeral 103 represents a second polysilicon plug, reference numeral 104 represents a storage electrode, reference numeral 105 represents a dielectric film, and reference numeral 106 represents an opposing electrode. Highly integrated DRAMs are provided by using cylinder type capacitors.

A height of the storage electrode of a cylinder type capacitor is required to be made greater in order to procure a sufficient capacitance even with a small cell area. Therefore, a height difference or step between a memory cell area and a peripheral circuit area becomes large, which becomes a critical issue. For example, in patterning a metal wiring layer on the memory cell area and peripheral circuit area, a size accuracy is lowered because of an insufficient depth of focus of photolithography to be caused by the step.

Although the step between the memory cell and peripheral circuit areas can be removed by filling the concaved peripheral circuit area with an insulating film, an aspect ratio of a contact hole in the peripheral circuit area becomes large, posing another problem of a difficulty of etching control.

As the distance between wiring patterns becomes short as the device becomes fine, a parasitic capacitance of wiring tends to increase.

SUMMARY OF THE INVENTION

It is an object of the present invention to provide a semiconductor device and its manufacture method capable of realizing highly integrated and stable DRAMs, e.g., 256 Mbit or higher, without degrading reliability.

According to one aspect of the present invention, there is provided a semiconductor device having a memory cell area and a peripheral circuit area on a semiconductor substrate, comprising: a transfer transistor in the memory cell area including a pair of impurity diffusion regions formed in the substrate and a gate electrode formed over a surface of the substrate between said pair of impurity diffusion regions; a first insulating film covering the upper and side surfaces of the gate electrode; a second insulating film formed on the substrate covering the first insulating film; a pair of contact holes formed through the second insulating film and reaching the pair of impurity diffusion regions; a conductive plug embedded in one of the contact holes and connected to one of the pair of impurity diffusion regions; a third insulating film formed on the second insulating film covering the conductive plug, and having a first aperture on the other of the pair of contact holes; a bit line formed on the third insulating film and connected to the other of the pair of impurity diffusion regions through the first aperture and the other of the pair of contact holes; a fourth insulating film covering the upper and side surfaces of the bit line; a second aperture formed through the third insulating film in alignment with the fourth insulating film covering the side surface of the bit line; a storage electrode formed to extend over the bit line, insulated from the bit line by the third and fourth insulating films, and electrically connected to the conductive plug through the second aperture; a dielectric film formed on a surface of the storage electrode; and an opposing electrode formed on a surface of the dielectric film.

According to another aspect of the present invention, there is provided a method of manufacturing a semiconductor device having a memory cell area and a peripheral circuit area on a semiconductor substrate, comprising the steps of: forming a transfer transistor in said memory cell area, the transfer transistor including a pair of impurity diffusion regions formed in the substrate and a gate electrode formed on the substrate between the pair of impurity diffusion regions; forming a first insulating film covering the upper and side surfaces of the gate electrode; forming a second insulating film covering the first insulating film and the transfer transistor; forming a contact hole through the&second insulating film, the contact hole reaching one of the impurity diffusion regions; embedding a conductive layer in the contact hole to form a conductive plug for storage electrode contact; forming a third insulating film on the second insulating film covering the conductive plug; forming a bit line on the third insulating film; forming a fourth insulating film covering the upper and side surfaces of the bit line; forming an aperture through the third insulating film on the conductive plug, being aligned with the fourth insulating film; forming a storage electrode electrically connected to the conductive plug; forming a dielectric film on a surface of the storage electrode; and forming an opposing electrode on a surface of the dielectric film.

The plug made of the conductive layer produces a raised structure of the device. Namely, after the word line is formed, the plug for storage electrode contact is formed, the plug being used for the raised structure, and the storage electrode is formed through SAC (self aligned contact) technology between adjacent bit lines. Therefore, the height of the capacitor from the substrate surface can be lowered.

It is possible to reduce a height difference between the memory cell area and peripheral circuit area more than a conventional device structure and to easily form a contact hole in the peripheral circuit area.

The manufacture yield is prevented from being lowered while reducing the number of processes, and this contributes to high integration and high density of semiconductor devices.

BRIEF DESCRIPTION OF THE DRAWINGS

FIGS. 2A to 2H are cross sectional views illustrating the manufacture processes of a semiconductor device according to the first embodiment of the invention.

FIGS. 9A to 9I are cross sectional views illustrating the manufacturing processes of a semiconductor device according to the second embodiment of the invention.

FIGS. 18A to 18L are cross sectional views illustrating the manufacture processes of a semiconductor device according to the ninth embodiment of the invention.

FIGS. 21A to 21D are cross sectional views illustrating the manufacture processes of a semiconductor device according to a tenth embodiment of the invention.

FIGS. 25A and 25B are cross sectional views of a semiconductor device according to the twelfth embodiment of the invention.

DETAILED DESCRIPTION OF THE PREFERRED EMBODIMENTS

Figure 1A:
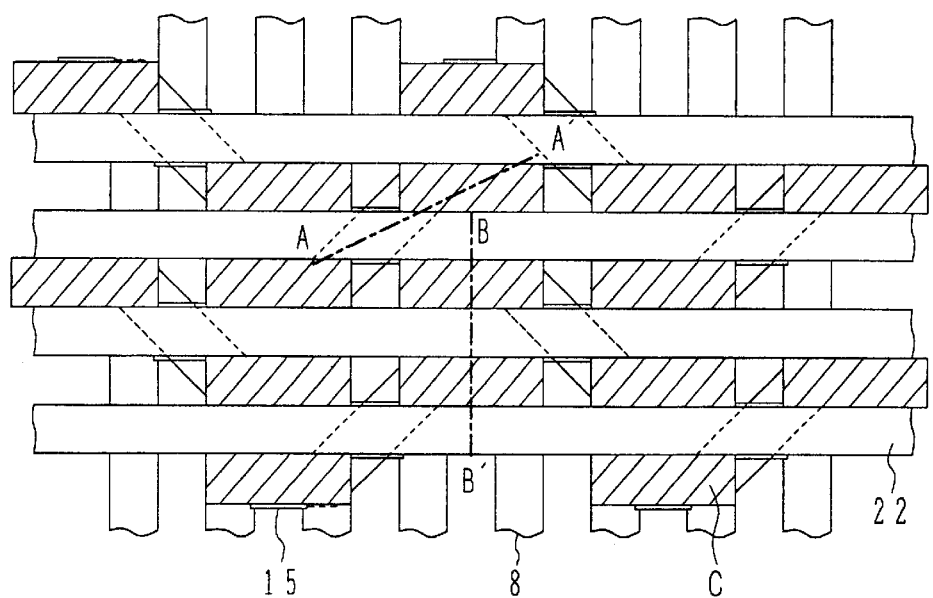
FIGS. 1A and 1B are a plan view and a cross sectional view of a semiconductor device according to a first embodiment of the invention.

Embodiments of the invention will be described with reference to the accompanying drawings.

The first embodiment of the invention is illustrated in FIGS. 1A to 2H.

In these Figures, reference numeral 1 represents a p-type silicon substrate, 2—a field $SiO_2$ film, 3—a gate oxide film, 4—a silicon layer, 5—a tungsten silicide (WSi) layer, 6—an $SiO_2$ film, 7—an $SiO_2$ film, 8—a gate electrode (word line of first wiring layer), 9—an n$^-$type impurity doped layer, 10—a side wall, 11—an $SiO_2$ film, 12—an $Si_3N_4$ film, 13—a borophosphosilicate glass (BPSG) film, 14—an $Si_3N_4$ film, 15—a contact hole, 16—a conductive plug, 17—an $SiO_2$ film, 18—a silicon layer, 19—a WSi layer, 20—an $SiO_2$ layer, 21—an $SiO_2$ film, 22—a bit line (second wiring layer), 23—a side wall, 24—an $SiO_2$ film, 25—an $Si_3N_4$ film, 27—a storage electrode, 29—a $Ta_2O_5$ film as capacitor dielectric film, 30—a TiN film as a capacitor opposing electrode, 31—a BPSG film as an interlayer insulating film, and N1, P1, and P2 n-, p-, and p-wells. Representation of wells may be omitted in the following.

FIG. 1A is a plan view of a memory cell area of the semiconductor device of this embodiment. In FIG. 1A, a word line 8 is disposed vertically, a bit line 22 is disposed horizontally over the word line, and a capacitor C is disposed over the bit line.

Figure 1B:
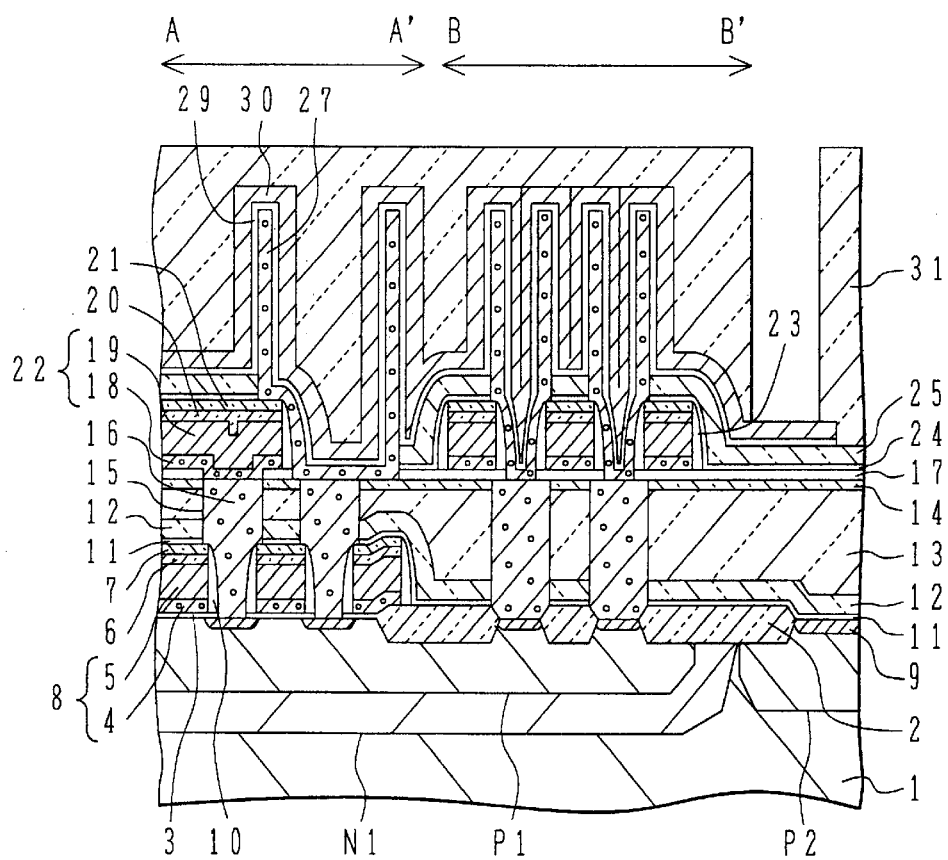

FIG. 1B is a cross sectional view of the memory cell area corresponding to FIG. 1A. The cross sectional view taken along line A–A' crosses the word and bit lines, and the cross sectional view taken along line B–B' crosses the bit line and is parallel to the word line. For the sake of brevity, the A–A' portion and the B–B' portion are shown continuously.

FIGS. 2A to 6 are cross sectional views of a semiconductor substrate illustrating a semiconductor device manufacture method of this embodiment. The left side in these drawings corresponds to the memory cell area MC, and the right side corresponds to the peripheral circuit area PC. The memory cell area MC corresponds to the area of FIG. 1B. An n-well N2 is also formed in the peripheral circuit area PC. The memory cell area MC corresponds to the area of FIG. 1B. An n-well N2 is also formed in the peripheral circuit area PC. The semiconductor device manufacture method will be described with reference to these drawings.

As shown in FIG. 2A, on a p-type silicon substrate 1, a field $SiO_2$ film 2 of 250 nm thick is formed by a well known technique, LOCOS isolation (selective oxidation). Thereafter, an $SiO_2$ film 3 of 5 to 10 nm thick is formed by thermal-oxidation, this film being a gate oxide film.

Next, a silicon layer 4 of 50 nm thick highly doped with n- or p-type impurities, a WSi layer 5 of 120 nm thick, and an $SiO_2$ film 6 of 80 nm thick are sequentially formed over the whole surface of the substrate by CVD. The doped silicon layer 4 may be single crystal silicon, polysilicon, or amorphous silicon.

Next, an anti-reflection film 7 is formed by plasma CVD. This anti-reflection film 7 absorbs an exposure wavelength used by photolithography and is, for example, an SiON film of about 30 nm thick.

By using a resist mask pattern (not shown), the SiON film 7 and $SiO_2$ film 6 are selectively etched, for example, by F containing etchant gas and the WSi layer 5 and polysilicon layer 4 are selectively etched, for example, by Cl containing etchant gas, to thereby form a gate electrode 8 which is connected to a word line.

As shown in FIG. 2B, by using the gate electrode 8 as a mask, P (phosphorous) ions are implanted into the silicon substrate 1 to form an $n^-$-type impurity diffusion region 9. The $n^-$-type impurity diffusion region 9 is the source/drain region of a transfer transistor in the memory cell area, and in the peripheral circuit area an LDD diffusion region of an n-channel transistor. Next, an $SiO_2$ film of 60 nm thick is formed over the whole surface of the substrate by low pressure CVD, and a side wall 10 of $SiO_2$ is formed by anisotropic etching.

In the peripheral circuit area, arsenic ions are implanted into the n-channel transistor region to form an $n^+$-type diffusion region 55, and boron ions are implanted into a p-channel transistor region in the n-well N2 to form a $p^+$-type diffusion region 57.

Figure 2C:
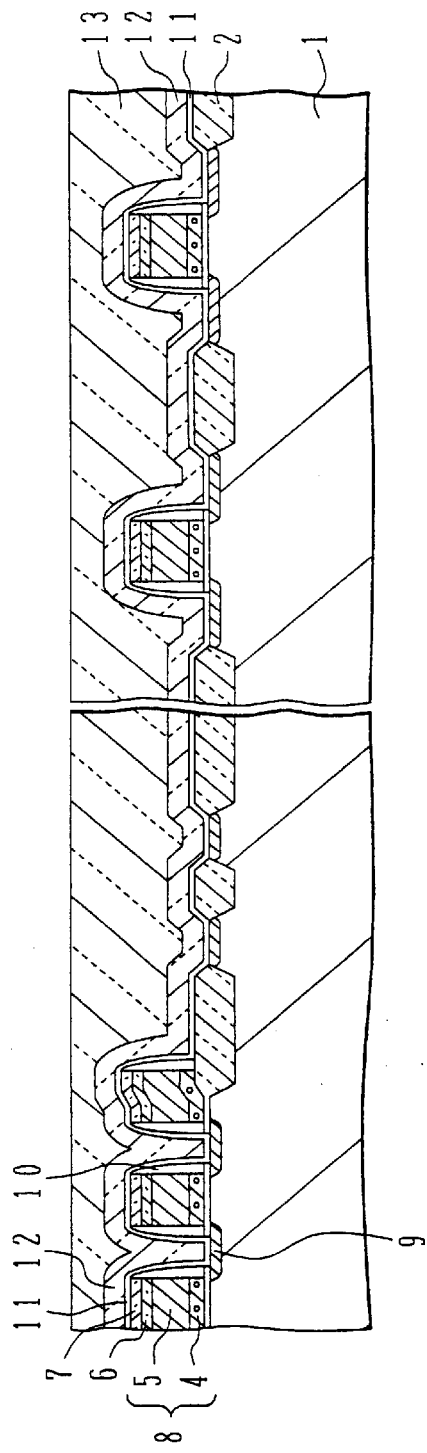

As shown in FIG. 2C, an $SiO_2$ film 11 of 20 nm thick and an $Si_3N_4$ film 12 of 50 to 100 nm thick or preferably 80 nm thick are formed over the whole surface of the substrate by low pressure CVD.

Next, a BPSG film 13 of 300 to 400 nm thick is formed as a planarizing film over the whole surface of the substrate and is reflowed by heat treatment at about 800° C. in a nitrogen aatmosphere. For more complete planarization, the surface is preferably polished and planarized by CMP (Chemical Mechanical Polishing).

In place of the BPSG film, a phosphosilicate glass (PSG), spin on glass (SOG), insulating resin, or the like may be used.

The $SiO_2$ film 11 serves as a stopper film when the $Si_3N_4$ film 12 is removed. If the $Si_3N_4$ film 12 is made thick, capacitance of wiring patterns increases because of its higher dielectric constant than $SiO_2$. It is therefore preferable to make the $Si_3N_4$ film 12 thin, provided that it has sufficient function as an etching stopper.

Figure 2D:
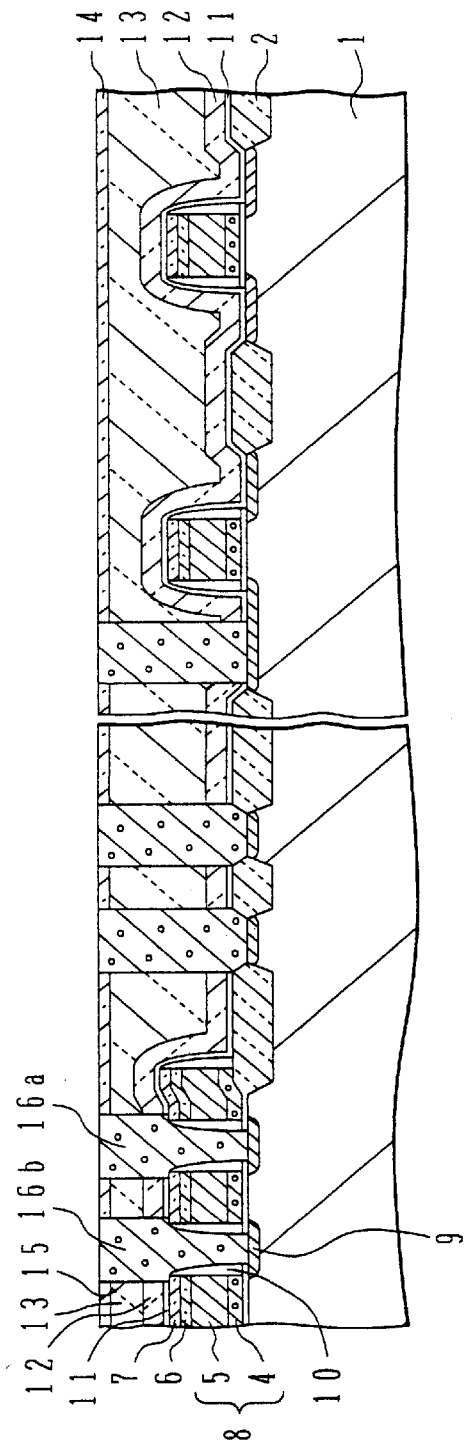

As shown in FIG. 2D, an $Si_3N_4$ film 14 of 50 nm thick is formed by low pressure CVD over the whole surface of the substrate and selectively etched by using a resist mask pattern (not shown). Next, the BPSG film 13 is selectively etched until the $Si_3N_4$ film 12 is slightly etched, and then the $Si_3N_4$ film 12 and $SiO_2$ film 11 are selectively removed. By the selective etching of the $Si_3N_4$ film 12, a hole is formed under the opening of the $Si_3N_4$ 14, with the $SiO_2$ film 11 being left on the bottom of the hole. By the selective etching of the $SiO_2$ film, the substrate surface is exposed. The side wall 10 is hardly etched.

More detailed description will be given on the process in the region between adjacent word lines. In the state of FIG. 2C, the upper surface of the word lines is covered with the oxide film 6 and the SiON film 7. The side surface of the word lines is covered with a side wall (spacer) of silicon oxide. Covering such a word line structure, the oxide film 11 and the nitride film 12 are formed on the whole surface of the substrate. The BPSG film 13 is formed further thereon. Viewing the region between the adjacent word line structures from the above, the BPSG film 13, the nitride film 12 and the oxide film 11 exist in this order in a configuration projecting downwardly. These films can be respectively etched selectively from the above. When the BPSG film 13 is etched anisotropically and selectively using a photoresist mask, etching is stopped in a state where the nitride film 12 is exposed at the bottom surface. Since the nitride film 12 and the oxide film 11 are formed conformal to the side walls of the word line structure and the substrate surface, etching is terminated following the shape of these. When the nitride film 12 is selectively etched next, etching terminates in the state where the oxide film 11 is exposed. In this state, the region between the word line structures is occupied by the etched hole except the oxide film 11. When the thin oxide film 11 is removed, the substrate surface is exposed. The word line structures can be retained almost perfectly without any substantial deformation.

In this manner, contact holes 15 by SAC are formed. Next, a doped silicon layer of 300 nm thick is embedded in the contact holes 15 by low pressure CVD, and removed at the area on the $Si_3N_4$ film 14 by CMP. A plug 16b is used for bit line connection and a plug 16a is used for storage electrode connection. The plugs 16a and 16b are represented collectively by a plug 16 hereinafter.

The plug 16 may be formed by W, TiN, or the like instead of doped silicon. W or TiN layer may be deposited by CVD.

As shown in FIG. 2E, an $SiO_2$ film 17 of 20 to 60 nm thick is formed over the whole surface of the substrate by low pressure CVD. It is preferable to form the oxide film of a dense high temperature oxide (HTO) film. Such a film is conformal. Since the underlying surface is planarized, a flat film having a flat surface is formed. This $SiO_2$ film 17 insulates at necessary areas the plug 16 and the bit line of a second layer wiring. Next, by using a resist mask pattern (not shown), the $SiO_2$ film 17 is selectively etched to form a contact hole HB of the bit line. In the right side area of the drawing, a contact hole for the plug and upper wiring layer is also formed. Next, a doped silicon layer 18 of 40 nm thick, a WSi layer 19 of 120 nm thick, and an $SiO_2$ film 20 of 120 nm thick are sequentially formed over the whole surface of the substrate by low pressure CVD, and then an SiON film 21 as an anti-reflection film is formed on the $SiO_2$ film 20 by plasma CVD. Next, by using a resist mask pattern (not shown), these layers are selectively removed to form a bit line 22. In the peripheral circuit, wiring is also formed which is connected to the lower plug according to necessity.

An $SiO_2$ film of 60 nm thick is then formed over the whole surface of the substrate by low pressure CVD and anisotropically etched to form a side wall 23 of $SiO_2$.

As shown in FIG. 2F, an SiO$_2$ film 24 of 10 to 30 nm and an Si$_3$N$_4$ film 25 of 60 to 100 nm are sequentially formed over the whole surface of the substrate by low pressure CVD.

Figure 2G:
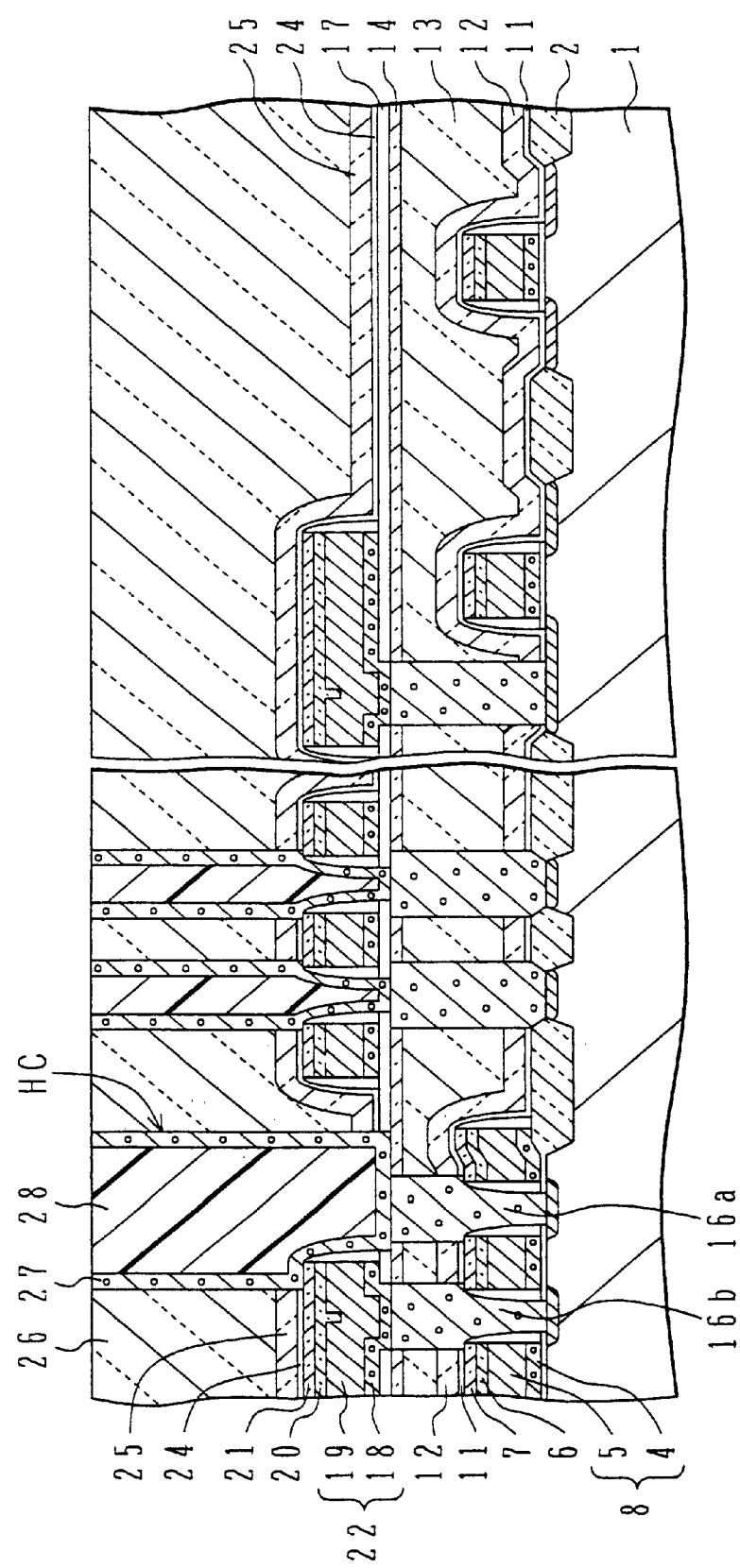

Next, as shown in FIG. 2G, a BPSG film 26 of 1000 to 1500 nm thick is formed as a planarizing film over the whole surface of the substrate and is reflowed by heat treatment at about 800° C. in a nitrogen atmosphere. For more complete planarization, the surface is preferably polished and planarized by CMP.

The SiO$_2$ film 24 serves as a stopper film when the Si$_3$N$_4$ film 25 is removed, and is formed in order to ensure a sufficient breakdown voltage. The Si$_3$N$_4$ film 25 serves as a stopper film when the BPSG film 26 is removed. If the Si$_3$N$_4$ film 25 is made thick, capacitance of wiring patterns increases because of its higher dielectric constant than SiO$_2$. It is therefore preferable to make the Si$_3$N$_4$ film 25 thin provided that it can serve as an etching stopper.

Next, by using a resist mask pattern (not shown), the BPSG film 26, Si$_3$N$_4$ film 25, and SiO$_2$ film 24 are sequentially and selectively etched to form a contact area HC for a storage electrode. Similar to forming the contact hole 15 for the plug 16, self alignment is realized by the SiO$_2$ film 24 and Si$_3$N$_4$ film 25 covering the bit line structure.

A doped silicon layer of 60 nm thick is formed over the whole surface by low pressure CVD to form a storage electrode layer in the contact area HC. A resist film 28 is coated embedding the inner space of the contact area and polished by CMP to remove the silicon layer on the BPSG film 26 and form a storage electrode 27.

The resist 28 in the storage electrode 27 is removed. Next, by using the Si$_3$N$_4$ film 25 and silicon storage electrode 27 as an etching stopper, the BPSG film 26 is removed by using HF containing etchant gas to expose the outer side of the storage electrode 27.

As shown in FIG. 2H, the surface of the storage electrode 27 is nitrized by rapid thermal nitrization (RTN). Next, a Ta$_2$O$_5$ film 29 of 5 to 15 nm thick is formed by low pressure CVD, and thermal oxidation at about 800 to 850° C. or oxygen plasma anneal is performed. In this manner, a capacitor dielectric film is formed.

A TiN film as an opposing electrode is formed on the whole surface by low pressure CVD and etched by using a resist mask pattern (not shown) to form an opposing electrode 30.

Thereafter, an interlayer insulating film is formed and contact holes are formed to obtain the structure shown in FIG. 1B. After the processes such as wiring pattern formation, a stack type capacitor can be manufactured.

This embodiment has a structure raised by the plug 16. Specifically, after the word line is formed, the plug 16 is formed to obtain the raised structure and the storage electrode 27 is formed between bit lines by SAC. It is therefore possible to lower the height of the capacitor by an amount corresponding to the bit line structure.

A height difference or step between the memory cell area and peripheral circuit area can be reduced, and contact holes in the peripheral circuit area can be easily formed.

In this embodiment, as shown in FIG. 1A, the contact hole of the storage electrode is opened in a lattice area surrounded by the word and bit lines.

Figure 3:
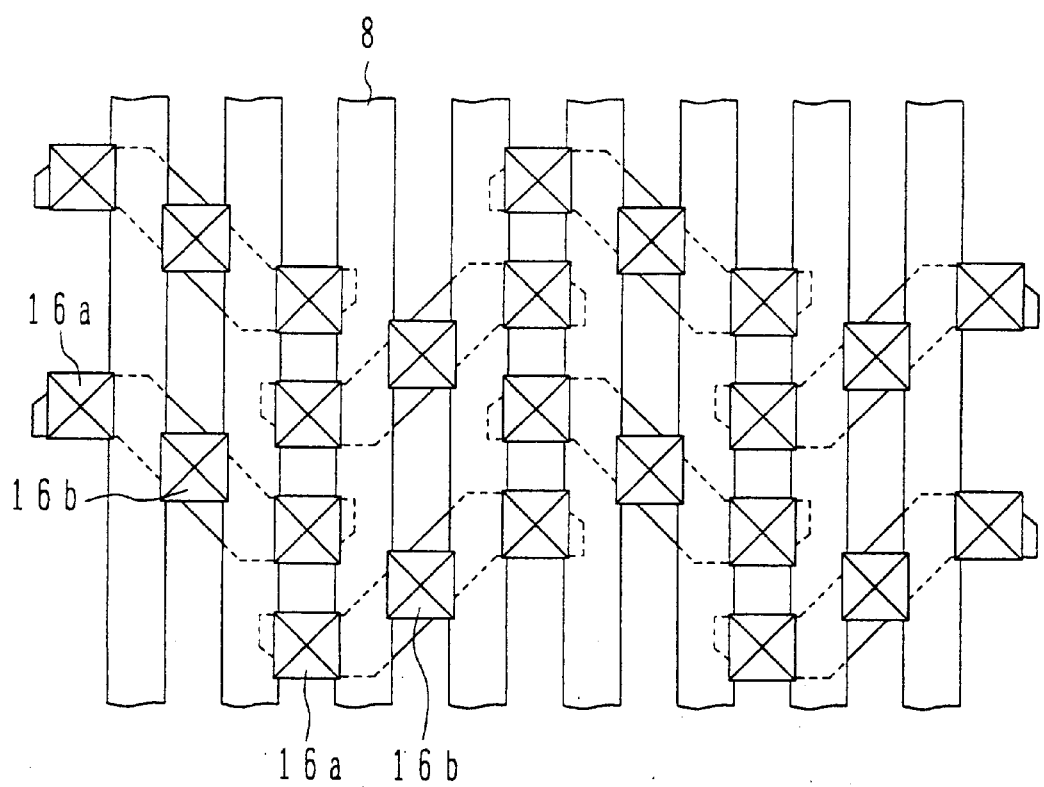
FIG. 3 is a plan view corresponding to the cross sectional view of FIG. 2D.

FIG. 3 is a plan view of the substrate after the process of forming the plugs 16b in the bit line contact hole and the plug 16a in the storage electrode contact hole, and corresponds to FIG. 2D.

If 0.2 μm design rule is used and an insulating film such as a side wall is formed to a thickness of 0.06 μm on each side of a 0.2 μm square contact hole surrounded in a 0.2 μm square area, the actual contact hole is 0.08 μm square. Such a fine and deep contact hole is very difficult to etch.

It is necessary to use an excimer stepper having a short wavelength in order to improve a resolution for the manufacture of highly integrated semiconductor devices, particularly 256 Mbit or larger DRAM devices (design rule of 0.22 μm or shorter). However, such an excimer stepper only is insufficient when its resolution and manufacture margin are considered, and some ultra-high resolution approaches are required. Of these, the most leading approach is a method called a phase shift method. A Levenson type phase shift method is most effective and is highly expected, which method inverts the phases of adjacent patterns by 180 degrees.

However, only the pattern in conformity with the principle that the phases of adjacent patterns are inverted, can exhibit the effects of this method. In the layout of the plug shown in FIG. 3, one bit line contact 16b is adjacent to two storage electrode contacts in triangular shape. Three contacts which are adjacent to one another cannot be arranged to be opposite phase one another. Therefore, the layout of FIG. 3 is difficult to be applied to Levenson type phase shift.

The bit line is required to be connected also to an n-type diffusion region in the peripheral circuit area (particularly a sense amplifier). In this case, the plug 16 is also formed in the peripheral circuit area as shown in FIG. 2D. That is to say, the contact structure in the peripheral circuit area is constituted of the bit line, plug, n-type diffusion region and has two pairs of contact surfaces. Therefore, the contact resistance becomes large as compared to direct contact between the bit line and the diffusion region and a variation of contact resistances may occur.

The contacts are more dispersed in the peripheral circuit area than in the memory cell area, and have an isolated pattern. In this case, even if Levenson type phase shift is applied to patterning of the plug 16, this method is not effective for the isolated pattern. Rather, even if the exposure conditions (numerical aperture, σ value, exposure time) are optimized to exhibit the effects of Levenson type phase shift, a contact hole cannot be opened if it hasn't a larger diameter.

[2nd Embodiment]

In the second embodiment, plugs 16 are formed only in the contact holes of storage electrodes in order to exhibit the effects of Levenson type phase shift.

The bit line is directly connected to the peripheral circuit area so that a variation of contact resistances can be suppressed.

The second embodiment will be described specifically with reference to FIGS. 4A to 9I in which similar reference numerals denote similar elements. The description of the processes corresponding to FIGS. 1A to 3 is omitted.

Figure 4A:
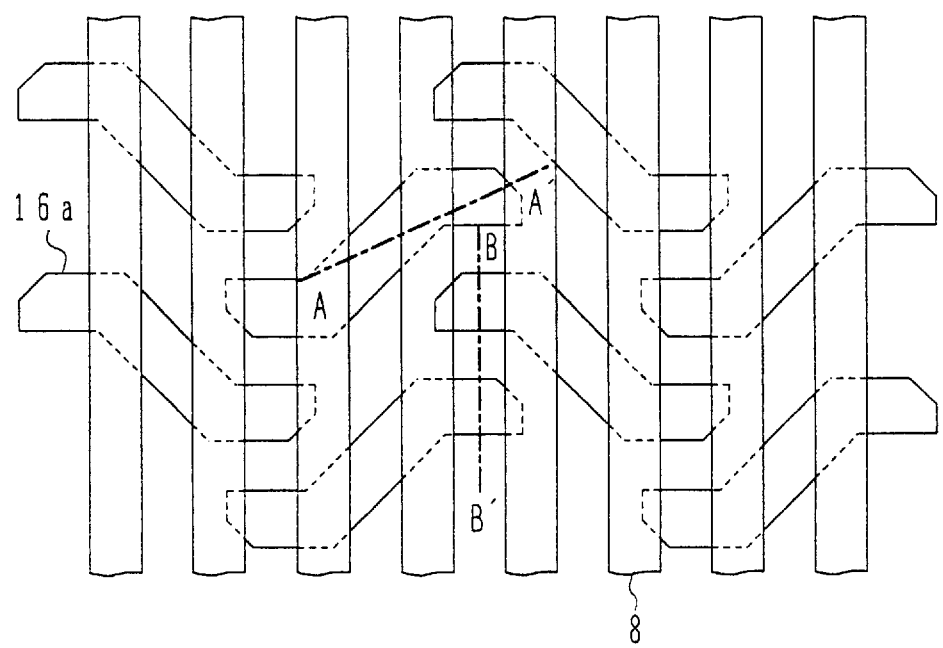
FIGS. 4A to 8B are plan views of a memory cell area and a peripheral circuit area of a semiconductor device according to a second embodiment of the invention, wherein drawings with character A illustrate a memory cell area and drawings with character B illustrate a peripheral circuit area.
Figure 4B:
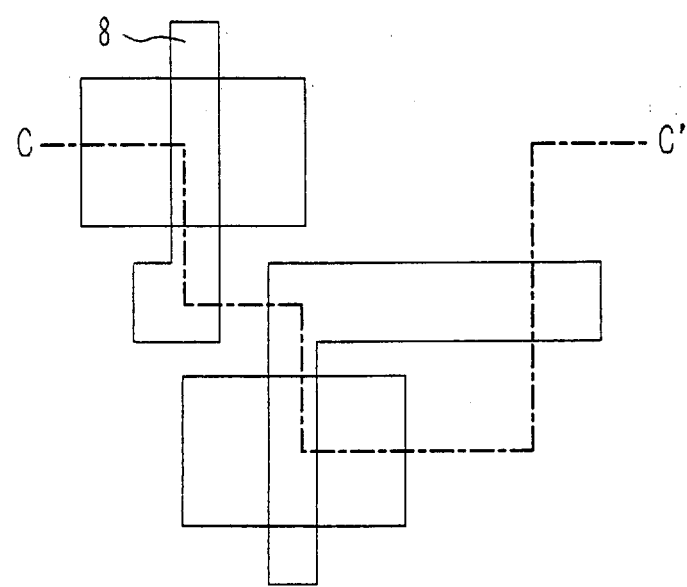
Figure 5A:
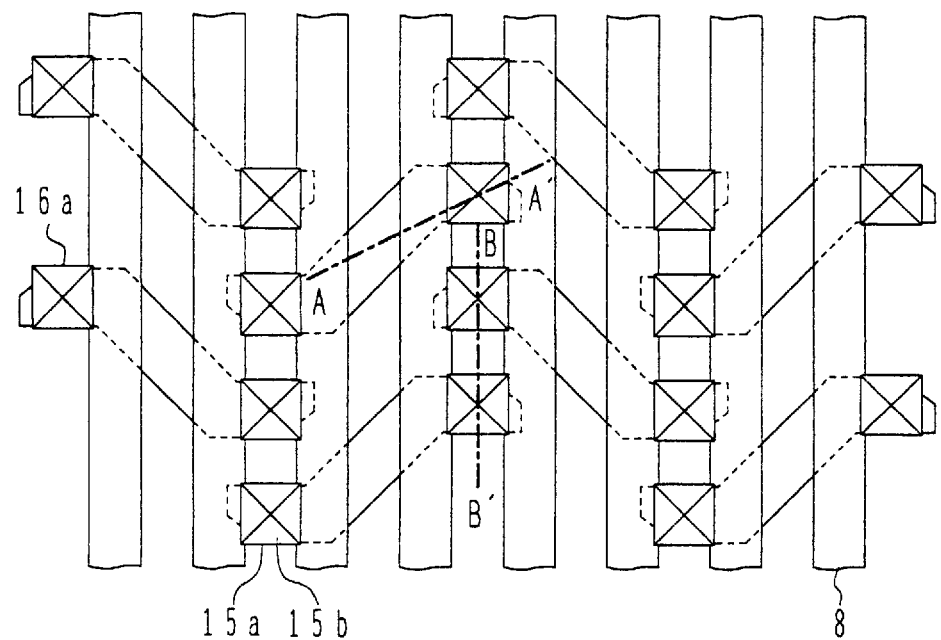
Figure 5B:
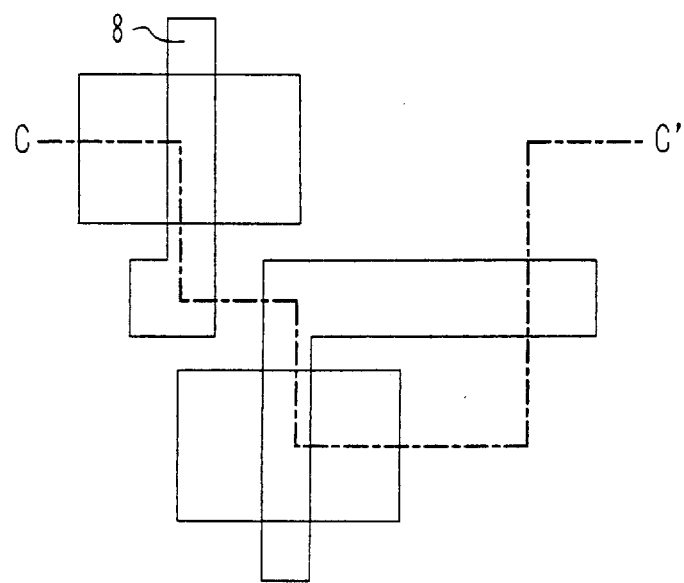

FIGS. 4A, 5A, . . . , 8A are plan views of memory cells of this embodiment. A word line 8 extends vertically in FIGS. 4A, 5A, . . . , 8A. FIGS. 4B, 5B, . . . , 8B are plan views of two MOS transistors in the peripheral circuit area of this embodiment.

FIGS. 9A to 9I are cross sectional views illustrating the manufacture processes of a semiconductor device of this embodiment. FIGS. 9A to 9I correspond to the cross sectional views of the memory cell area MC of FIGS. 4A, 5A, . . . , 8A taken along lines A–A' and B–B', and to the cross sectional views of the peripheral circuit area PC of FIGS. 4B, 5B, . . . , 8B taken along line C–C'.

As shown in FIGS. 4A, 4B, and 9A, on a p-type silicon substrate 1, a field oxide film 2 is formed and thereafter, a gate oxide film 3 and a gate electrode 8 are formed, by using similar techniques described with FIG. 2A. The gate electrode is connected to a word line. Well structures are omitted, but may be similar to those of FIG. 1B.

As shown in FIG. 9B, by using similar techniques described with FIG. 2B, an n⁻-type impurity diffusion region 9 is formed by using the gate electrode 8 as a mask. The n⁻-type impurity diffusion region 9 becomes the source/drain region of a transfer transistor. Next, an SiO$_2$ film of 60 nm thick is formed and anisotropically etched to form a side wall 10 of SiO$_2$.

Figure 9C:
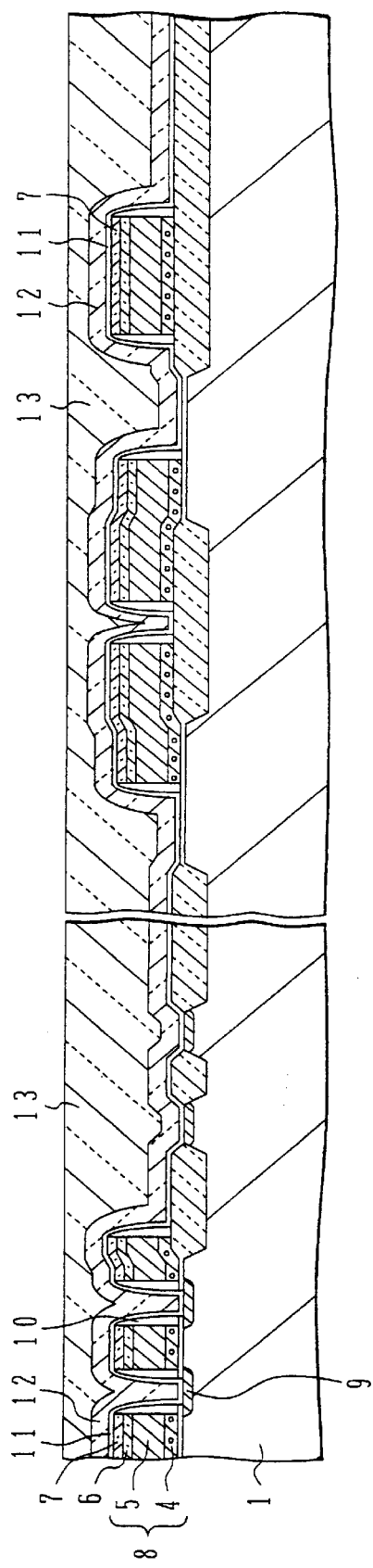

As shown in FIG. 9C, by using similar techniques described with FIG. 2C, an SiO$_2$ film 11 and an Si$_3$N$_4$ film 12 are formed.

Next, a BPSG film 13 is formed as a planarizing film and reflowed by heat treatment. For more complete planarization, the surface of the BPSG film is preferably polished by CMP.

Figure 9D:
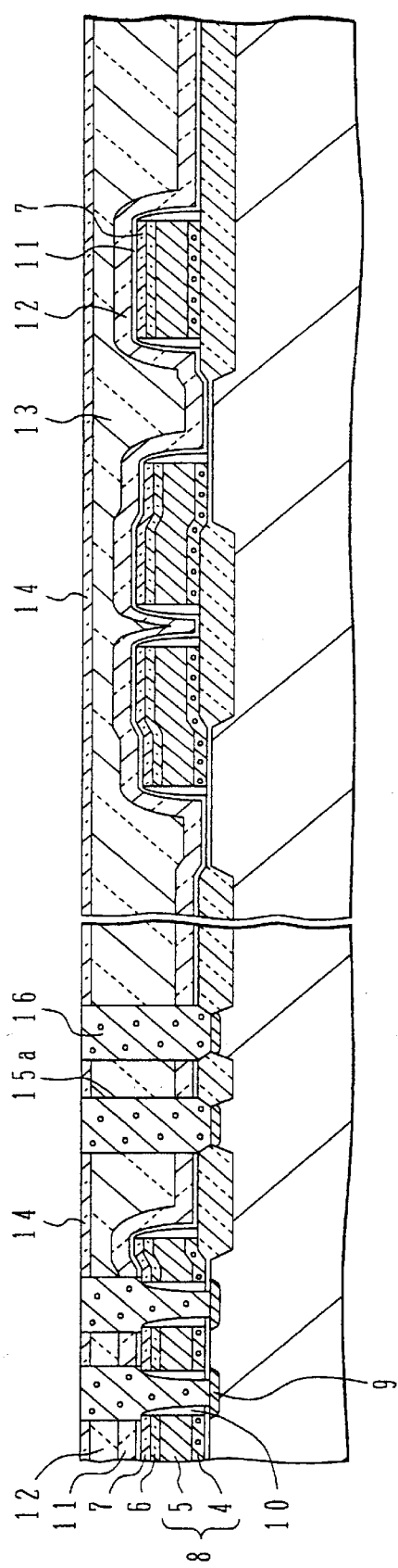

As shown in FIGS. 5A, 5B, and 9D, an Si$_3$N$_4$ film 14 is formed on the whole surface of the substrate by low pressure CVD. By using a resist mask (not shown) patterned in conformity with Levenson type phase shift, the Si$_3$N$_4$ film 14, BPSG film 13, Si$_3$N$_4$ film 12, and SiO$_2$ film 11 are selectively removed to form only contact holes 15a via which storage electrodes contact the n⁻-type impurity diffusion regions 9. At this stage, contact holes via which bit lines are connected to the n⁻-type diffusion regions 9 and contact holes in the peripheral circuit area are not formed.

A doped silicon layer of 300 nm thick is embedded in the contact hole 15a by low pressure CVD and the doped silicon layer on the Si$_3$N$_4$ film 14 is removed by CMP to form a conductive plug 16a.

Figure 6A:
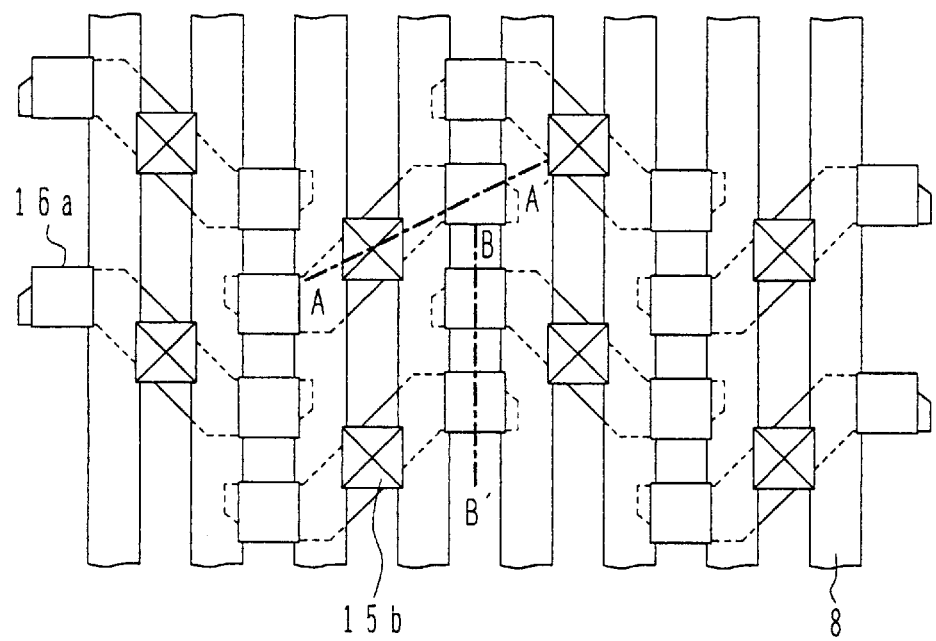
Figure 6B:
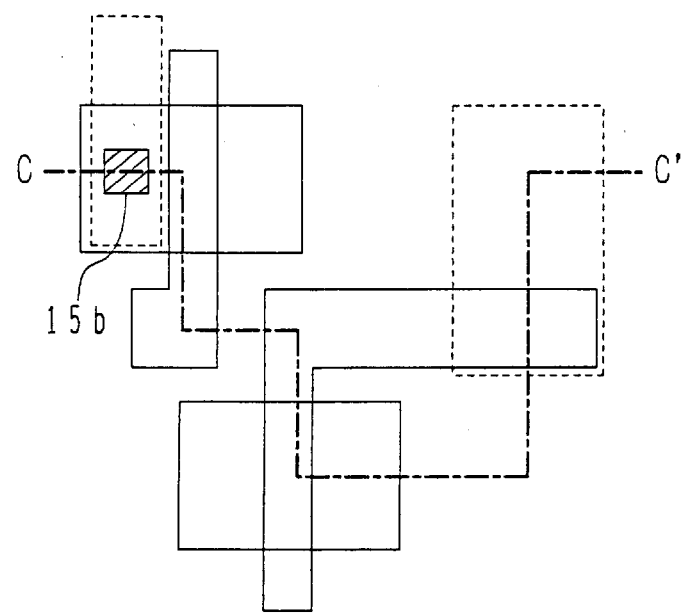
Figure 9E:
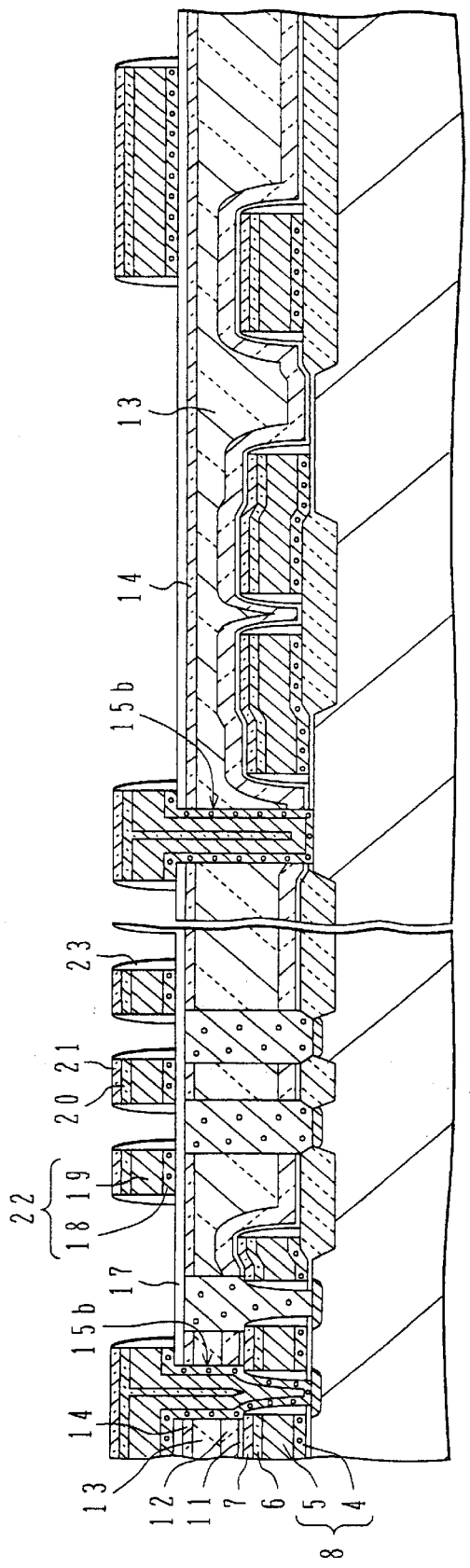

As shown in FIGS. 6A, 6B, and 9E, an SiO$_2$ film 17 of 20 to 60 nm thick is formed over the whole surface of the substrate by low pressure CVD. This SiO$_2$ film 17 covers the surface of the plug 16a, and electrically isolates the plug 16a and the bit line of the second wiring layer.

Next, by using a resist mask pattern (not shown), the SiO$_2$ film 17, Si$_3$N$_4$ film 14, BPSG film 13, Si$_3$N$_4$ film 12, and SiO$_2$ film 11 are selectively removed to form at the same time contact holes 15b for bit lines 22 and contact holes 15b in the peripheral circuit area.

Figure 7A:
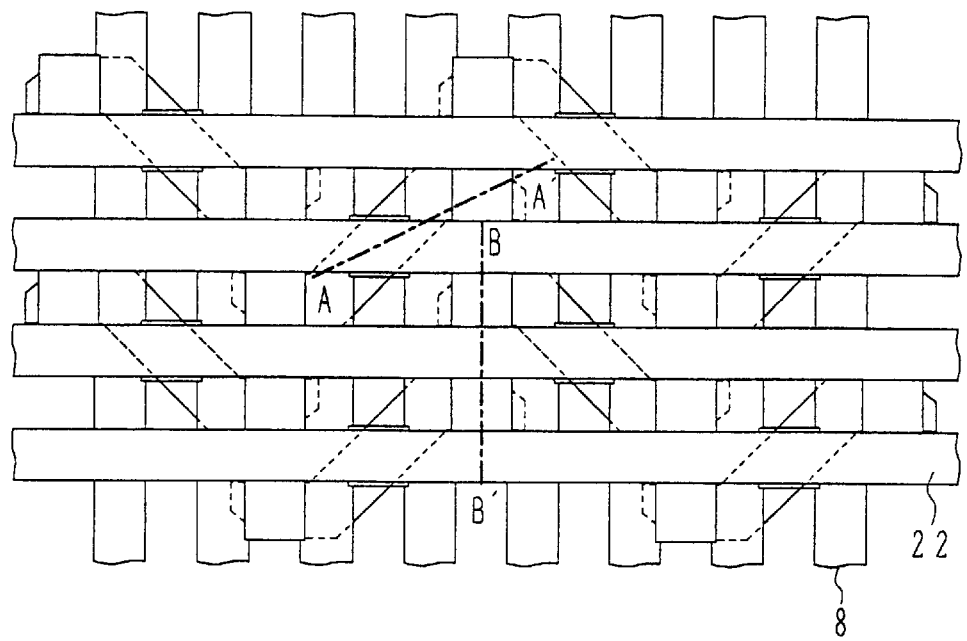
Figure 7B:
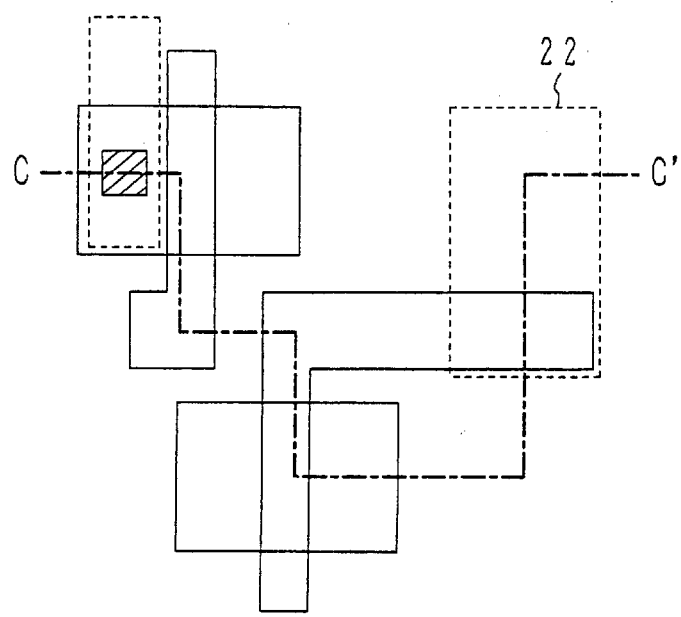

As shown in FIGS. 7A, 7B, and 9E, a doped silicon layer 18 of 40 nm thick, a WSi layer 19 of 120 nm thick, and an SiO$_2$ film 20 of 120 nm thick are sequentially formed by low pressure CVD, and then an SiON film 21 as an anti-reflection film is formed on the SiO$_2$ film 20 by plasma CVD. Next, by using a resist mask pattern (not shown), these layers are selectively removed to form the bit line 22.

An SiO$_2$ film is formed over the whole surface of the substrate, covering the bit line structure, by low pressure CVD and anisotropically etched to form a side wall 23 of SiO$_2$.

Figure 9F:
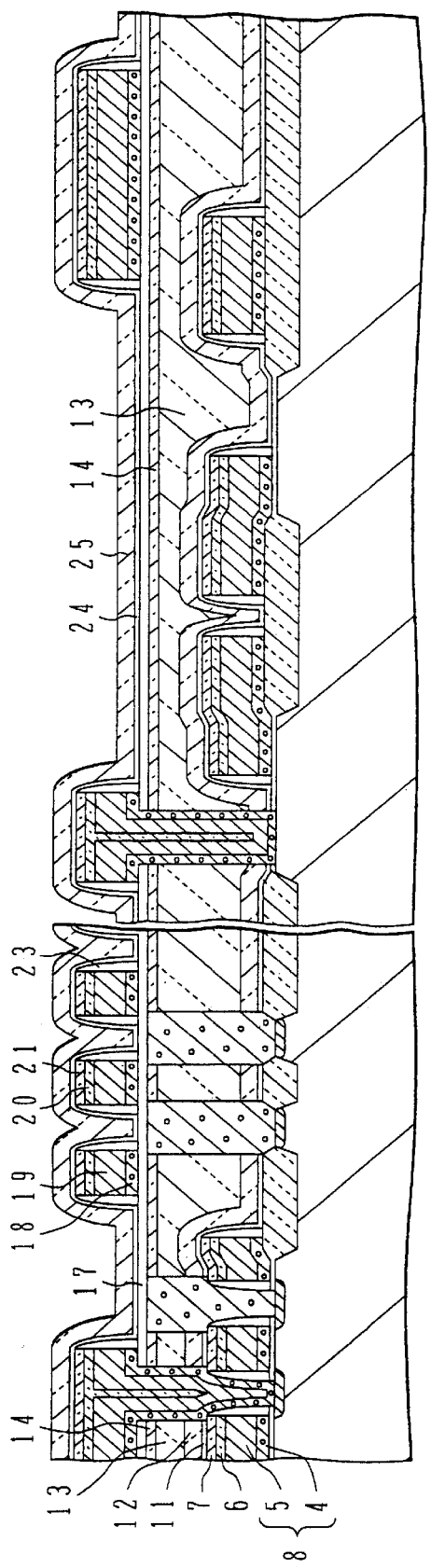

As shown in FIG. 9F, by using similar techniques described with FIG. 2F, an SiO$_2$ film 24 and an Si$_3$N$_4$ 25 are sequentially formed over the whole surface of the substrate.

As shown in FIG. 9G, by using similar techniques described with FIG. 2G, a BPSG film 26 is formed and reflowed by heat treatment. For more complete planarization, the surface of the BPSG film 26 is preferably polished by CMP.

Figure 8A:
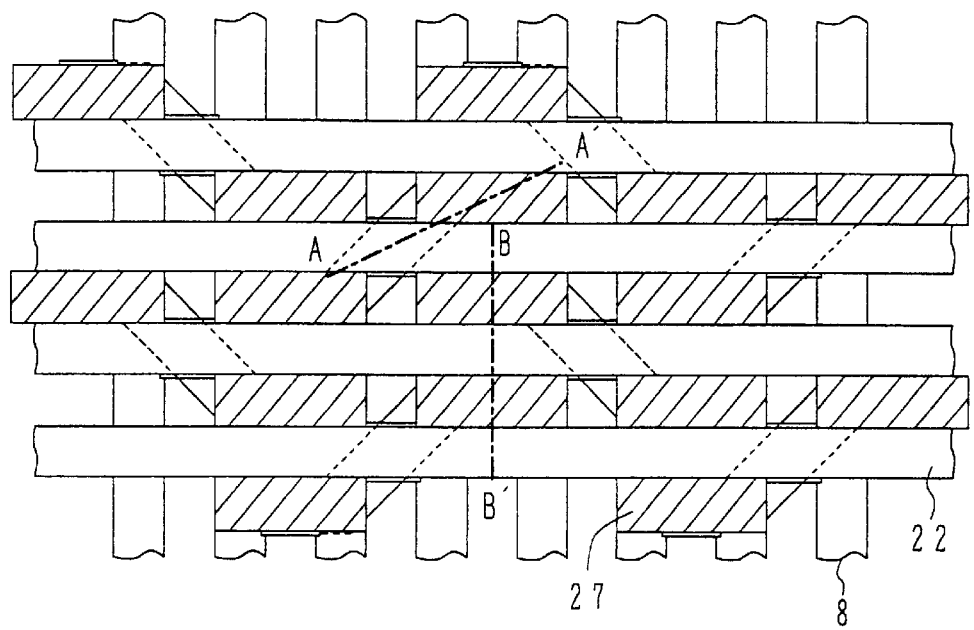
Figure 8B:
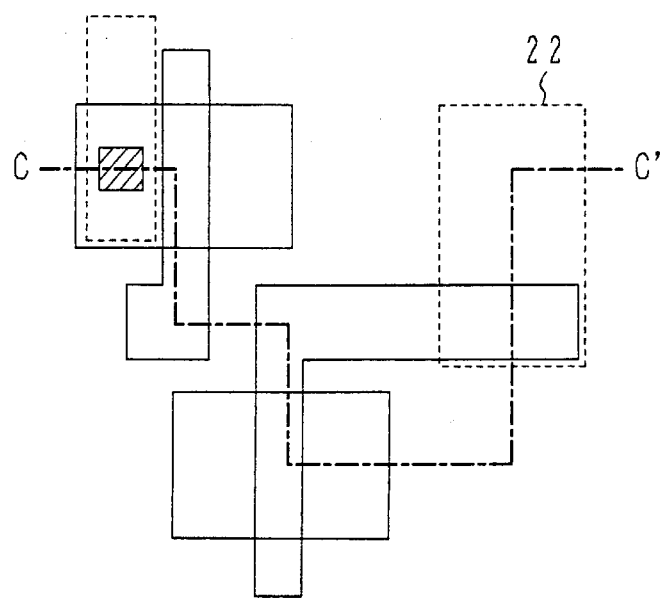

As shown in FIGS. 8A, 8B, and 9G, the BPSG film 26, Si$_3$N$_4$ film 25, and SiO$_2$ film 24 are sequentially removed to form contact areas for the storage electrodes.

After a doped silicon layer is formed and a resist layer 28 is coated embedding the contact area of each storage electrode, the surface of the resist layer is polished by CMP to remove the silicon layer on the BPSG film 26 and form the storage electrodes 27.

Figure 9H:
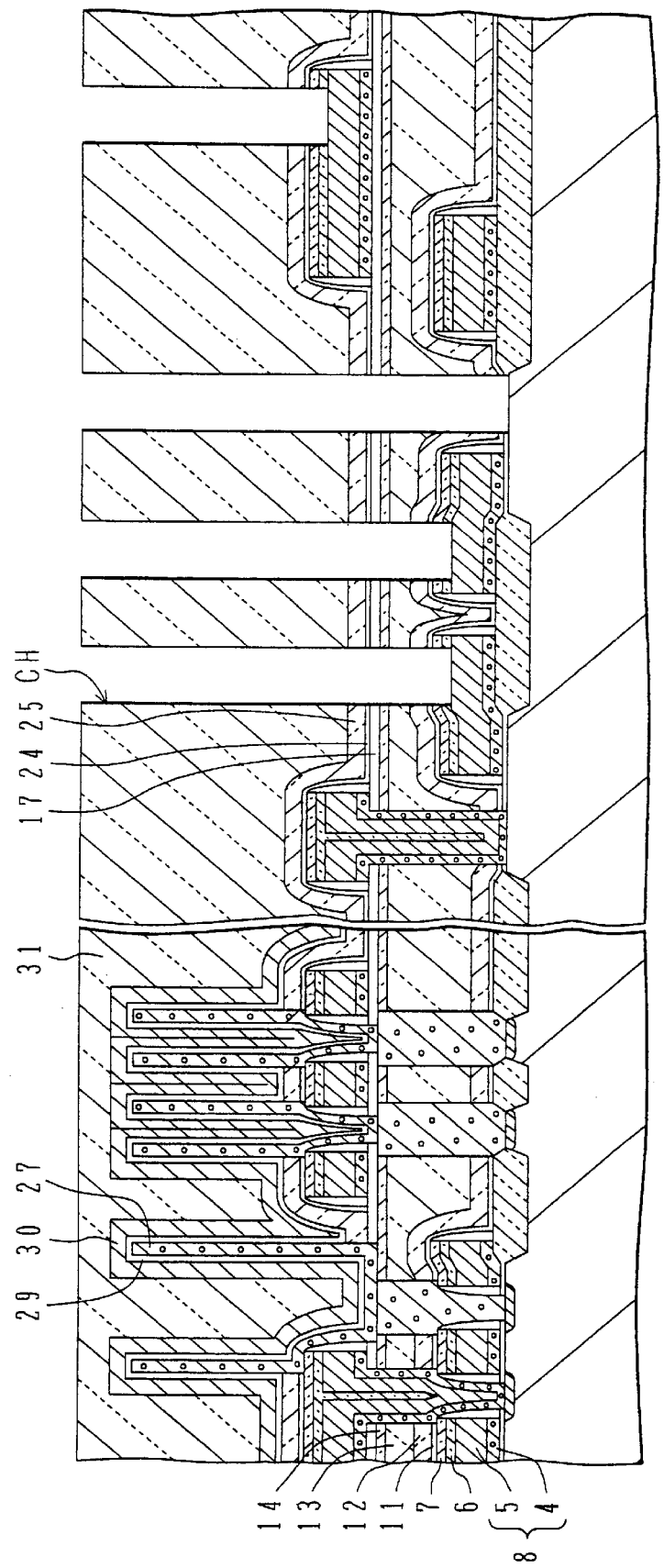

As shown in FIG. 9H, by using similar techniques described with FIG. 2H, the resist 28 in the storage electrode is removed. Next, the BPSG film 26 is removed by wet etching using the Si$_3$N$_4$ film 25 as an etching stopper to expose the outer surface of the storage electrode. The surface of the storage electrode 27 is nitrized by RTN. Then, a Ta$_2$O$_5$ film 29 is formed, and heat treatment or oxygen plasma anneal is performed.

A TiN film is formed and patterned to form an opposing electrode 30. An interlayer insulating film 31 of, for example, BPSG is formed and its surface is planarized by reflow or CMP. Contact holes CH in the peripheral circuit area are formed by using a resist pattern (not shown).

Figure 9I:
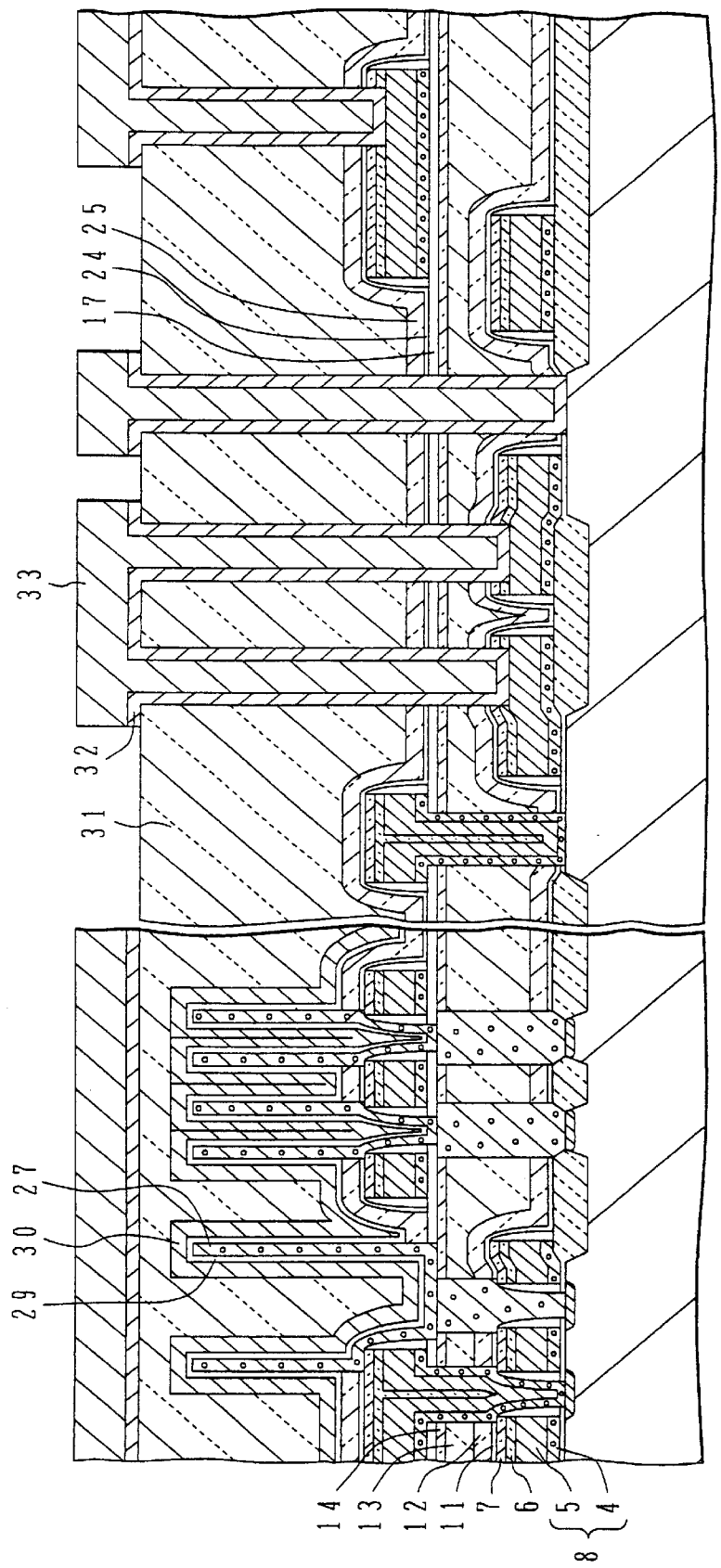

As shown in FIG. 9I, after processes such as forming wiring including a barrier metal layer 32 and a main conductive layer 33, a DRAM device including stack type capacitors is completed.

In some case, even after the bit line 22 is formed, plugs for another raised structure may be formed. In this case, although the memory cell area becomes higher than the first embodiment, the contact holes 15a for the plugs 16 for storage electrode connection can be formed easily because of Levenson type phase shift.

In this embodiment, the contact hole 15b in the peripheral circuit area is opened at the same time when the contact hole 15b for the bit line is formed, separately from the formation of contact holes 15a for the storage electrode contacts. So, Levenson type phase shift is not necessary. Since the diameter of the contact hole in the peripheral circuit area can be reduced, the layout area can be made small.

Furthermore, since the contact hole 15b for the n-type diffusion region in the peripheral circuit area is directly formed on the substrate, the contact resistance in the peripheral circuit area can be stabilized and a variation of contact resistances can be suppressed.

[3rd Embodiment]

Next, the third embodiment will be described with reference to the accompanying drawings.

In the second embodiment, the silicon layer and WSi layer are used for the bit line. Therefore, if n-type doped silicon is used, contacts in the peripheral circuit area can be established only with n-type diffusion regions.

From this reason, in order to make contacts with p-type diffusion regions in the peripheral circuit area, it is necessary to use a higher level metal wiring layer. Furthermore, it is necessary to form a deep contact hole from the higher level wiring layer to the substrate surface. Therefore, this alignment margin makes the layout area broad. There is also a problem of a difficulty of etching control for such a deep contact hole.

In this embodiment, the bit line structure under the capacitor is formed by a metal wiring layer. It is therefore possible to contact both n- and p-type diffusion regions in the peripheral circuit area via shallow contact holes and the layout area can be reduced.

Figure 10:
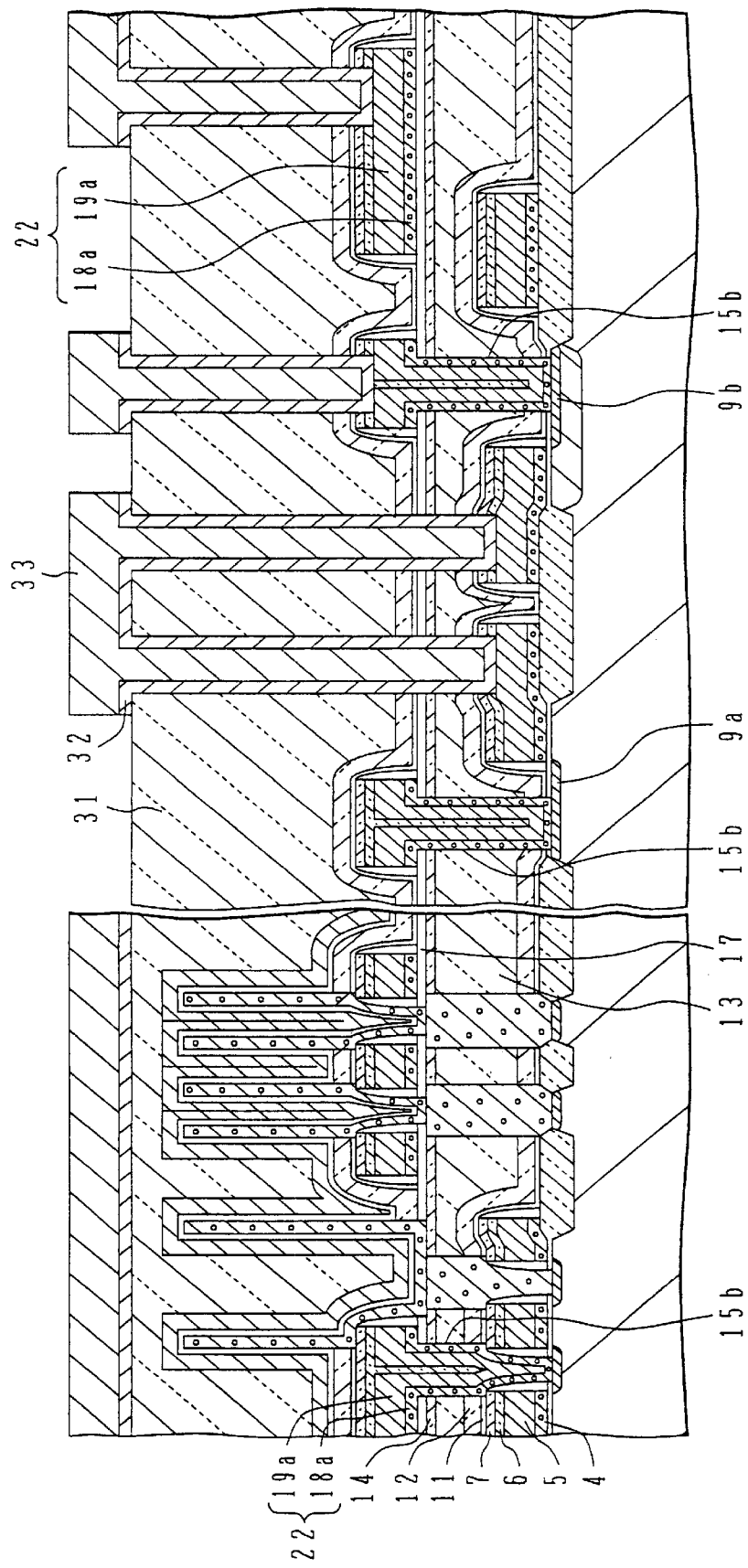
FIG. 10 is a cross sectional view of a semiconductor device according to a third embodiment of the invention.

FIG. 10 is a cross sectional view of a semiconductor device of the third embodiment, and corresponds to the cross sectional view of FIG. 9I of the second embodiment. In FIG. 10, reference symbol 9a represents an n-type diffusion region, and reference symbol 9b represents a p-type diffusion region. A bit line 22 which is a second level conductive layer is formed of two metal layers 18a and 19a. Other reference numerals represent similar elements described with the second embodiment. Well structures are partly omitted from the drawing.

In this embodiment, at the same time when the contact hole 15b for the bit line is formed, contact holes 15b for both n- and p-channel transistor regions in the peripheral circuit area are formed.

It is therefore unnecessary to directly contact the substrate surface by using the higher level wiring layer as shown in FIG. 9I. The layout area of the peripheral circuit area can therefore be reduced.

[4th Embodiment]

The fourth embodiment of the invention will be described with reference to FIGS. 11 and 12.

This embodiment will be described mainly attending to the method of contacting a first layer conductive pattern with a second layer conductive pattern in the peripheral circuit area.

Figure 11:
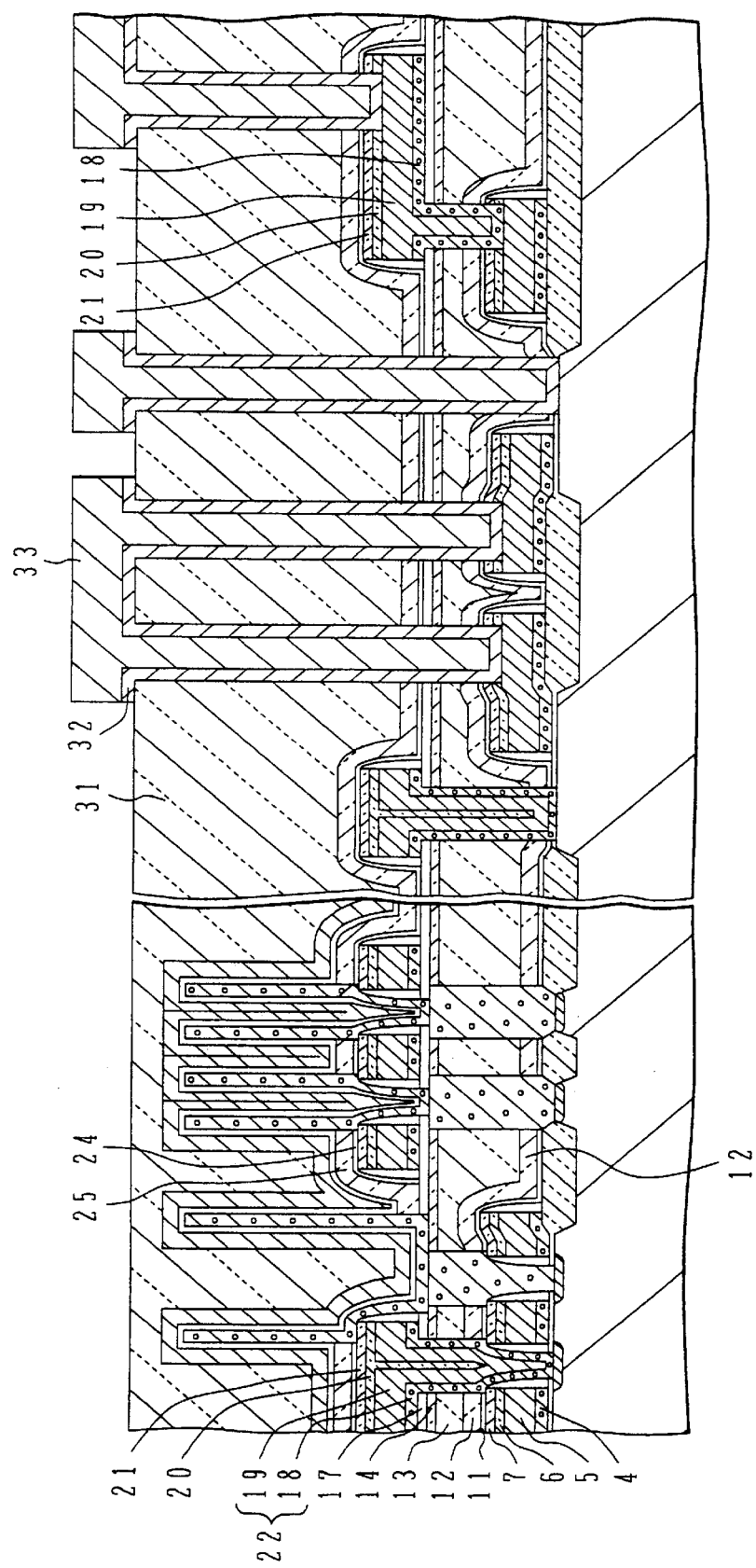
FIG. 11 is a cross sectional view of a semiconductor device corresponding to FIG. 9I.

FIG. 11 is a cross sectional view of a semiconductor device corresponding to FIG. 9I of the second embodiment, showing a contact between the conductive patterns 4 and 5 of the first layer and the conductive patterns 18 and 19 of the second layer at the rightmost area in the peripheral circuit area.

Figure 12:
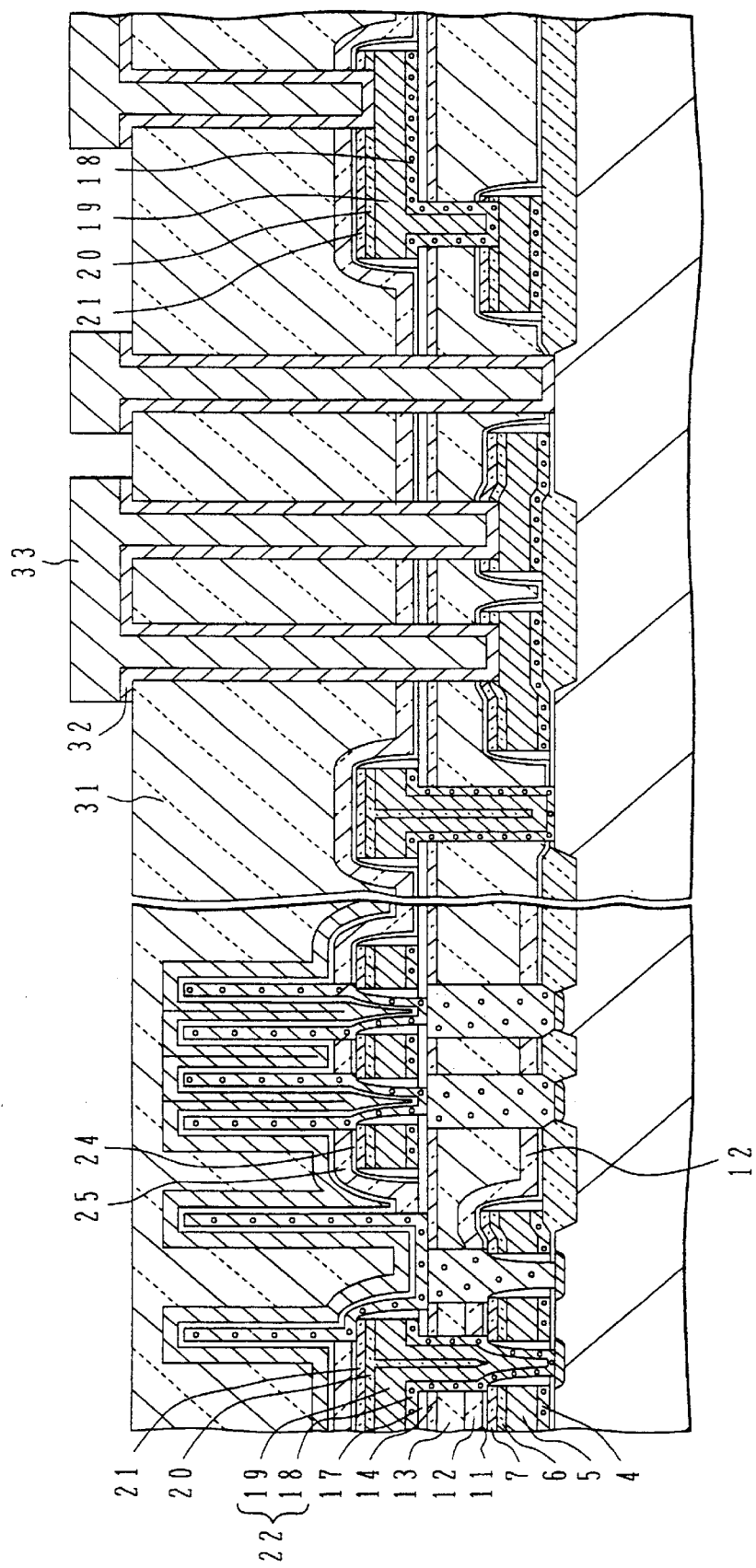
FIG. 12 is a cross sectional view of a semiconductor device according to a fourth embodiment of the invention.

FIG. 12 is a cross sectional view of a semiconductor device of the fourth embodiment, which device is an improvement of the device shown in FIG. 9I. The memory cell area corresponds to the memory cell area shown in FIG. 9I and the peripheral circuit area is similar to that shown in FIG. 9I. Similar elements to those of the second embodiment are represented by using identical reference numerals.

In this embodiment, after the $Si_3N_4$ 12 to be used for SAC is formed, the $Si_3N_4$ film 12 in the peripheral circuit area is removed. For example, at the processes shown in FIGS. 2C and 9C, the $Si_3N_4$ film 12 is selectively removed at the area including the area where the conductive pattern of the first layer and the conductive pattern of the second layer are contacted together. In the memory cell area, there exists one $Si_3N_4$ film 12 between the n-type diffusion region 9 and the interlevel insulating layer 13. In the peripheral circuit area, there exists one SiON film 7 between the first level conductive pattern 45 and the interlevel insulating layer 13. The SiON film 7 and the SiN film 12 can be simultaneously etched in a single selective etching process.

Therefore, at the same time when the contact hole between the bit line and substrate is opened, the contact hole for the conductive pattern of the first layer and the conductive pattern of the second layer can be formed. As compared to the method illustrated in FIG. 11 which requires to open a fine contact hole to the first level conductive layer separately from the contact hole to the substrate, the method illustrated in FIG. 12 requires only to form additional pattern for removing the $Si_3N_4$ film at the area where a contact hole is formed. A separate fine pattern is therefore unnecessary so that yield and reliability can be improved.

[5th Embodiment]

The fifth embodiment of the invention will be described with reference to FIG. 13.

This embodiment is a combination of the third and fourth embodiments, uses the method of contacting the first layer conductive pattern with the second layer conductive pattern, and uses metal as the material of the second layer conductive pattern.

Figure 13:
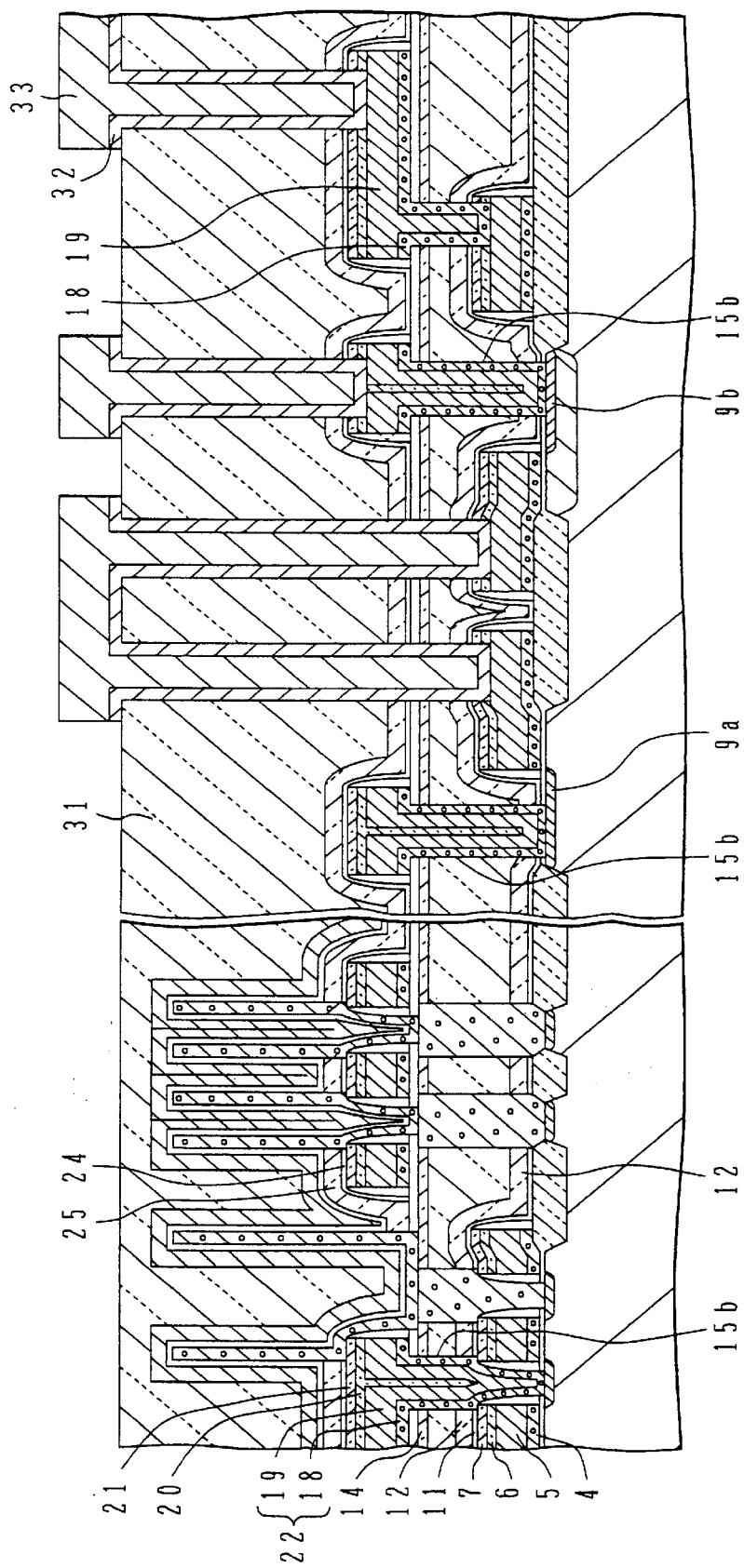
FIG. 13 is a cross sectional view of a semiconductor device according to a fifth embodiment of the invention.

FIG. 13 is a cross sectional view of a semiconductor device of this embodiment, which device is an improvement of the device of the fourth embodiment shown in FIG. 12. Similar elements to those of the second embodiment are represented by using identical reference numerals.

With this embodiment, at the same time when the contact hole for the bit line is formed, contact holes for both the n- and p-channel transistors in the peripheral circuit area can be formed. Since a contact hole for the upper level wiring directly contacting the substrate is reduced, the layout area of the peripheral circuit area can be reduced.

After the $Si_3N_4$ film 12 used for SAC is formed, the $Si_3N_4$ film 12 in the peripheral circuit area is removed. Therefore, at the same time when the contact hole for the bit line and substrate is formed, a contact hole for the first layer conductive pattern and second layer conductive pattern can be formed so that the number of processes can be reduced.

[6th Embodiment]

The sixth embodiment of the invention will be described with reference to FIG. 14.

This embodiment pertains to forming a contact hole in the peripheral circuit area. If an interlayer insulating film is formed by a plurality of oxide films and nitride films, a process of etching the interlayer insulating film to form a contact hole to an impurity diffusion layer or a wiring layer becomes complicated.

This embodiment, therefore, aims to stabilize the process of forming a contact hole in the peripheral circuit area.

Figure 14:
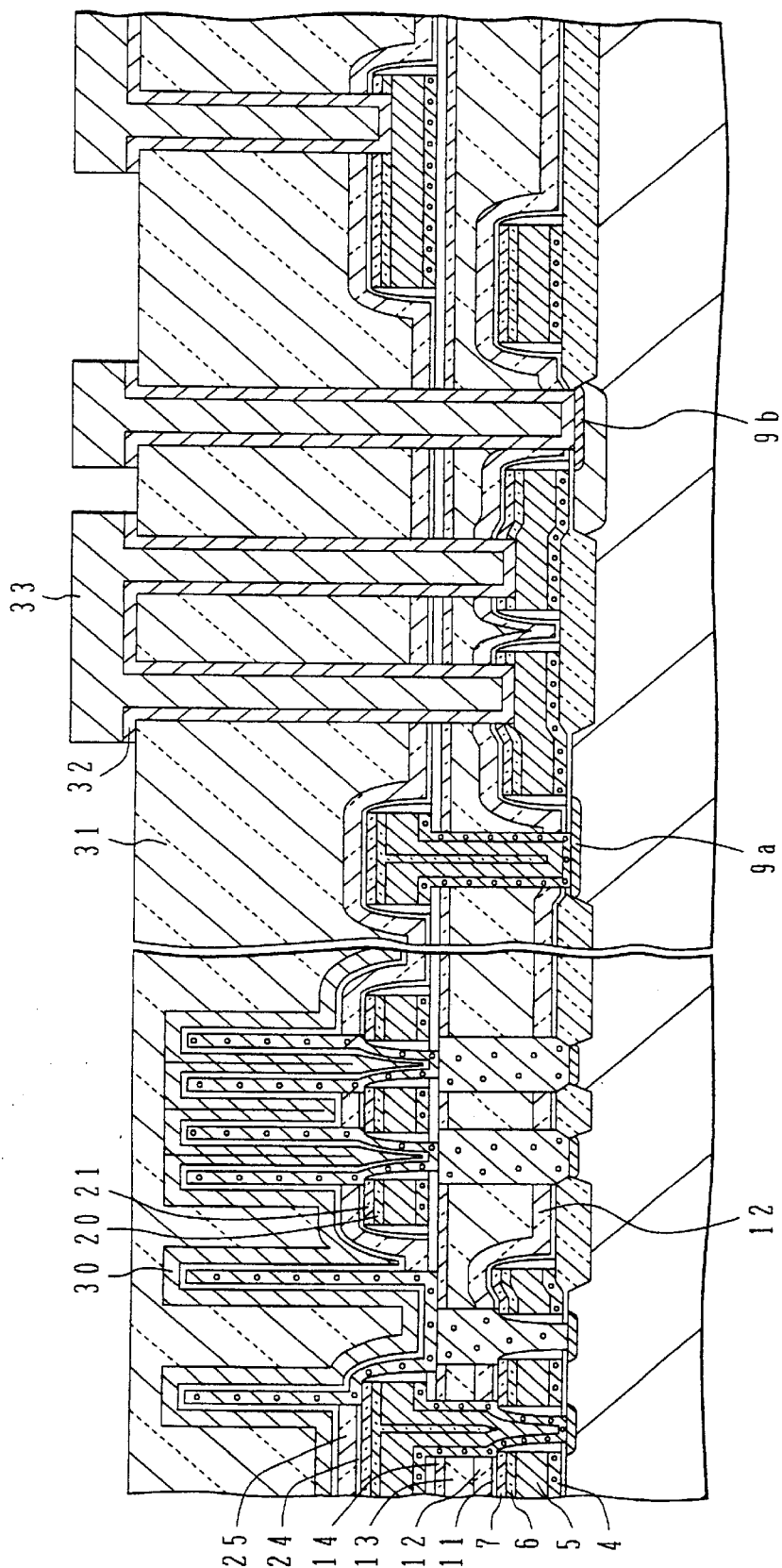
FIG. 14 is a cross sectional view of a semiconductor device according to a sixth embodiment of the invention.

FIG. 14 is a cross sectional view of a semiconductor device of this embodiment, which device is an improvement of the device of the second embodiment. Identical reference numerals represent similar elements to those of the second embodiment.

The semiconductor device manufacture processes of this embodiment are generally the same as those described with FIGS. 9A to 9I. Different points will be described with reference to FIG. 14.

After the gate electrode of the first wiring layer is patterned, the SiON film 7 on the gate electrode 8 in the peripheral circuit area is removed, for example, by boiling phosphoric acid. Similarly, after the bit line of the second wiring layer is patterned, the SiON film 21 on the bit line in the peripheral circuit area is removed. Further, after the opposing electrode 30 is patterned, the $Si_3N_4$ film 25 in the peripheral circuit area is removed. The SiON films 7 and 21 are used as an anti-reflection film when the wiring layers are patterned. These SiON films 7 and 21 are not required to be removed if wiring layers are patterned without using these films.

In this embodiment, there is no SiON layer and only one SiN film on the first level wiring and the bit line in the peripheral circuit area. At the same time when the nitride film used for SAC in the memory cell area is selectively removed, the nitride film in the peripheral circuit area can be removed. Also, the underlying oxide films can be removed simultaneously. It becomes easy to form a contact hole in the peripheral circuit area without increasing the number of processes.

[7th Embodiment]

The seventh embodiment of the invention will be described with reference to FIG. 15.

In the sixth embodiment, the SiON film 7 on the first wiring layer (gate electrode) and the SiON film 21 on the second wiring layer (bit line) are removed and the $Si_3N_4$ film 25 under the opposing electrode is removed by using the opposing electrode as a mask. In this manner, forming a contact hole in the peripheral circuit area is made easy. In this embodiment, a method of forming a contact hole more easily is provided.

Figure 15:
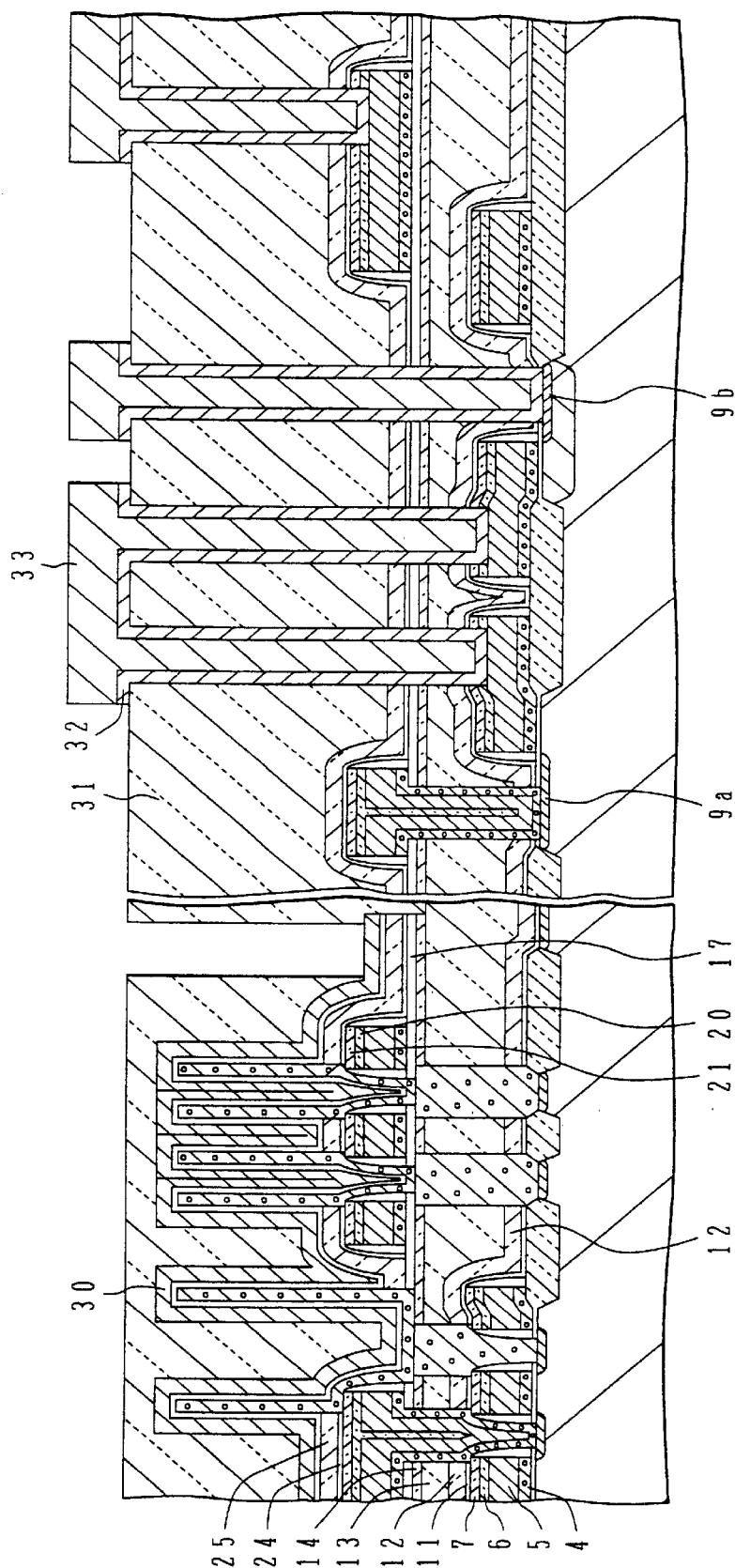
FIG. 15 is a cross sectional view of a semiconductor device according to a seventh embodiment of the invention.

FIG. 15 is a cross sectional view of a semiconductor device of this embodiment, which device is an improvement of the device of the sixth embodiment. Identical reference numerals denote similar elements to those of the second embodiment. Different points will be described.

After the gate electrode of the first wiring layer is patterned, the SiON film 7 on the gate electrode 8 in the peripheral circuit area is removed, for example, by boiling phosphoric acid.

Next, after the $Si_3N_4$ film used for SAC is formed, the $Si_3N_4$ film 12 in the peripheral circuit area is selectively removed. Also, after the bit line of the second wiring layer is patterned, the SiON film 21 on the bit line in the peripheral circuit area is removed. Further, after the opposing electrode 30 is patterned, the $Si_3N_4$ film 25 for SAC, $SiO_2$ interlayer insulating film 24, and $Si_3N_4$ film 14 in the peripheral circuit area are sequentially removed.

The SiON films 7 and 21 are used as an anti-reflection film when the wiring layers are patterned. These SiON films 7 and 21 are not required to be removed if wiring layers are patterned without using these films.

In this embodiment, since all the SiON films 7 and 21, $Si_3N_4$ films 12, 21, and 14 are removed, a contact hole in the peripheral circuit area can be formed more easily.

[8th Embodiment]

The eighth embodiment of the invention will be described with reference to FIGS. 16A to 16I.

This embodiment provides a method of contacting the conductive pattern of the first wiring layer with the conductive pattern of the second wiring layer in the peripheral circuit area, by using a different method from the fourth embodiment.

FIGS. 16A to 16I are cross sectional views of a semiconductor chip illustrating a semiconductor device manufacture method of this embodiment, in which similar elements to those of the second embodiment are represented by using identical reference numerals.

Figure 16A:
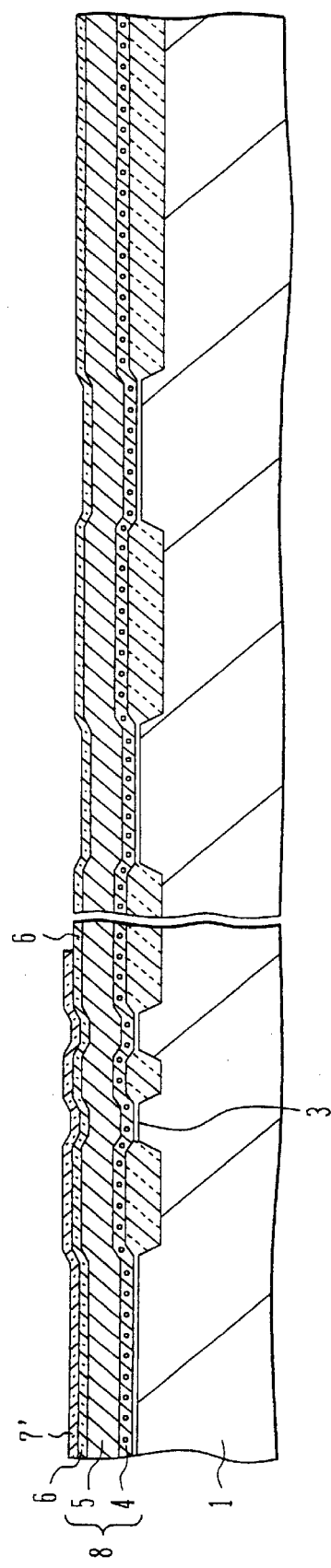
FIGS. 16A to 16I are cross sectional views illustrating the manufacture processes of a semiconductor device according to an eighth embodiment of the invention.

As shown in FIG. 16A, on a p-type silicon substrate 1, a field $SiO_2$ film 2 of 250 nm thick is formed by a well known technique, LOCOS isolation (selective oxidation). Thereafter, an $SiO_2$ film 3 of 5 to 10 nm thick is formed by thermal oxidation, this film being a gate oxide film.

Next, a silicon layer 4 of 50 nm thick highly doped with phosphorous (P) impurities, a WSi layer 5 of 120 nm thick, an $SiO_2$ film 6 of 20 nm thick, and an $Si_3N_4$ layer 7' of 80 nm thick are sequentially formed by low pressure CVD.

By using a resist mask pattern (not shown), the SiON film 7' is selectively etched at the area where first layer conductive patterns and second layer conductive patterns are contacted together.

Figure 16B:
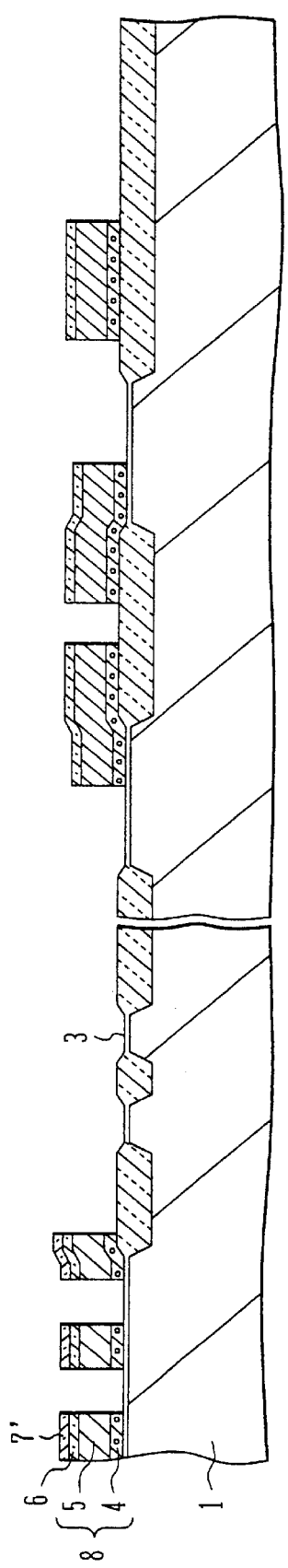

As shown in FIG. 16B, by using a resist mask pattern (not shown), the $Si_3N_4$ film 7', $SiO_2$ film 6, WSi film 5, and silicon layer 4 are selectively removed to form a gate electrode (first wiring layer) which constitutes a word line.

Figure 16C:
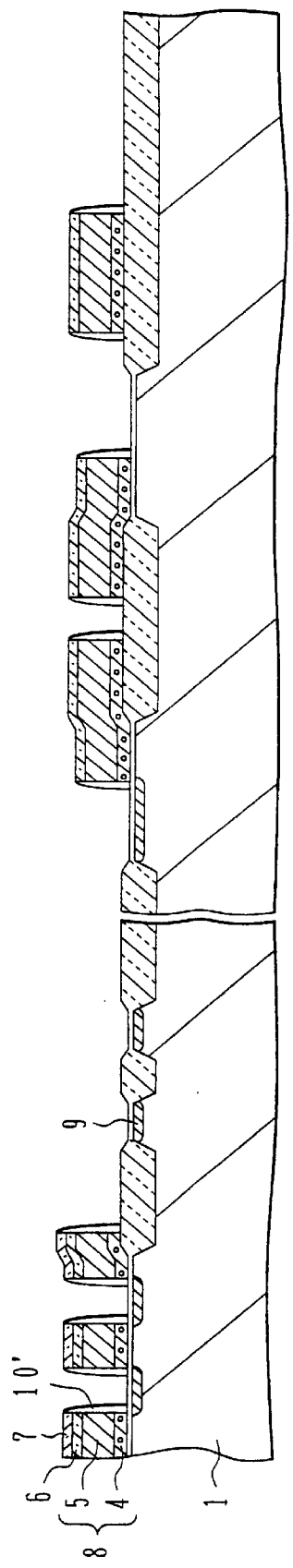

As shown in FIG. 16C, by using the gate electrode 8 as a mask, P (phosphorous) ions are implanted into the silicon substrate 1 to form an $n^-$-type impurity diffusion region 9. The $n^-$-type impurity diffusion region 9 is the source/drain region of a transfer transistor in the memory cell area, and in the peripheral circuit area an LDD diffusion region of an n-channel transistor in the peripheral circuit area. Next, an $SiO_2$ film of 60 nm thick is formed over the whole surface of the substrate by low pressure CVD, and a side wall 10' of $Si_3N_4$ is formed by anisotropic etching.

Figure 16D:
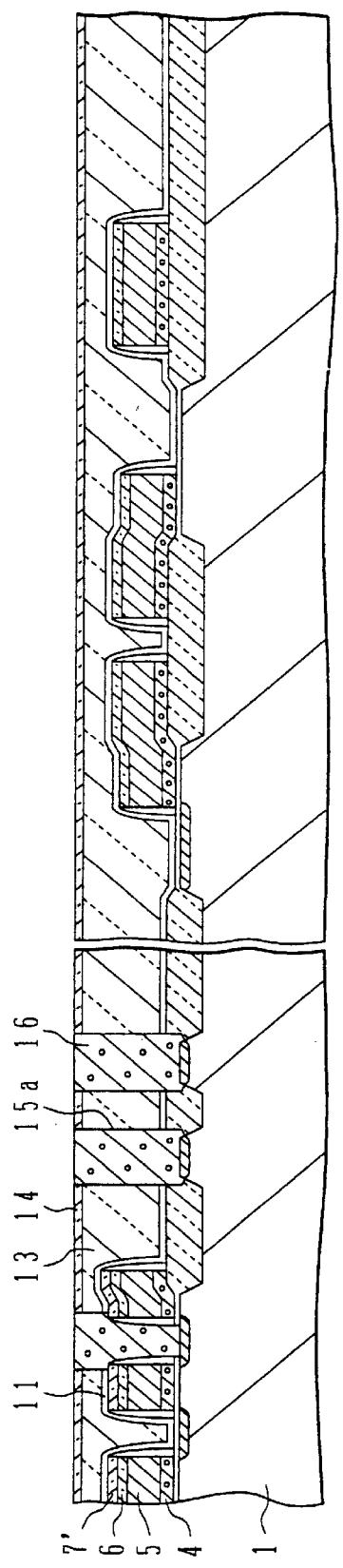

As shown in FIG. 16D, in the peripheral circuit area, arsenic ions are implanted into the n-channel transistor region to form an $n^+$-type diffusion region, and boron ions are implanted into a p-channel transistor region to form a $p^+$-type diffusion region (not shown).

Next, an $SiO_2$ film 11 of 20 nm thick and a BPSG film of 300 to 400 nm thick are formed over the whole surface of the substrate by low pressure CVD. The BPSG film 13 is reflowed by heat treatment at about 800° C. in a nitrogen atmosphere. For more complete planarization, the surface is preferably polished and planarized by CMP.

Next, an $Si_3N_4$ film 14 of 50 nm thick is formed over the whole surface of the substrate by low pressure CVD, and by using a resist mask pattern (not shown), it is selectively removed at the area where the storage electrode is contacted. After the BPSG film 13 is removed in a self alignment manner using the nitride films 7' and 10', a contact hole 15a for SAC is formed.

A doped silicon layer of 300 nm thick is embedded in the contact holes 15a by low pressure CVD, and removed at the area on the $Si_3N_4$ film 14 by CMP to form a plug 16.

Figure 16E:
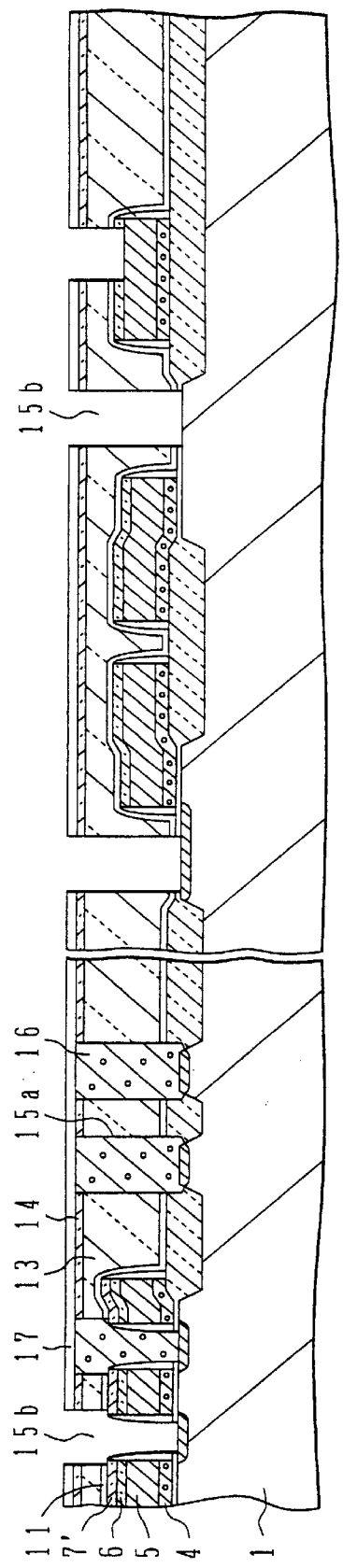

As shown in FIG. 16E, an $SiO_2$ film 17 of 20 to 60 nm thick is formed over the whole surface of the substrate covering the plug 16 by low pressure CVD. This $SiO_2$ film 17 insulates the plug 16 and the bit line of a second layer wiring. Next, by using a resist mask pattern (not shown), the $SiO_2$ film 17, $Si_3N_4$ film 14, BPSG film 13, and $SiO_2$ film 11 are selectively removed to form a contact hole 15b for the bit line 22 and a contact hole 15b in the peripheral circuit area at the same time. The contact hole 15b can be formed in a self alignment manner using the nitride films 7' and 10', similar to the formation of the contact hole 15a.

Figure 16F:
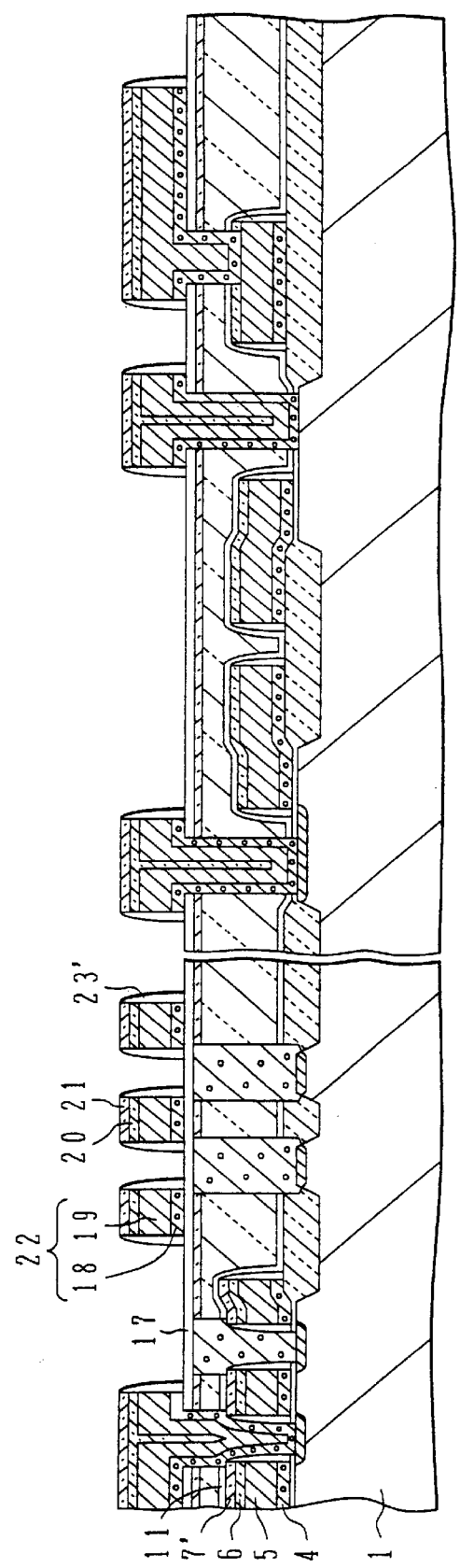

As shown in FIG. 16F, a silicon layer 18 of 40 nm thick highly doped with P, a WSi layer 19 of 120 nm thick, an $SiO_2$ film 20 of 20 nm thick, and an $Si_3N_4$ film 21' are sequentially formed over the whole surface of the substrate by low pressure CVD. Next, by using a resist mask pattern (not shown), these layers are selectively removed to form a bit line 22.

An $Si_3N_4$ film of 60 nm thick is then formed over the whole surface of the substrate by low pressure CVD and anisotropically etched to form a side wall 23' of $Si_3N_4$.

Figure 16G:
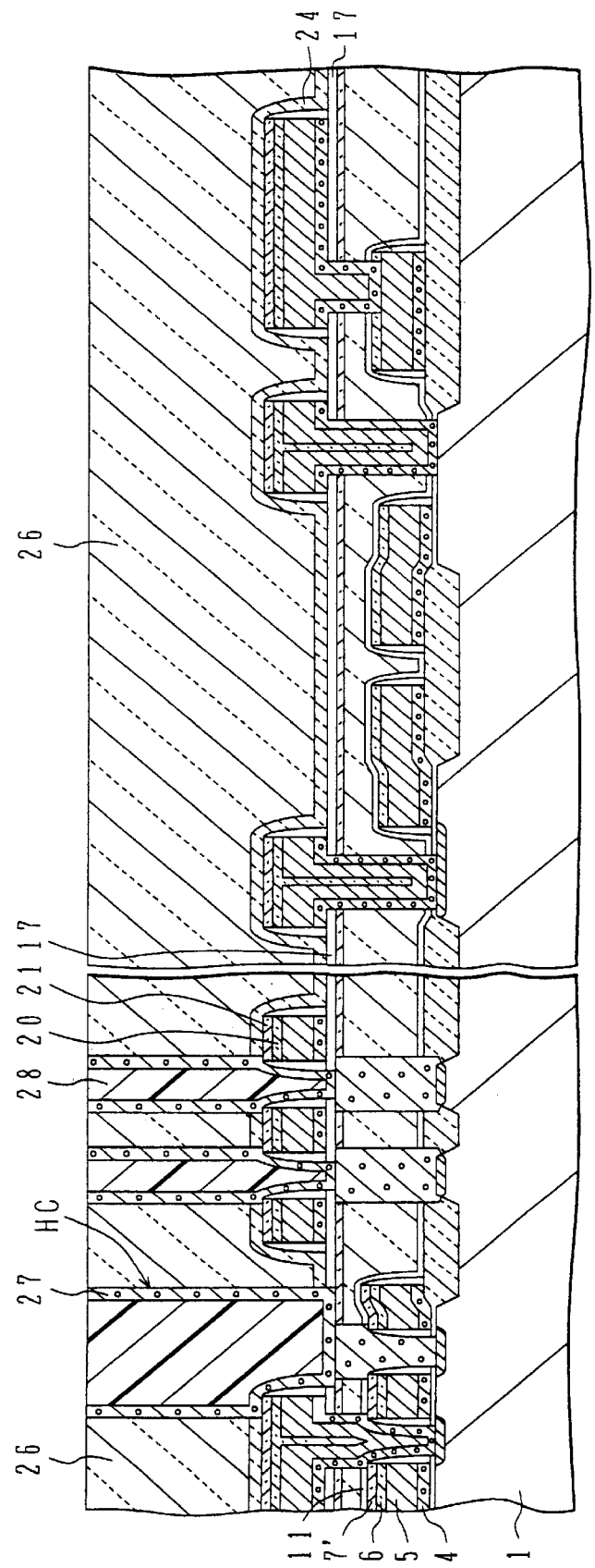

As shown in FIG. 16G, an $SiO_2$ film 24 of 10 to 30 nm is formed over the whole surface by low pressure CVD. Next, a BPSG film 26 of 1000 to 1500 thick as a planarizing film is formed over the whole surface and reflowed by heat treatment at 850° C. in a nitrogen atmosphere. For more complete planarization, the surface is preferably polished and planarized by CMP.

Next, by using a resist mask pattern (not shown), the BPSG film 26 and $SiO_2$ film 24 are sequentially and selectively removed in a self alignment manner utilizing the nitride films 21 and 23' to form a contact area HC for a storage electrode.

A silicon layer of 60 nm thick highly doped with phosphorous is formed over the whole surface by low pressure CVD. After resist 28 is embedded in the contact area for the storage electrode, the surface of the resist is polished to remove the silicon layer on the BPSG film 26 and form a storage electrode 27.

Figure 16H:
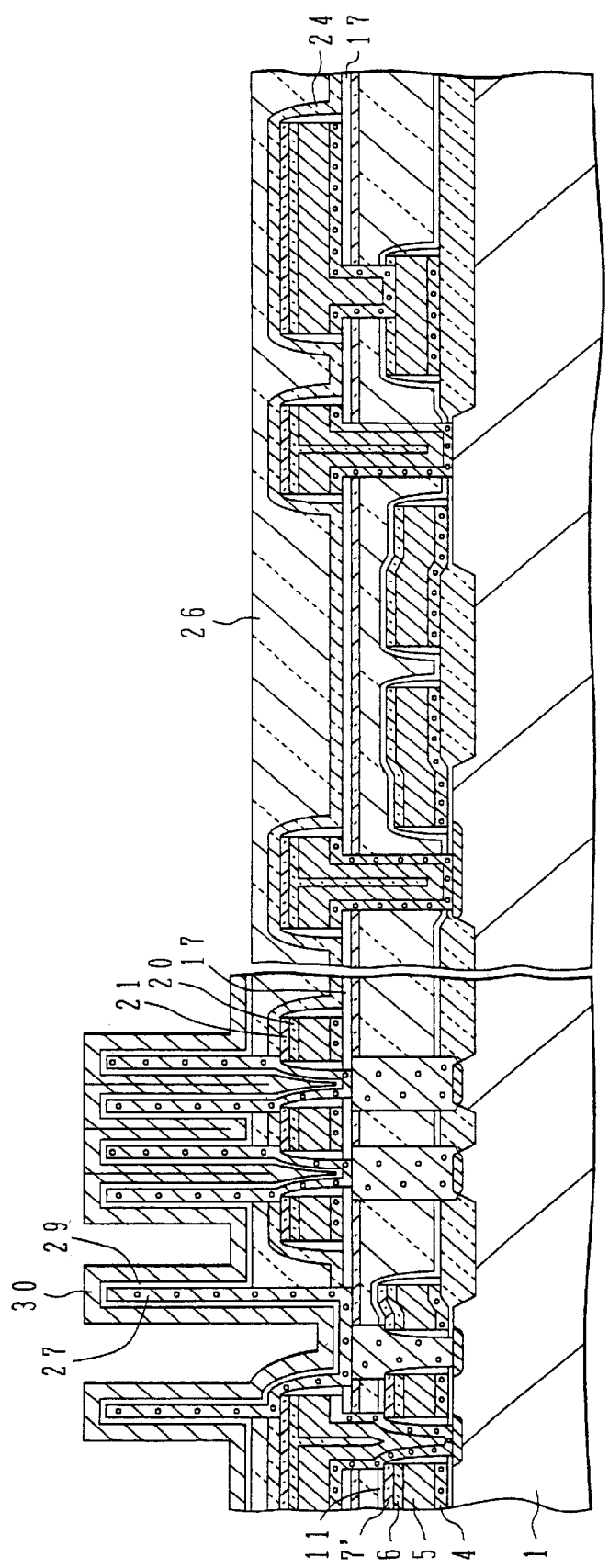

As shown in FIG. 16H, the resist 28 in the storage electrode is removed. Next, the BPSG film 26 is removed by wet setching using HF containing etchant gas to expose the outer side of the storage electrode 27. The figure shows the case where the BPSG film 26 is partly retained. The surface of the storage electrode 27 is nitrized by RTN. Next, a $Ta_2O_5$ film 29 of 5 to 15 nm thick is formed by low pressure CVD, and thermal oxidation at about 800 to 850° C. or oxygen plasma anneal is performed.

A TiN film of 50 nm thick as an opposing electrode is formed on the whole surface by low pressure CVD and etched by using a resist mask pattern (not shown) to form an opposing electrode 30.

Figure 16I:
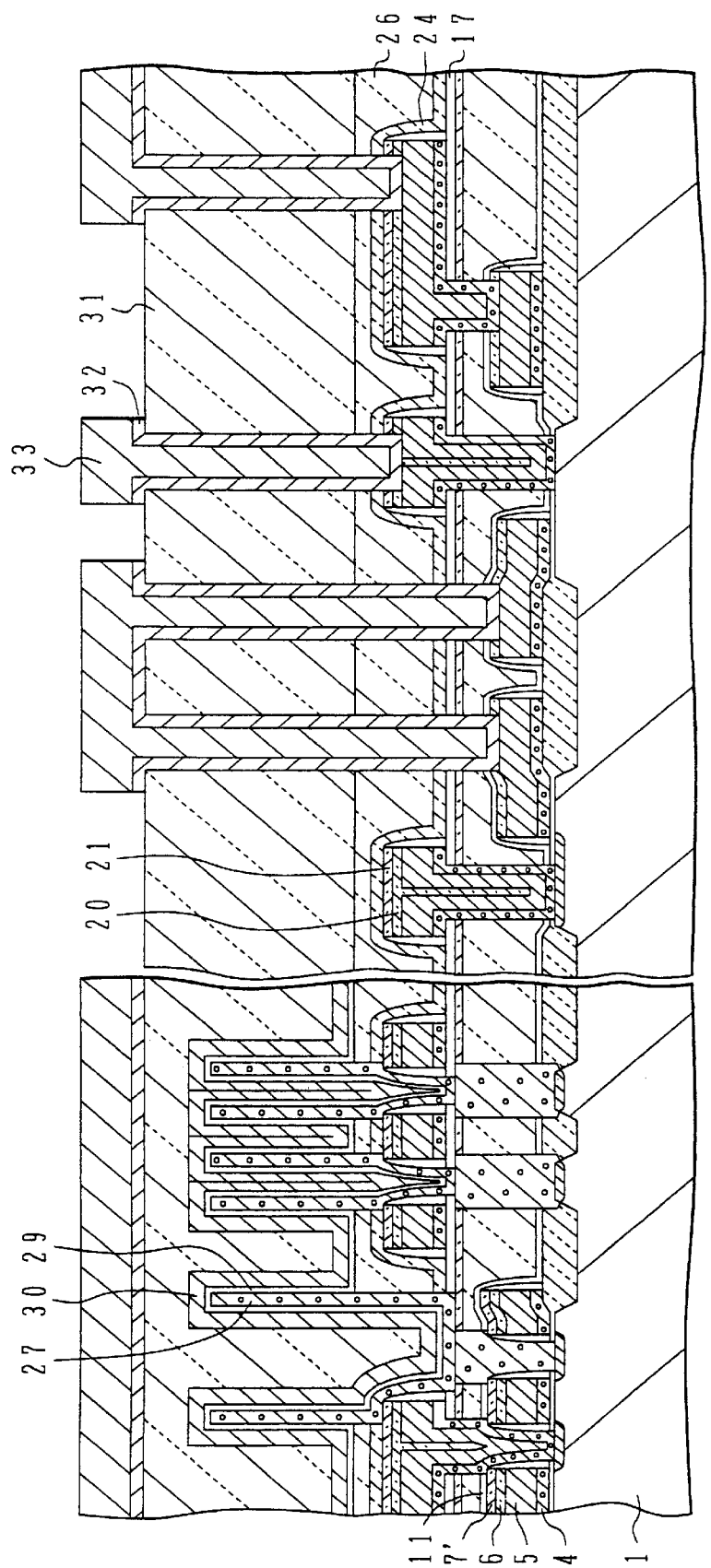

As shown in FIG. 16I, after the processes of forming an interlayer insulating film 31 and wiring layers 32 and 33, a stack type capacitor is completed.

In this embodiment, at the process shown in FIG. 16A, after the $Si_3N_4$ film 7' used for SAC is formed, the $Si_3N_4$ film 7' in the peripheral circuit area is selectively removed. Therefore, at the same time when the contact hole for the bit line and substrate is opened at the process shown in FIG. 16E, a contact hole for the first layer conductive pattern and second layer conductive pattern can be formed so that the number of processes can be reduced.

Also in this embodiment, SAC is performed by forming the $Si_3N_4$ film surrounding the gate electrode (first wiring layer) and bit line (second wiring layer). Therefore, an unnecessary $Si_3N_4$ does not exist in the peripheral circuit area a and therefore a contact hole in the peripheral circuit area can be formed easily.

[9th Embodiment]

In the fourth to eighth embodiments, forming a contact hole in the peripheral circuit area is made easy by selectively removing the $Si_3N_4$ film in the peripheral circuit area.

In this embodiment, a semiconductor device and its manufacture method are provided which can reduce the number of processes at the memory cell area and facilitate the formation of a contact hole in the peripheral circuit area.

The ninth embodiment will be specifically described with reference to FIGS. 17A, 17B, and FIGS. 18A to 18L in which similar elements to those of the second embodiment are represented by using identical reference numerals.

Figure 17A:
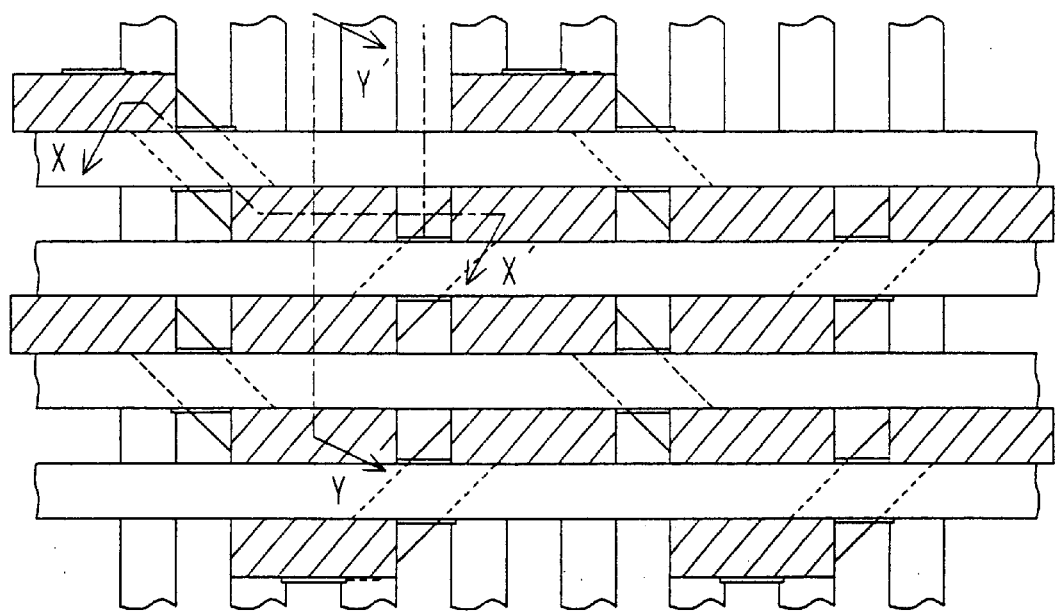
FIGS. 17A and 17B are a plan view of a memory cell area and a cross sectional view of a peripheral circuit area of a semiconductor device according to a ninth embodiment of the invention.
Figure 17B:
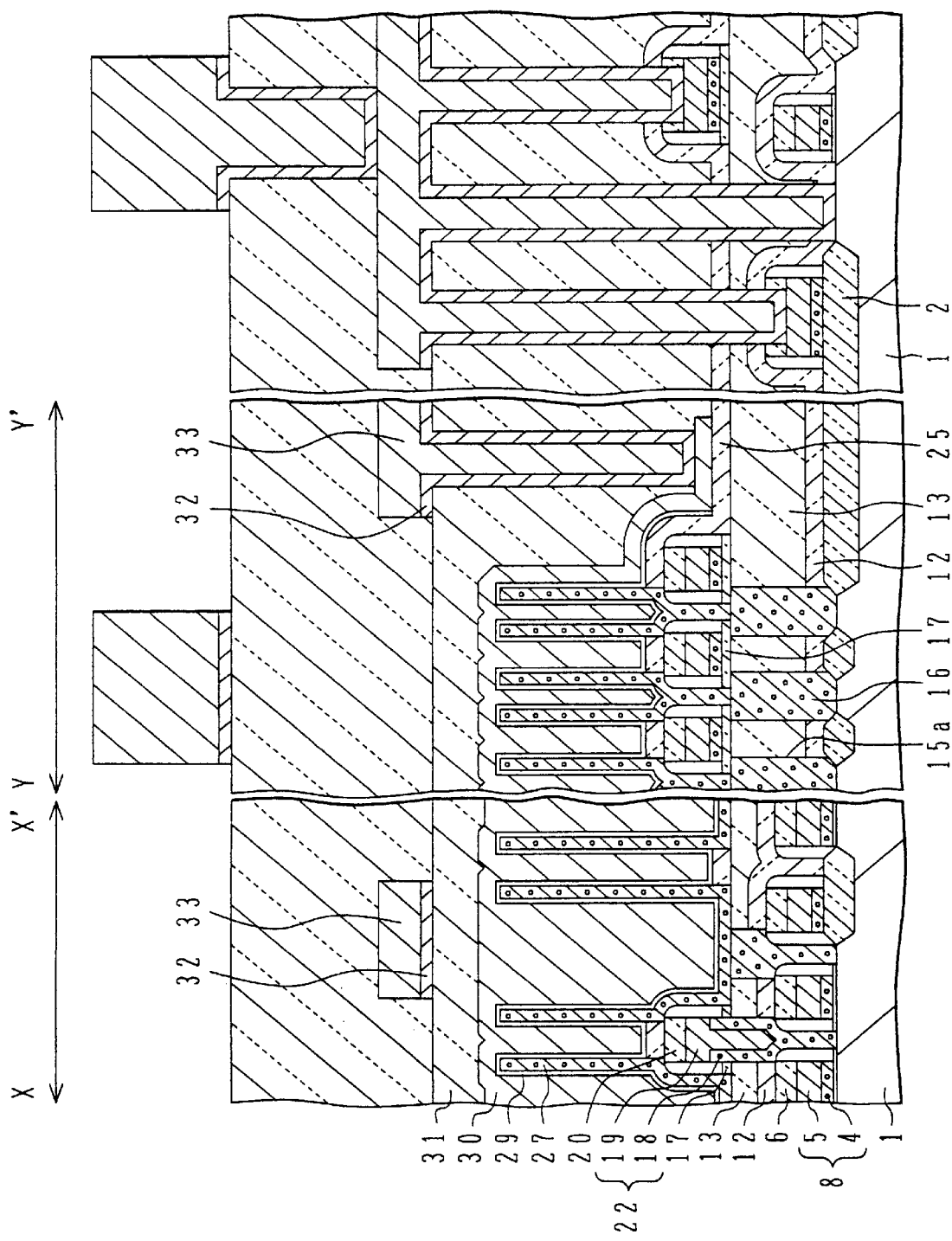

FIG. 17A is a plan view of a memory cell area of this embodiment. FIG. 17B is a cross sectional view of the memory cell area and peripheral circuit area of this embodiment, the memory cell area corresponding to cross sectional views taken along line X–X' and Y–Y' of FIG. 17A.

FIGS. 18A to 18L are cross sectional views illustrating a semiconductor device manufacture method of this embodiment, which method is a modification of the second embodiment. In FIGS. 18A to 18L, similar elements to those of the second embodiment are represented by using identical reference numerals.

Figure 18A:
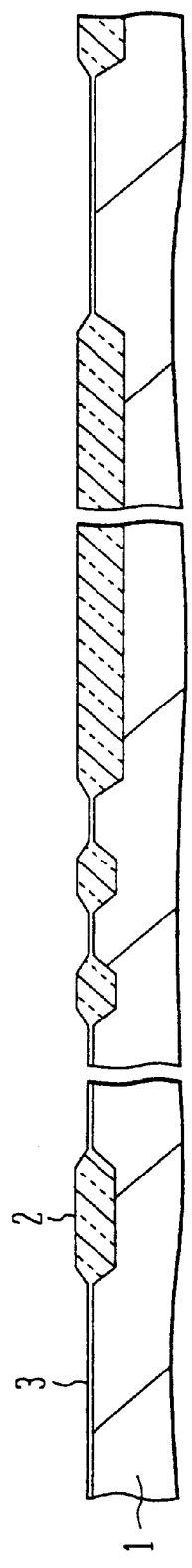

As shown in FIG. 18A, on a p-type silicon substrate 1, a field $SiO_2$ film 2 of 250 nm thick is formed by a well known technique, LOCOS isolation (selective oxidation). Thereafter, a well diffusion region, an element isolation diffusion region, a channel diffusion region are formed by ion implantation (not shown). Next, an $SiO_2$ film 3 of 5 to 10 nm thick is formed by thermal oxidation, this film being a gate oxide film.

Figure 18B:
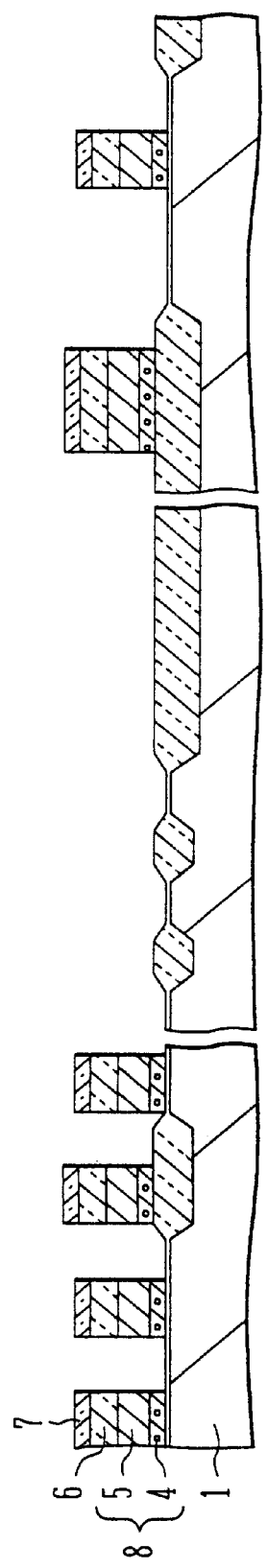

As shown in FIG. 18B, a silicon layer 4 of 50 nm thick highly doped with phosphorous impurities, a WSi layer 5 of 120 nm thick, and an $SiO_2$ film 6 of 80 nm thick are sequentially formed over the whole surface of the substrate by low pressure CVD. Next, an anti-reflection film 7 is formed by plasma CVD. This anti-reflection film 7 absorbs an exposure wavelength used by photolithography and is, for example, an SiON film of about 30 nm thick.

By using a resist mask pattern (not shown), the SiON film 7 and $SiO_2$ film 6 are selectively etched, for example, by F containing etchant gas and the WSi layer 5 and silicon layer 4 are selectively etched, for example, by Cl containing etchant gas, to thereby form a gate electrode 8 which is connected to a word line. For the simplicity, the SiON film 7 is not shown in the following drawings.

Figure 18C:
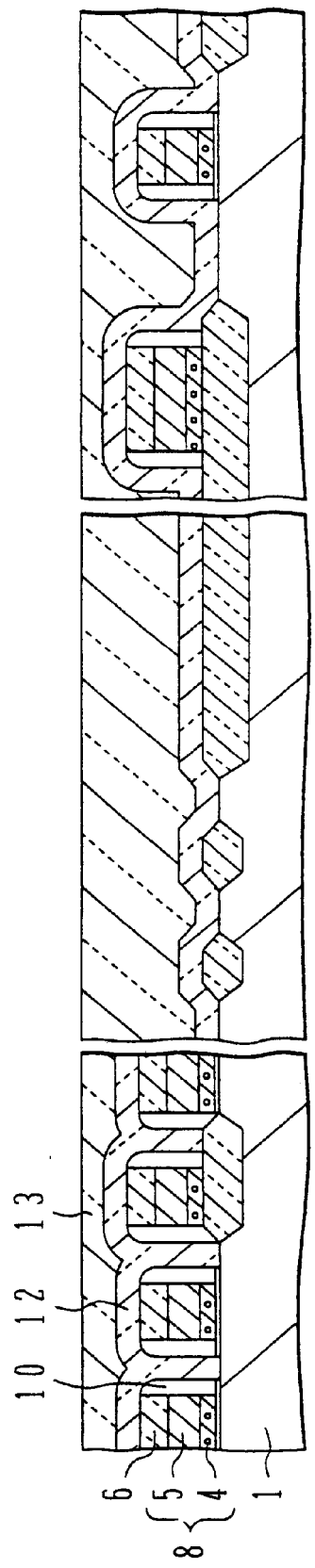

As shown in FIG. 18C, by using the gate electrode 8 as a mask, P ions are implanted into the silicon substrate 1 to form an $n^-$-type impurity diffusion region (not shown). The $n^-$-type impurity diffusion region is the source/drain region of a transfer transistor in the memory cell area, and in the peripheral circuit area a lightly doped diffusion region of the LDD of an n-channel transistor (not shown). Next, an $SiO_2$ film of 70 nm thick is formed over the whole surface of the substrate by low pressure CVD, and a side wall 10 of $SiO_2$ is formed by anisotropic etching.

In the peripheral circuit area, arsenic ions are implanted into the n-channel transistor region to form an n type diffusion region, and boron ions are implanted into a p-channel transistor region to form a $p^-$-type diffusion region (not shown).

An $Si_3N_4$ film 12 of 50 to 100 nm thick, or preferably 60 to 80 nm thick is formed on the whole surface by low pressure CVD. This $Si_3N_4$ film 12 serves as a stopper film when a contact hole is formed.

Next, a BPSG film 13 of 300 to 400 nm thick is formed as a planarizing film over the whole surface of the substrate and is reflowed by heat treatment. Next the surface of the BPSG film 13 is polished and planarized to leave it to a thickness of about 100 nm over the gate electrode 8.

Figure 18D:
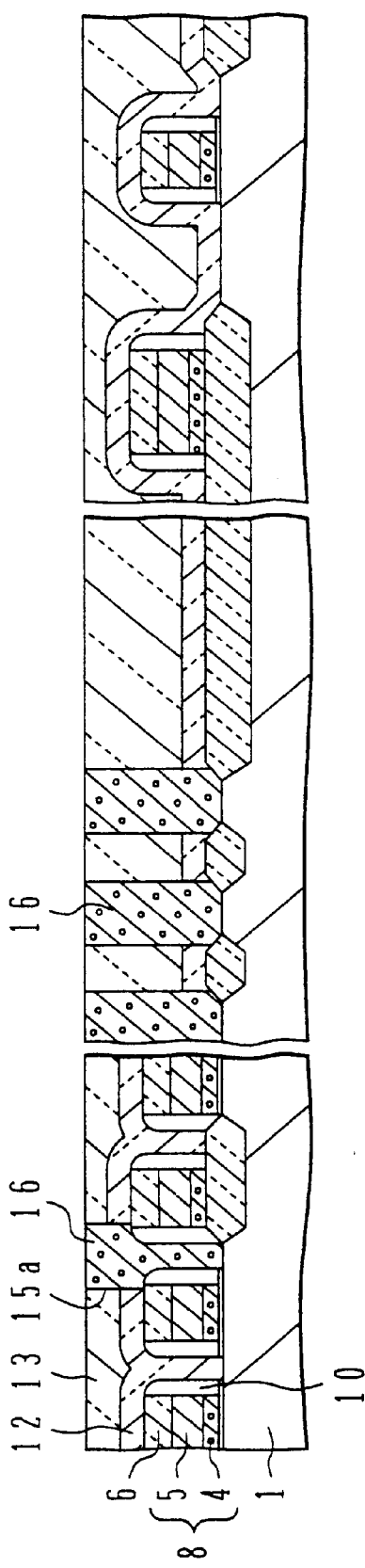

As shown in FIG. 18D, by using a resist mask pattern (not shown), the BPSG film 13 is selectively etched until the $Si_3N_4$ film 12 is slightly etched, and then the $Si_3N_4$ 12 is selectively removed to form a contact hole 15a by SAC using the oxide films 10 and 6 as etching stoppers. The resist mask pattern is preferably formed in conformity with a phase shift scheme. In order to reduce a contact resistance, phosphorous ions may be implanted into the substrate after the contact hole 15a is formed.

Next, a doped silicon layer of 200 to 300 nm thick highly doped with phosphorous is embedded in the contact holes 15s by low pressure CVD, and removed at the area on the flat upper surface of the BPSG film 13 by CMP to form a plug 16.

Figure 18E:
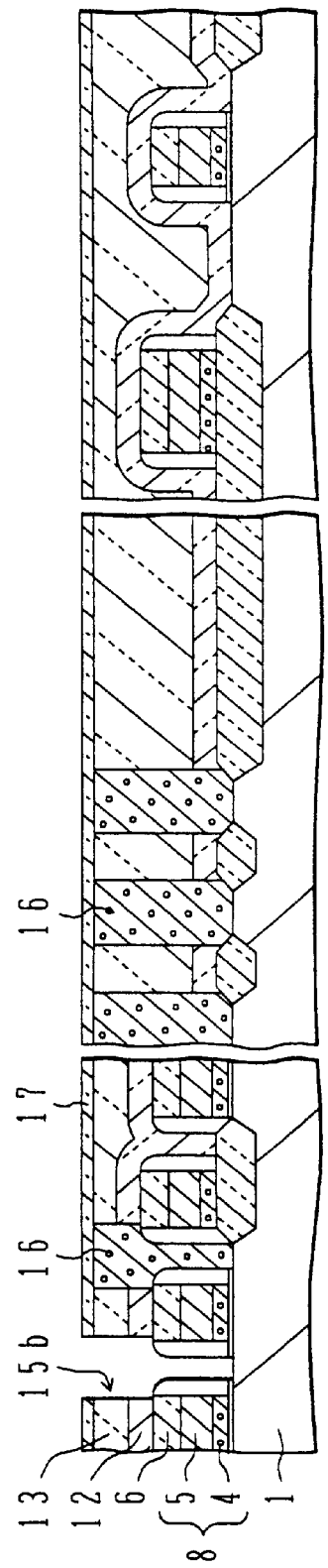

As shown in FIG. 18E, an $SiO_2$ film 17 of 20 to 50 nm thick is formed over the whole surface of the substrate covering the plug 16 by low pressure CVD. This $SiO_2$ film 17 insulates at necessary areas the plug 16 and the bit line of a second layer wiring to be formed thereon. Next, by using a resist mask pattern (not shown), the $SiO_2$ film 17 and BPSG film 13 are selectively etched at a desired position until the $Si_3N_4$ film 12 is slightly etched. Then, the $Si_3N$ film 14 is selectively removed to form a contact hole 15b for SAC at least partially defined by the $SiO_2$ side wall 10, using the oxide films as etching stoppers.

Figure 18F:
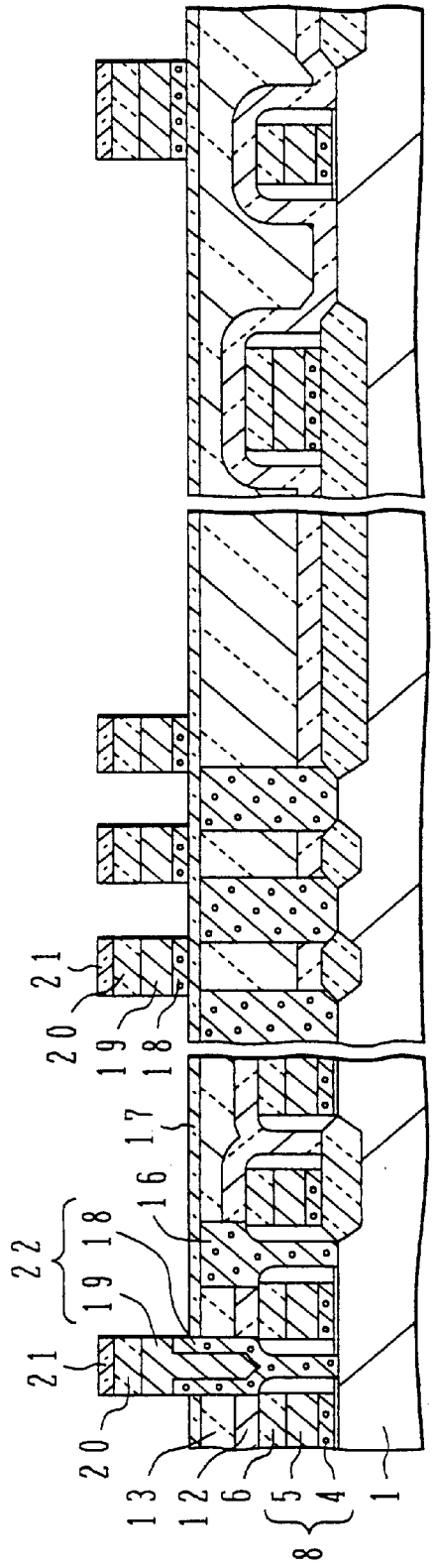

As shown in FIG. 18F, a silicon layer 18 of 40 nm thick highly doped with phosphorous, a WSi layer 19 of 120 nm thick, and an $SiO_2$ film 20 of 160 nm thick are sequentially formed over the whole surface of the substrate by low pressure CVD. An SiON film 21 of about 30 nm thick as an anti-reflection film is formed on the $SiO_2$ film 20 by plasma CVD.

Next, by using a resist mask pattern (not shown), these layers are selectively removed to form a bit line 22. If necessary, the contact anneal may be performed by RTA. For the simplicity, the SiON film 21 is not shown in the following drawings.

Figure 18G:
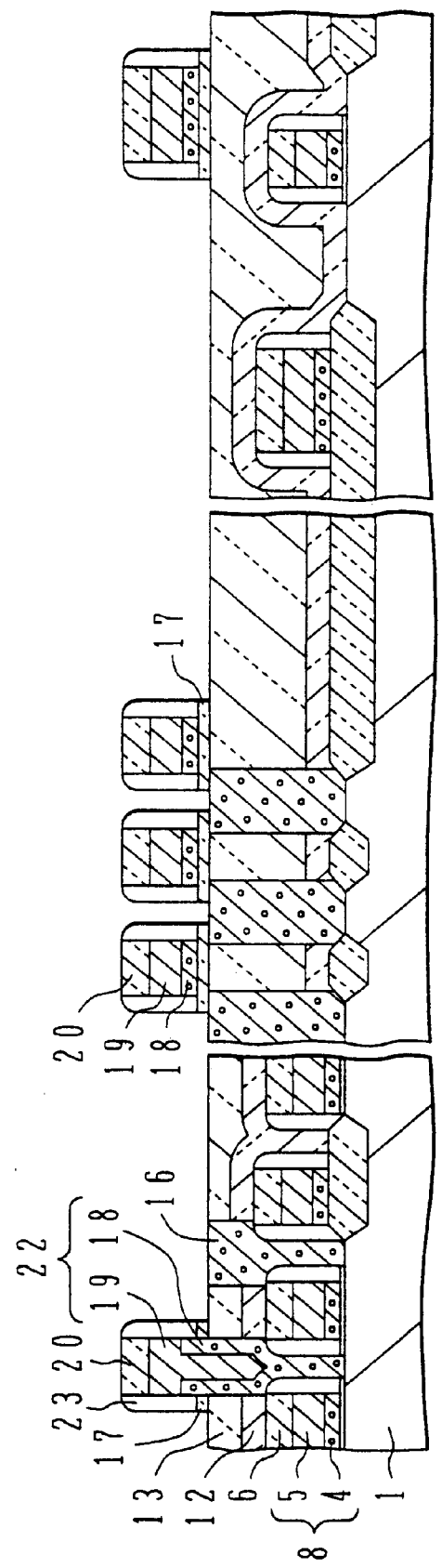

As shown in FIG. 18G, an $SiO_2$ film of 60 to 70 nm thick is formed over the whole surface of the substrate by low pressure CVD and anisotropically etched to form a side wall 23 of $SiO_2$.

This etching is set so that it etches by an amount corresponding to a film thickness of the $SiO_2$ film 17 and side wall $SiO_2$ film to thereby leave the $SiO_2$ film only under the bit lines 22 and side wall 23. Therefore, the surfaces of the plugs 16 embedded in the contact holes 15a can be exposed.

As shown in FIG. 18H, an $Si_3N_4$ film 25 of 50 to 100 nm as an etching stopper for SAC is formed by low pressure CVD. Next, a BPSG film 26 of 1000 to 1200 nm thick is formed as a planarizing film over the whole surface of the substrate and reflowed by heat treatment. The surface of the BPSG film 26 is polished by CMP to obtain a planarized BPSG film 26 of about 800 nm thick.

Figure 18I:
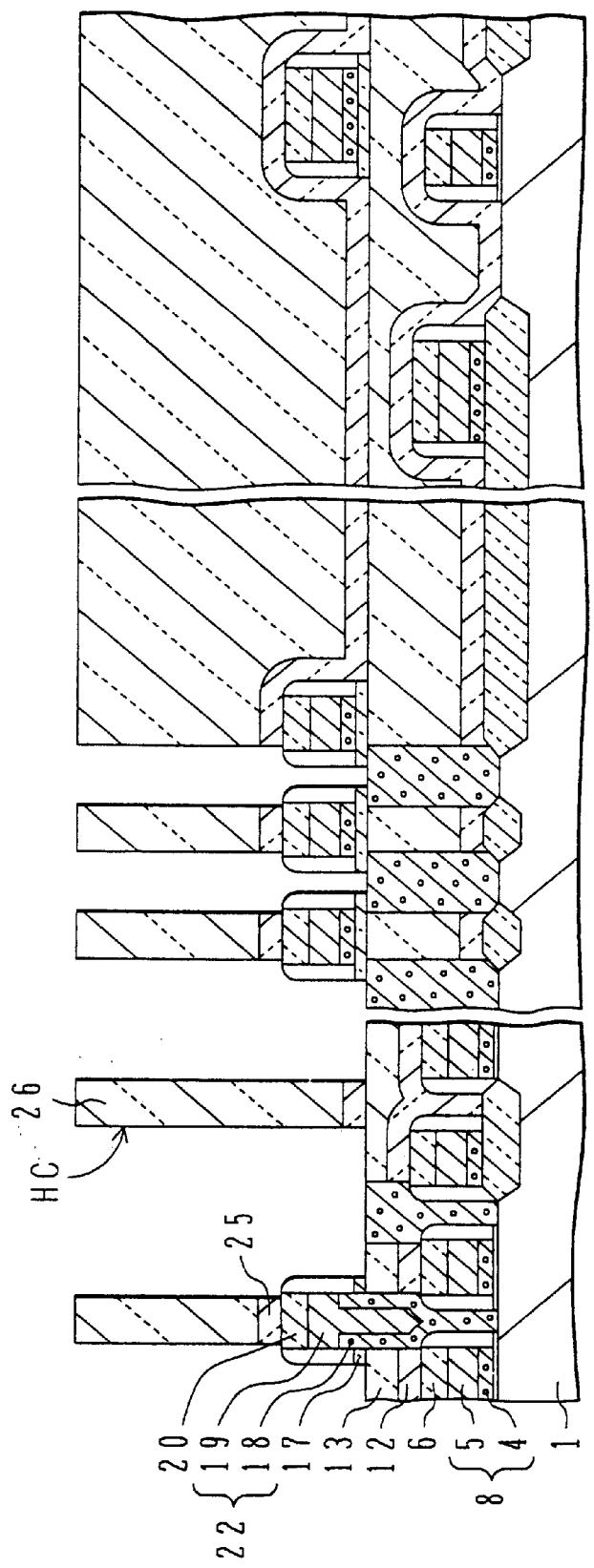

As shown in FIG. 18I, by using a resist mask pattern (not shown), the BPSG film 26 is selectively etched until the $Si_3N_4$ film 25 is slightly etched. Then, the $Si_3N_4$ film 25 is selectively etched and a SAC contact area HC for storage electrode is formed using the oxide film and the silicon film as etching stoppers.

Figure 18J:
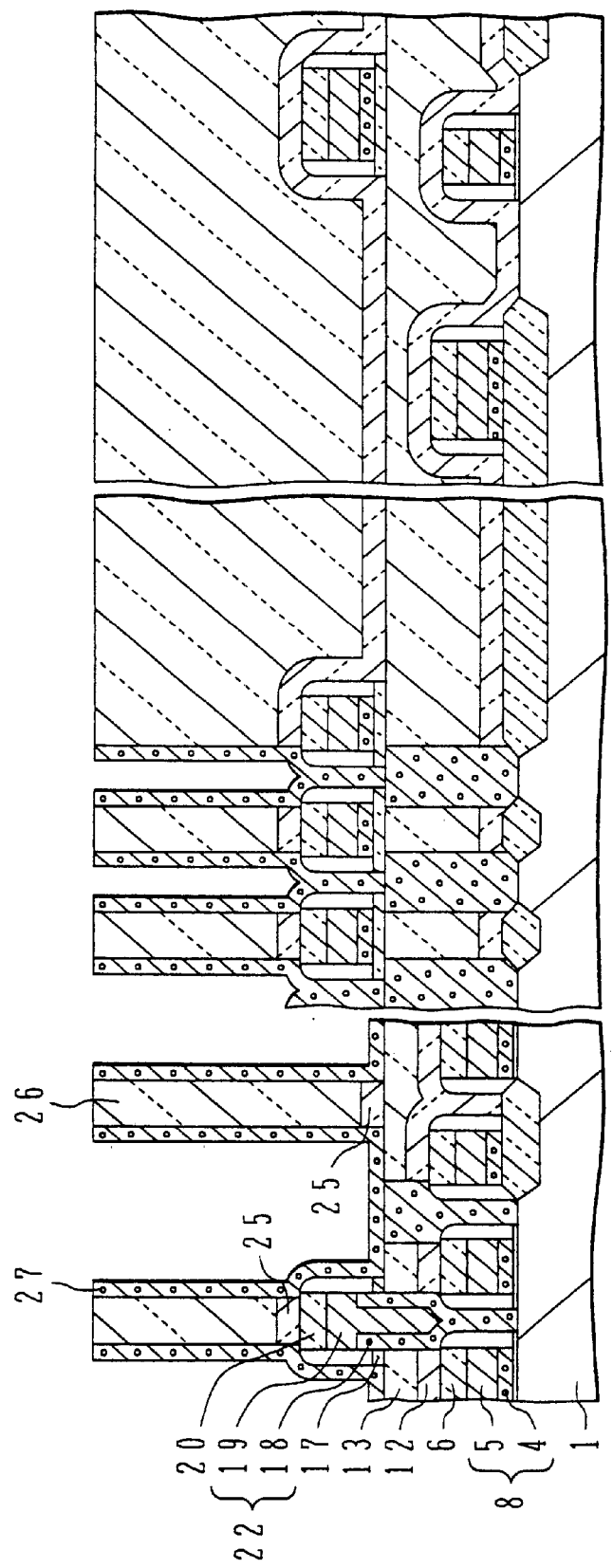

As shown in FIG. 18J, a silicon layer of 60 nm thick highly doped with phosphorous is formed over the whole surface by low pressure CVD, and the silicon layer on the BPSG film 26 is removed by CMP to leave as a storage electrode 27 the silicon layer on the inner wall of the contact area for storage electrode.

In this case, if necessary, resist may be embedded in the concaved area of the silicon layer prior to CMP and is removed after CMP. In this manner, it becomes possible to eliminate a difficulty of removing the resist because of CMP polishing particles attached to the concaved area.

Figure 18K:
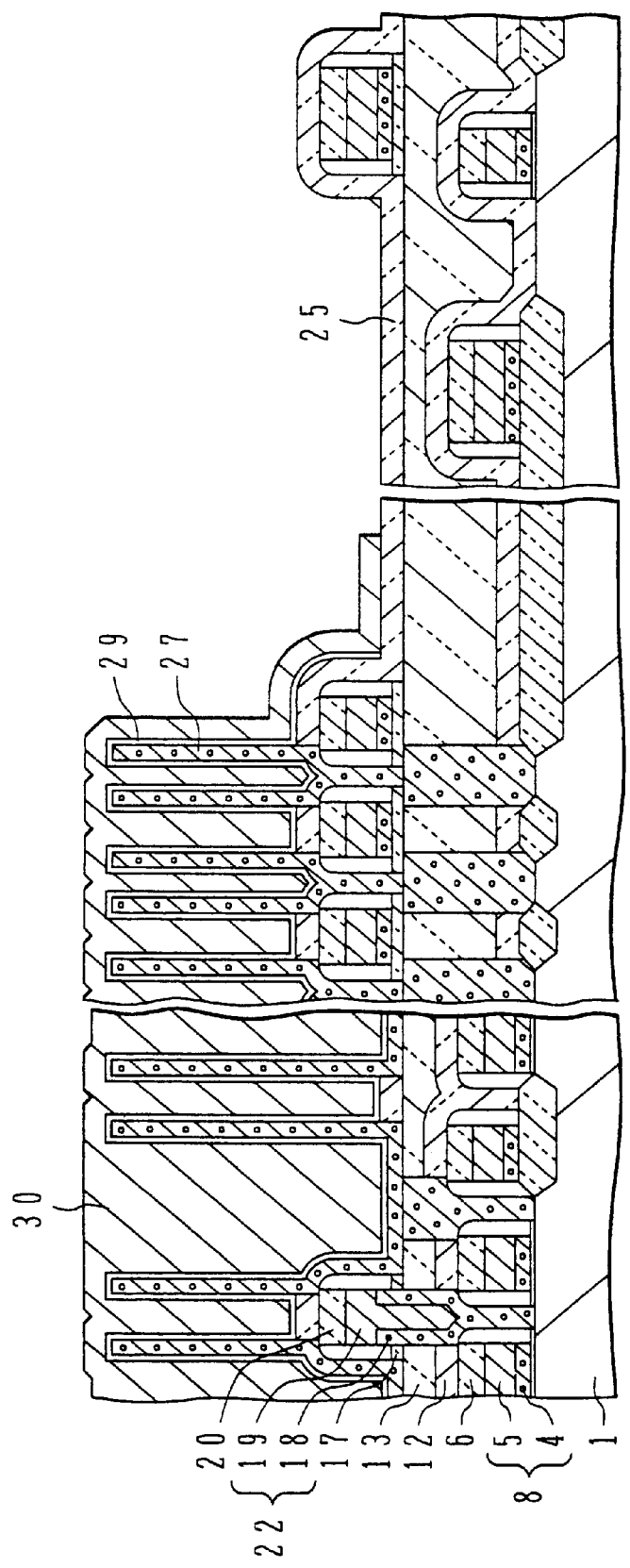

As shown in FIG. 18K, by using the $Si_3N_4$ film 25 as an etching stopper, the BPSG film 26 is removed by wet etching using HF containing etchant gas to expose the outer side of the storage electrode. Next, a $Ta_2O_5$ film 29 of 5 to 15 nm thick is formed by CVD, and thermal oxidation or oxygen plasma anneal is performed to make the $Ta_2O_5$ film 29 dense.

A TiN film of 100 nm thick as an opposing electrode is formed over the whole surface by low pressure CVD and etched by using a resist mask pattern (not shown) and Cl containing etchant gas to form an opposing electrode 30.

It is preferable that after the TiN film is etched, the $Ta_2O_5$ film is also etched. It is also preferable that prior to forming the $Ta_2O_5$ film, the surface of the storage electrode 27 is nitrized by RTN.

Figure 18L:
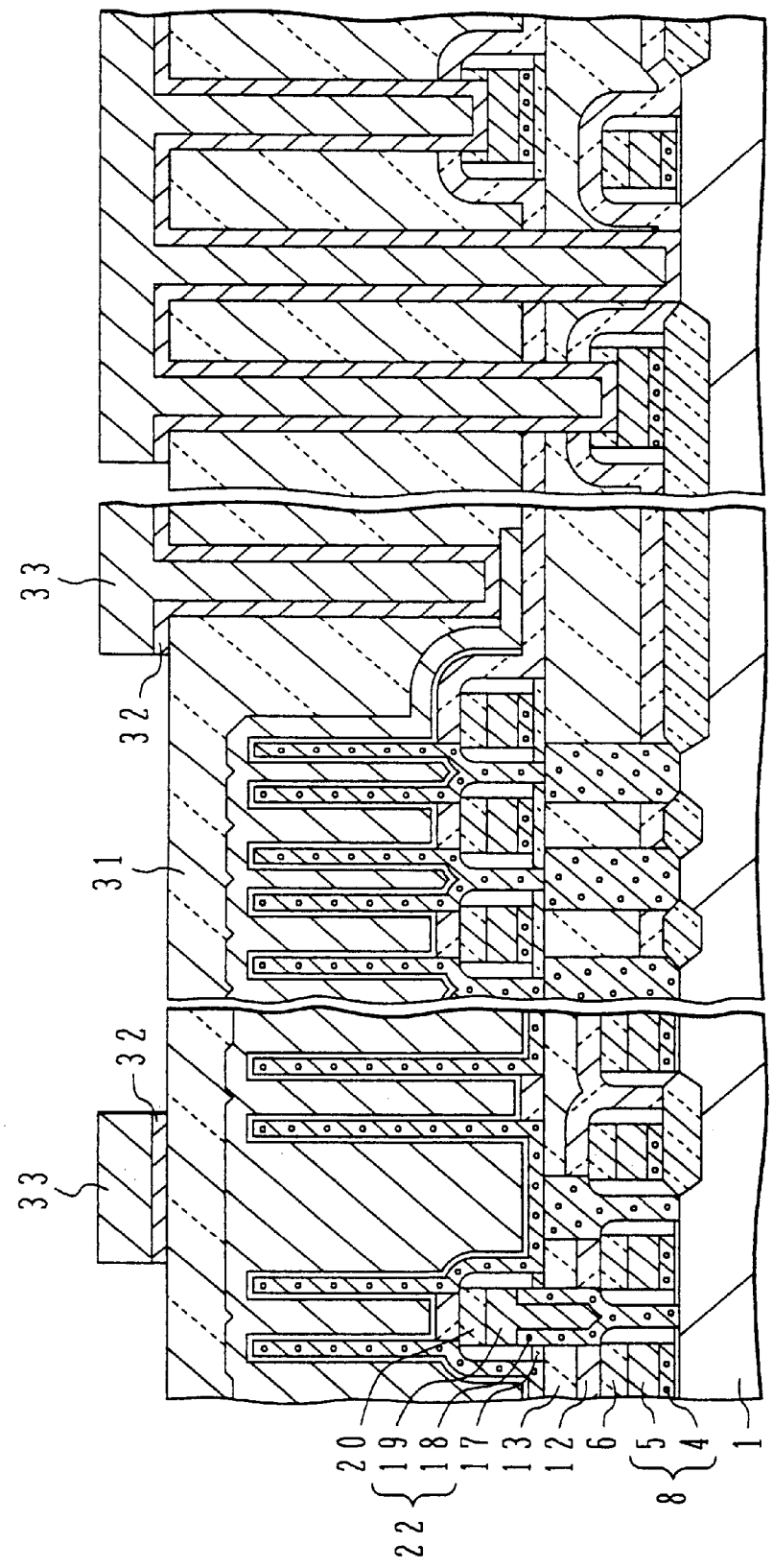

As shown in FIG. 18L, an $SiO_2$ film 31 of 1000 nm thick as an interlayer insulating film is formed by high density plasma (HDP) CVD, and the surface thereof is polished and planarized by CMP. Contact holes are then formed in the peripheral circuit area.

Next, a Ti film of 60 nm thick as a contact metal layer is formed by collimator sputtering and thereafter a TiN film of 30 nm thick is formed by CVD to thereby form a barrier metal layer 32. On this barrier metal layer 32, a W film 33 of 150 nm thick is formed.

After the processes of forming an interlayer insulating film and a wiring layer, a semiconductor device having stack type capacitors can be manufactured.

As compared to the first to eighth embodiments, in this embodiment the $Si_3N_4$ film 14 is not formed as a stopper film to be used when the contact area for the storage electrode is formed. Therefore, contact holes in the peripheral circuit area can be formed easily.

Furthermore, after the etching process of forming the side wall 23 of the bit line, the $SiO_2$ film 17 insulating the bit line 22 and plug 16 is successfully etched so that the number of etching processes can be reduced.

In the ninth embodiment, mainly a capability of reducing the number of manufacture processes has been described. However, in the ninth embodiment, if the positions of the bit line contact hole 15b and bit line 22 are misaligned, the bit line contact area exposes in the storage electrode contact area so that the bit line and storage electrode are short circuited.

Figure 19:
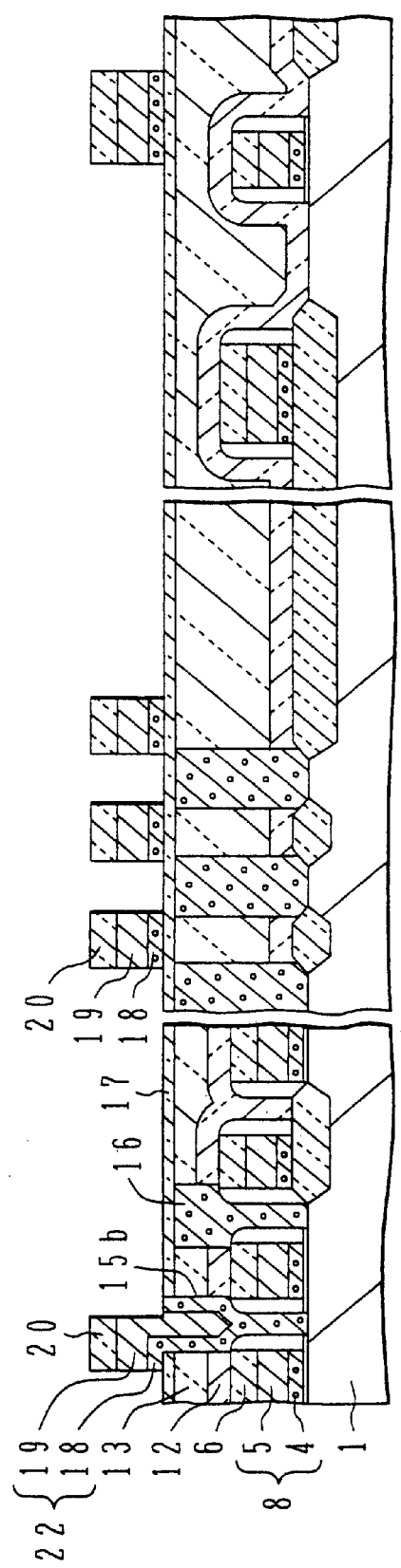
FIGS. 19 and 20 are cross sectional views of a semiconductor device illustrating some problems of the ninth embodiment.
Figure 20:
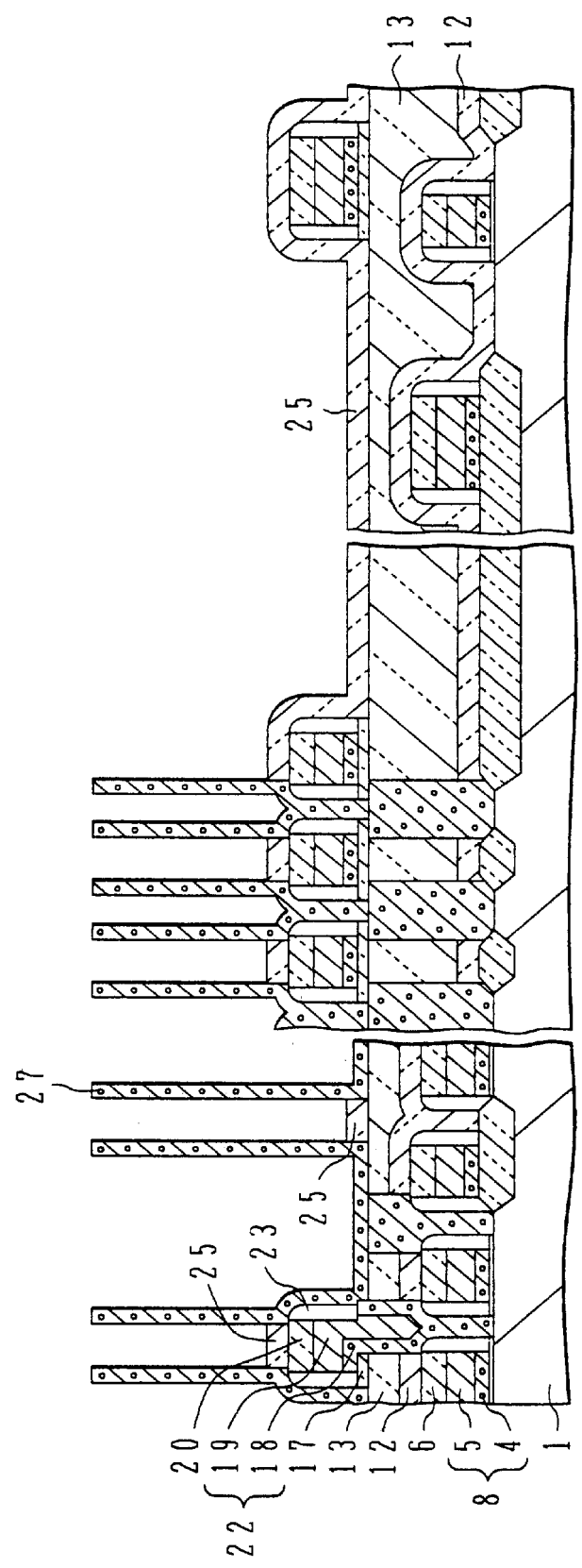

FIG. 19 shows a state of position misalignment, and FIG. 20 shows a state where the storage electrode 27 formed at a later process electrically contacts the bit line 23. FIGS. 19 and 20 correspond to states where the BPSG film is removed after the states shown in FIG. 18F and 18J of the ninth embodiment.

In the ninth embodiment, if the diameter of the bit line contact hole is considerably larger than the width of the bit line 22 or if position misalignment occurs even if the sizes of the contact hole and bit line are generally the same, the pattern of the bit line contact hole 15b greatly displaces from the pattern of the bit line 22. The following problems have been found if the pattern of the bit line contact hole greatly displaces as compared to the thickness of the side wall 23 of the bit line 22.

FIG. 19 shows the state that the displacement amount is about 1.5 times the thickness of the side wall 23, immediately after the bit line 22 is formed. If the bit line 22 is etched by an amount corresponding to the thickness of the WSi film 19 and silicon layer 18, the upper surface of the conductive film appears at the area where the bit line contact hole 15b is displaced.

FIG. 20 shows the state that the storage electrode 27 is formed by the processes of the ninth embodiment. In FIG. 20, also the pattern of the contact area for the storage electrode is displaced. The displaced portion of the contact area for the storage electrode is on the upper surface of the conductor of the bit line 22. Since the displaced portion is larger than the thickness of the side wall 23, the upper surface of the conductor is not covered with the side wall 23. Therefore, the bit line 22 and storage electrode 27 are short circuited.

These design and position misalignment lower the manufacture yield. However, design with an ample misalignment margin is disadvantageous for reducing a cell area and improving integration.

[10th Embodiment]

In this embodiment, a semiconductor device and its manufacture method are provided which can prevent the bit line 23 and storage electrode 27 from being electrically shorted even if position misalignment is generated.

The tenth embodiment will be specifically described with reference to FIGS. 21A to 21D. The process illustrated in FIG. 21A follows the process illustrated in FIG. 18E of the ninth embodiment. Similar elements to those of the ninth embodiment are represented by using identical reference numerals.

As shown in FIG. 21A, the processes up to opening the bit line contact hole 15b are the same as the ninth embodiment.

Next, a silicon film 18 of 40 nm thick highly doped with phosphorous, a WSi film 19 of 120 nm thick, and an $SiO_2$ film 20 of 160 nm thick are sequentially formed by CVD. Thereafter, an SiON film 21 of 30 nm as an anti-reflection film is formed by plasma CVD.

By using a mask pattern (not shown) formed by lithography with a usual reticle or phase shift reticle, the SiON film 21 and $SiO_2$ film 20 are dry etched using F containing etchant gas and the WSi film 19 and silicon film 18 are dry etched using Cl containing etchant gas, to thereby form the bit line 22. If necessary, the contact anneal may be performed by RTA. For the simplicity, the SiON film 21 is omitted in the following drawings.

Figure 21B:
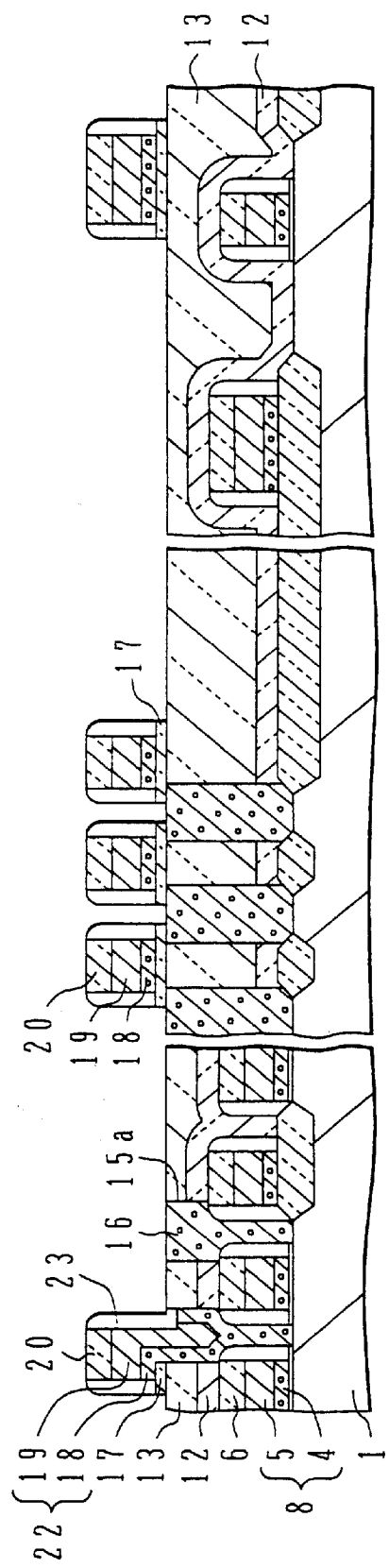

As shown in FIG. 21B, an $SiO_2$ film of 70 nm thick is formed and anisotropically etched to form a side wall 23. The etching amount is set to an amount corresponding to the total thickness of the $SiO_2$ film 17 and side wall $SiO_2$ film 23 so that the $SiO_2$ film 17 is left only under the bit line 22 and side wall 23. Therefore, the surface of the plug 16 embedded in the contact hole 15a is exposed.

The characteristic feature of this embodiment is that in etching the bit line 22, an over-etch is performed to form a caved area in the bit line conductor in the bit line contact hole 15b.

The caving amount by an over-etch is determined as in the following. A displacement amount of the bit line contact hole 15b from the pattern of the bit line 22, to be caused by position misalignment or the like, is represented by d. A thickness of an $SiO_2$ film for forming the side wall 23 at the next process is represented by t. For the description simplicity, the coverage of the $SiO_2$ film is assumed to be 100%, i.e., the $SiO_2$ is assumed to be formed entirely conformally.

If $d \leq t$, the caving amount may take a value necessary for electrical insulation. For example, the same amount as t may be selected. With this setting, a distance between the conductor of the bit line and the conductor of the storage electrode is t or larger anywhere. If the value necessary for electrical insulation in w and if $d<t-w$, then the bit line conductor is not required to be caved.

Referring to FIG. 21B, if $2t>d>t$, a caving formed in the bit line conductor in the contact hole can be fully embedded by the $SiO_2$ film 23 grown on both the surfaces of the caving. The curved surface of the side wall 23 formed from the right side wall of the bit line contact hole 15b will form a recess or a caved portion and continue to the side wall portion. This caved amount is $t-[t^2-(d-t)^2]^{1/2}$. The conductor of the bit line should therefore be caved by an amount corresponding to the sum of this caved amount and the value necessary for electrical insulation.

If $d \geq 2t$, it becomes impossible to fill the caved portion with the $SiO_2$ film 23, and electrical short is inevitable even in this embodiment. However, if $t=0.07$ μm as in this embodiment, then this fatal case corresponds to $d=0.14$ μm or larger. Assuming that the position misalignment is 0.1 μm at a maximum, the diameter of the bit line contact hole 15b is larger than the bit line width by $(0.14-0.1)\times 2=0.08$ μm. Design using such a large difference produces no merit for devices of generations of about 0.25 μm or smaller.

If the coverage is not 100%, the values d and t and the caved amount are determined while taking into consideration the situation that a lateral film thickness may increase or a void may be formed. If an over-etch of the bit line is controlled to form a normal taper in the bit line contact hole 15b, the $SiO_2$ film can be well embedded even if the coverage is poor. It is also advantageous to form a normal taper on the upper portion of the bit line contact hole 15b.

The caved amount of the bit line conductive film over-etched at the bit line contact hole 15b will be detailed by using particular numerical values.

A 0.2 μm device is used in the following by way of example. The width of a bit line and its pitch are 0.2 μm. The diameter of the bit line contact hole 15b is set to about 0.24 μm which is adequate from the viewpoint of photolithography. The maximum position displacement is typically 0.1 μm. This position displacement contains a variation of the sizes of the bit line contact hole 15b and bit line 22. Namely, a larger bit line contact hole 15b and a narrower bit line 22 are assumed (a 10% misalignment is assumed at each side).

Then, the possible maximum displacement d is $(0.24-0.2)/2+0.1=0.12$ μm.

The thickness of a side wall insulating film has a limit of about 70 nm, because the contact width is only 0.06 μm if the side wall of 0.07 μm is formed on both sides of the bit line 22 disposed at a pitch (gap) of 0.2 μm.

In practical manufacture, not only there is a position misalignment, but also there are variations of film thicknesses and etching amounts. Typically, a variation of 7% is considered for the film formation and 7% for the etching amount. Therefore, it is proper to set the thickness t to 0.065 μm at the worst.

Then, the caving amount $\Delta$ is $t-(t^2-(d-t)^2)^{1/2}=0.03$ μm.

If the variations of film thicknesses and etching amounts for the side wall are considered, it becomes necessary to consider an additional margin of 0.01 μm. Since the minimum of about 0.02 μm is necessary for ensuring electrical insulation, it is proper to cave the bit line conductor by 0.06 μm or more in total.

In patterning a bit line, an over-etch has been conventionally incorporated in order to absorb variations of film thicknesses and etching amounts. The over-etch amount is about 20% at a minimum. It is to be noted that an over-etch in excess of this value is not necessary according to conventional etching techniques, because the device structure is planarized. In this embodiment, the silicon film is 40 nm thick and the WSi film is 120 nm thick so that the over-etch is 20% of 160 nm, which is 0.032 μm. According to conventional techniques, the caved amount at the bit line contact hole 15b is therefore typically about 0.032 μm.

In contrast, in this embodiment, since the caved area of 0.06 μm or more is formed, the bit line conductor and the storage electrode conductor at the bit line contact area can be prevented from being electrically shorted.

According to conventional techniques, the bit line is typically patterned to be bold at the bit line contact hole so as not to expose the bit line from the bit line contact hole even there is some position misalignment.

In this case, even if how much an over-etch is performed, the caved area will not be formed in the bit line at the contact hole and a short circuit which is an issue of this embodiment will not occur. In other words, the issue of this embodiment derives from no additional margin because of high integration and the device structure described above.

As another example, it is assumed that the diameter of the bit line contact hole 15b is designed to be 0.22 μm and the position misalignment is 0.09 μm. In this case, the values are $d=0.1$ μm, $t=0.065$ μm, and $\Delta=0.01$ μm.

Considering the additional margin of 0.01 μm required when forming a side wall and 0.02 μm for electrical isolation, the minimum caving amount becomes 0.04 μm.

As a further example, it is assumed that the side wall width at the contact hole 15b becomes 60 nm because the coverage is not 100%. In this case, the values are $d=0.1$ μm, $t=0.056$ μm, and $\Delta=0.024$ μm. Considering the additional margin of 0.01 μm required when forming a side wall and 0.02 μm for electrical isolation, the minimum caving amount becomes 0.054 μm.

Figure 21C:
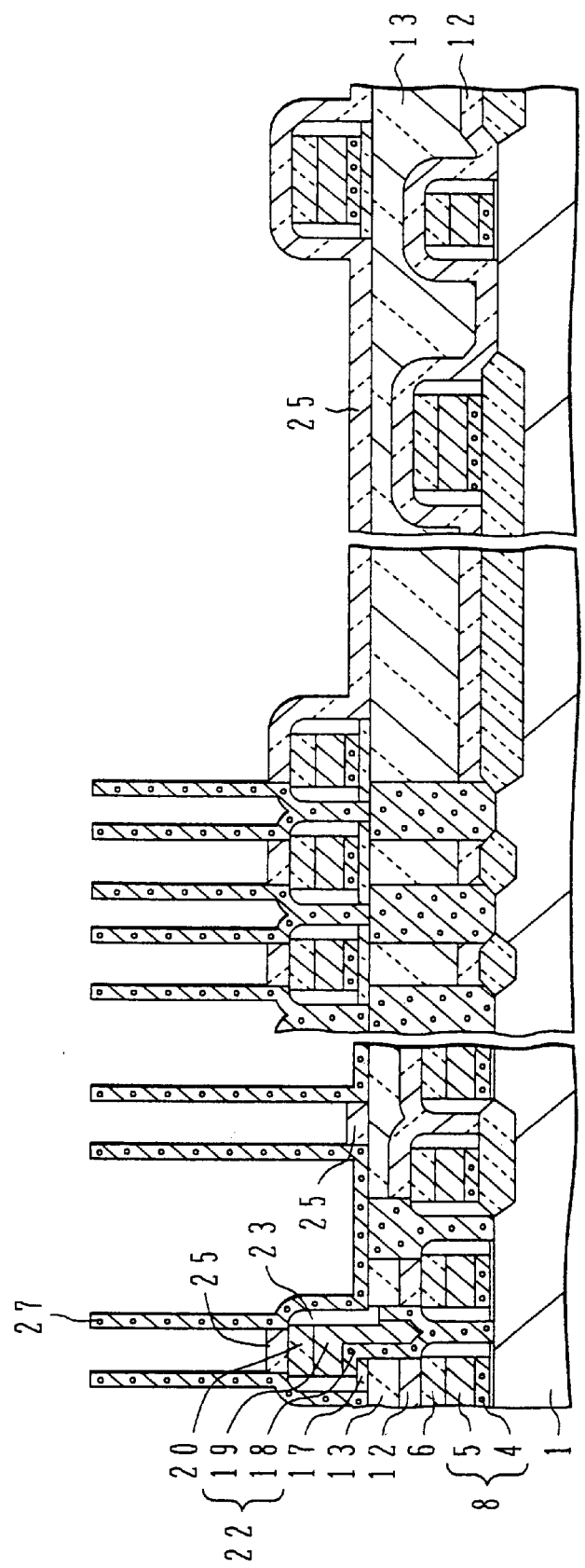

As shown in FIG. 21C, similar to the processes of the ninth embodiment illustrated in FIGS. 18H to 18J, a storage electrode 27 is formed.

Figure 21D:
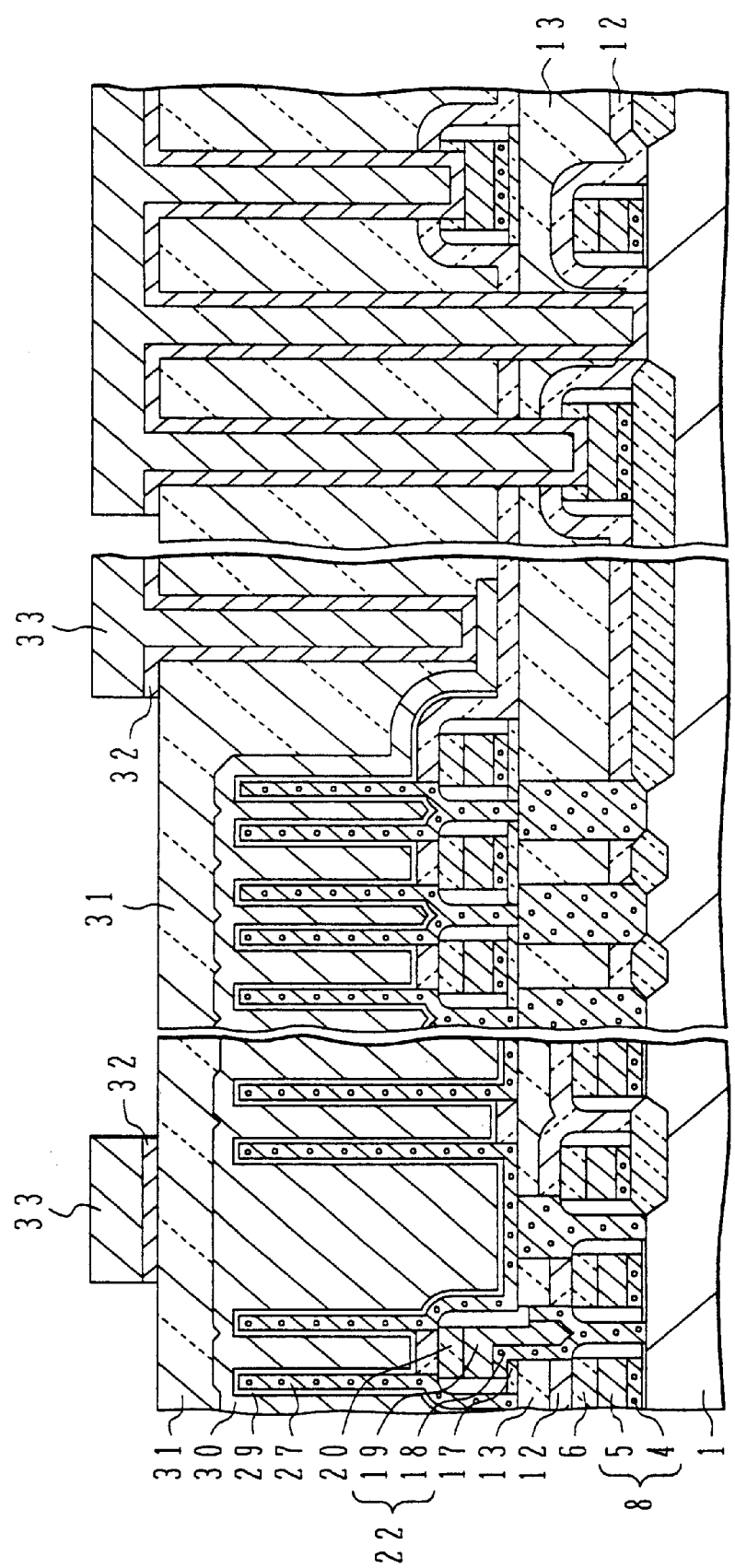

As shown in FIG. 21D, similar to the processes of the ninth embodiment illustrated in FIGS. 18K and 18L, a capacitor dielectric film 29 (not shown), an opposing electrode 30, an interlayer insulating film 31, and wiring layers 32 and 33 are formed.

After the processes of forming an interlayer insulating film, wiring layer, and the like, a semiconductor device having stack type capacitors can be manufactured.

In this embodiment, the problem of a short circuit between the bit line 22 and storage electrode 27 because the bit line contact area exposed in the storage electrode contact area is electrically connected to the storage electrode, can be solved by performing a predetermined amount of over-etch when the bit line is etched.

Specifically, the conductor constituting the bit line in the bit line contact hole 15b and displaced from the bit line pattern is formed with a caved area. This caved area is embedded with a side wall insulating film when the side wall 23 is formed on the bit line 22. In this manner, the short circuit can be avoided without increasing the number of processes.

[11th Embodiment]

Figure 22:
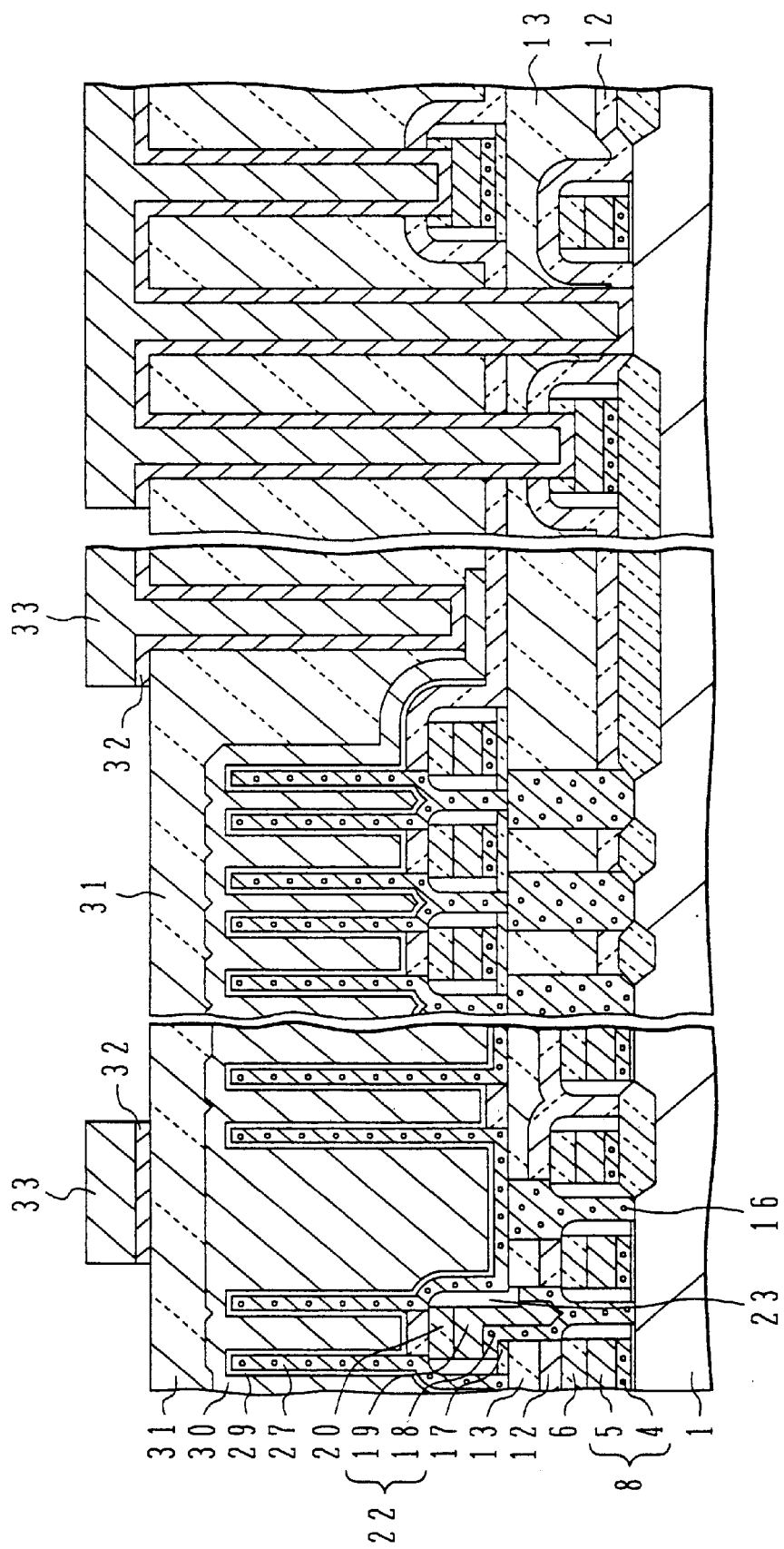
FIG. 22 is a cross sectional view of a semiconductor device according to an eleventh embodiment of the invention.

The eleventh embodiment of the invention will be described with reference to FIG. 22 which is a cross sectional view of the semiconductor device of the eleventh embodiment. In FIG. 22, similar elements to those of the ninth embodiment are represented by using identical reference numerals.

Different points from the ninth embodiment will be described with reference to FIG. 22.

In the ninth embodiment, as shown in FIG. 18G the $SiO_2$ film 17 insulating the bit line 22 from the plug 16 is partially removed at the same time when the side wall 23 is formed, and is left only just under the bit line 22 and its side wall 23. In this embodiment, at the time of patterning the side wall 23 the $SiO_2$ film 17 is not etched, but it is later etched to expose the surface of the plug 16 after the $Si_3N_4$ film 25 as a stopper film is removed at the process of opening the contact area for the storage electrode (FIG. 18I).

The advantage of this embodiment is that the method of removing the $Si_3N_4$ which has an insufficient etching ratio relative to silicon (plug 16) can be used since the underlying layers are the $SiO_2$ films 17 and 23 when the $Si_3N_4$ film 25 which has be used as an etching stopper is removed.

Figure 23:
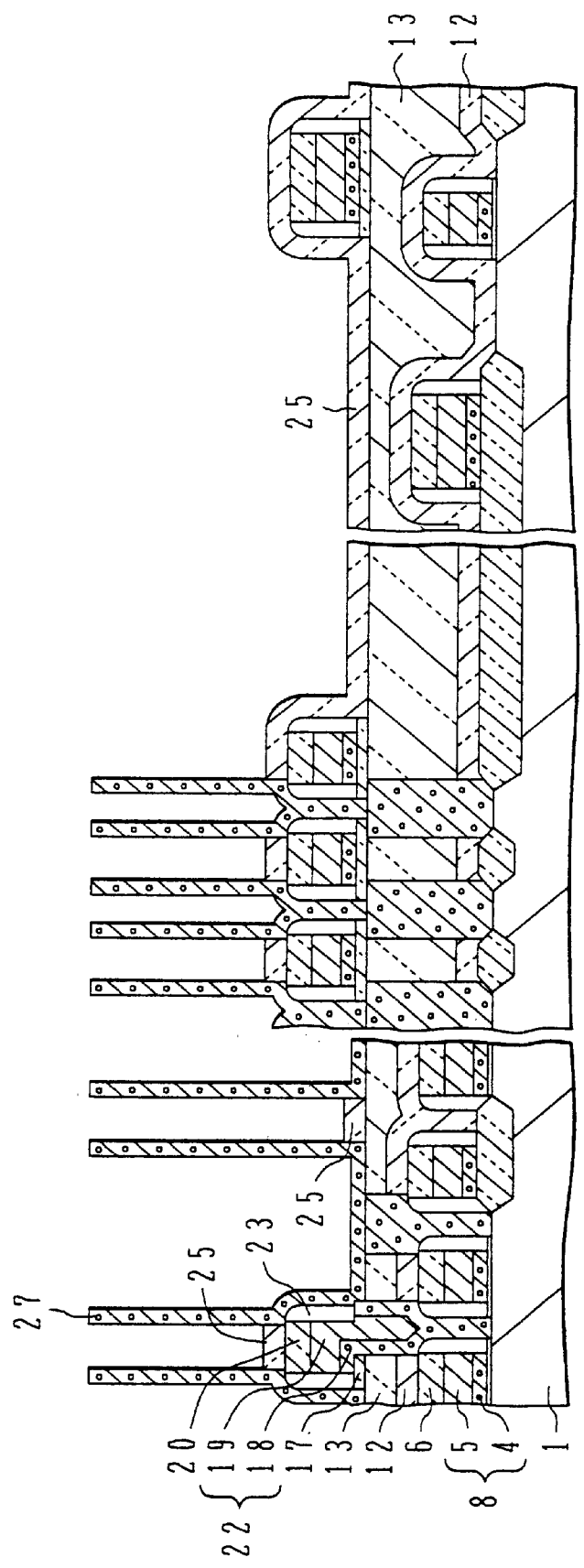
FIG. 23 is a cross sectional view of a semiconductor device illustrating some problems of the eleventh embodiment.

Also in the manufacture method of this embodiment, the short circuit detailed in the tenth embodiment may occur. FIG. 23 shows a state that the bit line contact hole 15b is greatly displaced from the bit line 22. Since the conductor constituting the bit line 22 is exposed when the contact area for the storage electrode is opened, the bit line 22 is electrically shorted to the storage electrode 27.

This problem can be solved by forming a caved area in the bit line similar to the tenth embodiment.

[12th Embodiment]

In the tenth embodiment, the method of preventing a short circuit between the bit line 22 and storage electrode 27 to be caused by a position misalignment of the bit line contact hole 15b and bit line 22 has been described. In this embodiment, the short circuit is prevented by incorporating a different method which will be described with reference to FIGS. 24, 25A, and 25B.

Figure 24:
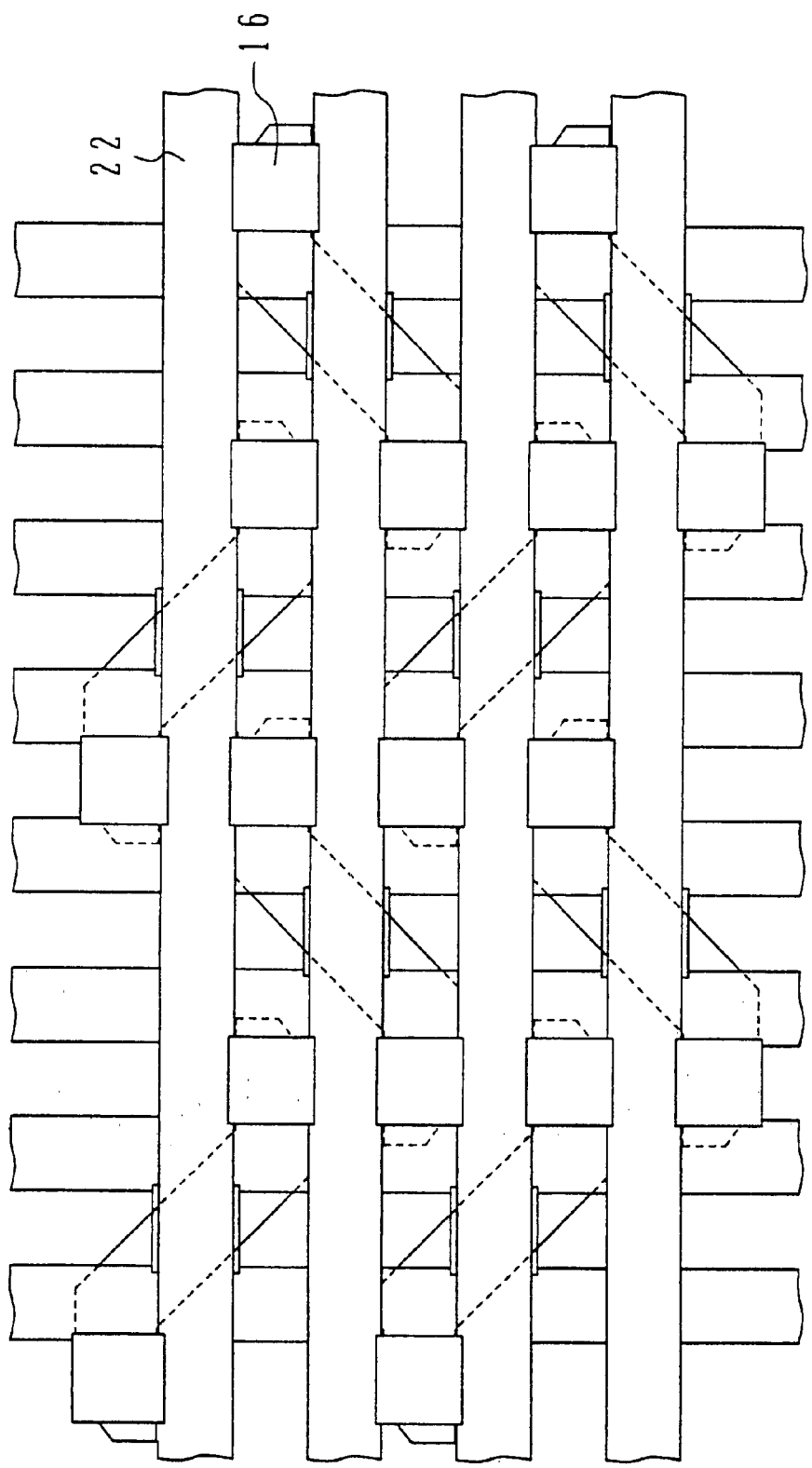
FIG. 24 is a plan view of a memory cell area of a semiconductor device according to a twelfth embodiment of the invention.

FIG. 24 is a plan view of the memory cell of this embodiment, and FIGS. 25A and 25B are cross sectional views of the semiconductor device of this embodiment. The process illustrated in FIGS. 25A and 25B follow the process illustrated in FIG. 19 of the tenth embodiment. In FIGS. 24, 25A, and 25B, similar elements to those of the tenth embodiment are represented by using identical reference numerals.

As shown in FIG. 25A, the processes up to patterning the bit line 22 are the same as the tenth embodiment.

Next, an $SiO_2$ film of 70 nm thick is formed by CVD and anisotropically etched to form a side wall 23. After the side wall 23 is formed by anisotropic etching, the $SiO_2$ film 17 may be etched to expose the surface of the plug 16.

Next, an $SiO_2$ film 24 of 30 nm thick is formed by CVD. Thereafter, the $SiO_2$ films 17 and 24 over the plug 16 for storage electrode connection are selectively etched to expose the surface of the plug 16, through lithography using a usual reticle or phase shift reticle (refer to FIG. 24).

As shown in FIG. 25B, similar to the process of the tenth embodiment illustrated in FIG. 21C, a storage electrode 27 is formed. When the $Si_3N_4$ film 25 as the etching stopper is etched at the process of opening the contact area for the storage electrode, the $SiO_2$ film 24 is used as the etching stopper. Therefore, even if the bit line contact hole 15b is misaligned with the bit line 22, the bit line contact area is not exposed.

In the above manner, the $SiO_2$ film 24 is formed under the $Si_3N_4$ film 25 as the etching stopper, and etched only at the area on the plug 16 for the storage electrode connection. Therefore, even if the bit line contact hole 15b is misaligned with the bit line 22, the bit line and storage electrode are not short circuited.

A breakdown voltage can be further improved by incorporating the over-etch of the tenth embodiment.

[13th Embodiment]

In the first to twelfth embodiments, a method of forming a cylinder type capacitor of a crown shape has been described in which the storage electrode 27 is left on the inner wall of the storage electrode contact area. The invention is not limited to a cylinder type capacitor, but is applicable also to a simple stack type capacitor and a fin type capacitor.

Figure 26:
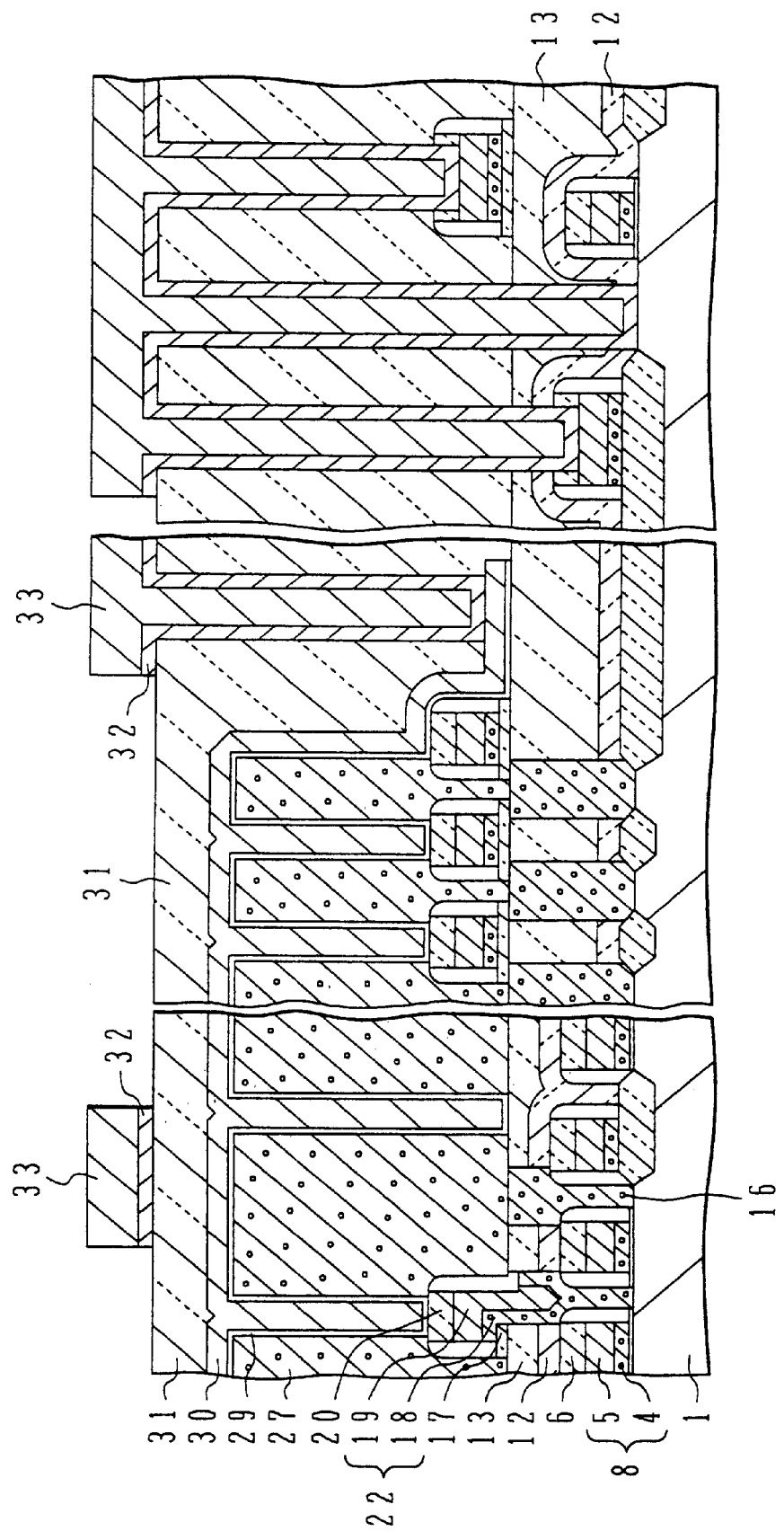
FIG. 26 is a cross sectional view of a semiconductor device according to a thirteenth embodiment of the invention.

An embodiment of a simple stack type capacitor will be described with reference to FIG. 26 which is a cross sectional view of a semiconductor device having simple stack type capacitors. This embodiment is a modification of the semiconductor device of the tenth embodiment. In FIG. 26, similar elements to those of the first to twelfth embodiments are represented by using identical reference numerals.

As shown in FIG. 26, after the process illustrated in FIG. 19, a side wall 23 is formed. At this time, the $SiO_2$ film 17 insulating the bit line 22 from the plug 16 is removed. The processes up to this are the same as the tenth embodiment.

Next, a silicon film of about 1 μm highly doped with phosphorous is formed by CVD. In this case, the surface of the doped silicon film may preferably be polished and planarized by CPU if necessary.

By using a resist mask pattern (not shown), the doped silicon layer is dry etched using Br containing etchant gas to form a storage electrode 27. In this case, if necessary, the surface of the storage electrode may be made irregular to increase the capacitance.

If the contact hole 15b for the bit line 22 is misaligned with the bit line 22, a short circuit between the bit line 22 and storage electrode 27 may occur similar to the above embodiments. However, this problem can be solved by providing a caved area in the bit line conductor at the bit line contact hole 15b.

Thereafter, the wafer processes of DRAM are completed similar to the tenth embodiment.

With this embodiment, the number of processes can be reduced greatly.

The invention may be reduced in practice by using a combination of some of the first to thirteenth embodiments.

For example, a combination of the eighth and tenth embodiment may be used. This embodiment will be described below.

In this embodiment, the $SiO_2$ films 6 and 20 on the gate electrode 8 (word line) and bit line 22 are replaced by SiN films and the side walls 10 and 23 are changed from $SiO_2$ films to SiN films. The SAC etching stopper films 12 and 25 used for forming the bit line contact hole 15b and the storage electrode contact area are replaced by thin SiN films of about 20 nm to leave gaps. At the SAC etching process, the BPSG films 13 and 26 embedded in the gaps are removed and thereafter the thin SiN films are removed by anisotropic etching.

Also in this case, the techniques quite the same as the tenth embodiment can be used. Specifically, by performing the over-etch at the etching process of the bit line, the WSi layer-silicon layer at the bit line contact hole is formed with a caved area. This caved area is embedded when the SiN film side wall is formed.

The relationship between the displacement of the bit line contact hole 15*b* from the bit line to be caused by position misalignment, the film thickness of the side wall SiN film, and the necessary caving amount, is substantially the same as the tenth embodiment.

In the anisotropic etching for forming the SiN film side wall, the $SiO_2$ film 17 insulating the bit line 22 from the plug 16 may not be removed in succession, but it may be removed after the $Si_3N_4$ film 25 as the stopper is removed after the SAC etching for forming a contact area for the storage electrode.

In the process of forming the word line 8 and bit line 22, organic material films may be coated on one of the bottom and top surfaces of a resist pattern, in place of the SiON films 7 and 21 as the anti-reflection films. In this case, the anti-reflection films are not left on the device.

As the material of the word line 8 and bit line 22, metal films such as W/TiN films may be used in addition to the WSi layers 15 and 19 and silicon films 4 and 28. For the bit line, a W/TiN/Ti film added with Ti as a contact metal is preferable.

[14th Embodiment]

As described with the first to thirteenth embodiments, the SAC process is very important to the manufacture of highly integrated semiconductor devices.

Key technology of the SAC process is an etching ratio of an insulating film to be etched to a stopper film to stop etching. Presently, if an oxide film is used as an interlayer insulating film, a nitride film is prominent as the stopper film. However, its etching ratio in dry etching is not sufficient.

Figure 27A:
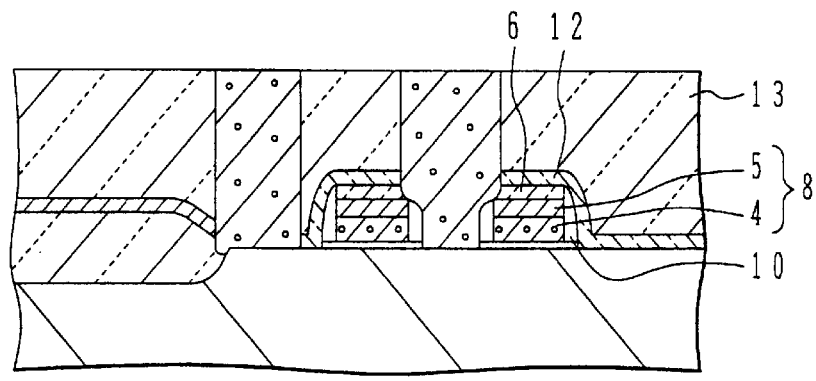
FIGS. 27A to 27C are cross sectional views of a substrate illustrating a semiconductor device according to a fourteenth embodiment of the invention.

FIG. 27A is a cross sectional view of a semiconductor device illustrating the SAC process. In FIG. 27A, similar elements to those of the first to thirteenth embodiments are represented by identical reference numerals.

FIG. 27A shows a state that the $SiO_2$ films 6 and 10 covering the gate electrode 8 are etched at the shoulder of the gate electrode 8. If the BPSG film 13 as an interlayer insulating film is formed thick, it is necessary to form the $Si_3N_4$ film 12 thick so as to make it function as the stopper film. However, while the thick $Si_3N_4$ film 12 is etched, the underlying $SiO_2$ films 6 and 10 are also etched so that the breakdown voltage between the gate electrode and the contact area lowers.

Use of the SAC process is therefore difficult if a presently available etching ratio is used.

In this embodiment, therefore, the stopper $Si_3N_4$ film is made to have a double structure in order to stabilize the SAC process.

Figure 27B:
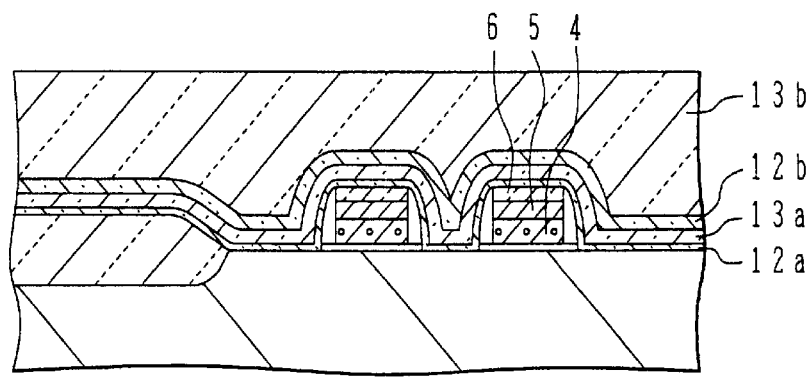
Figure 27C:
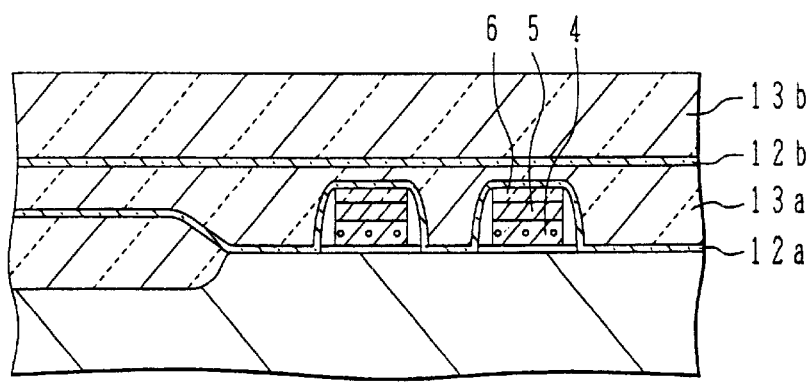

The fourteenth embodiment will be specifically described with reference to FIGS. 27B and 27C. In FIGS. 27B and 27C, identical elements are denoted by the same reference numerals.

FIG. 27B is a cross sectional view of a semiconductor device of this embodiment.

As shown in FIG. 27B, after the gate electrode 8 is formed, an $Si_3N_4$ film 12*a,* an oxide film 13*a,* an $Si_3N_4$ film 12B, and an oxide film 13B are deposited by CVD to thicknesses of 10 nm, 50 nm, 70 nm, and 300 nm, respectively.

Next, a method of forming a contact hole between gate electrodes will be described. First, the oxide film 13*b* is etched, for example, by high density plasma using mixed gas of $C_4F_8$ and Ar. Next, the $Si_3N_4$ 12*b* is etched at a proper etching ratio to the oxide film 13*a,* for example, by wet etching using phosphoric acid or dry etching using mixed gas of $SF_6$ and $O_2$, or $SF_6$ and HBr. The oxide film 13*a* and $Si_3N_4$ film 12*a* are etched in the same manner as above.

For the dry etching of the $Si_3N_4$ 12*a*, it becomes necessary in some cases to form an oxide film under the $Si_3N_4$ film 12*a*. This oxide film is etched by RIE using etchant gas of $CF_4$, $CHF_3$, or Ar. The nitride films may be etched by RIE using etchant gas of $CF_4$, $CHF_3$, or Ar.

In the embodiment shown in FIG. 27B, the upper $Si_3N_4$ film 12 is used as the stopper film for etching the thick oxide film 13*b*. Therefore, the lower $Si_3N_4$ film 12*a* can be made much thinner than the upper $Si_3N_4$ film 12*b*.

The SAC process allowing the upper $Si_3N_4$ film 12*b* to be made thin will be described.

As shown in FIG. 27C, after the gate electrode 8 is formed, an $Si_3N_4$ film 12*a* and an oxide film 13*a* (not shown) are deposited to thicknesses of 20 nm and 50 nm, respectively. An SOG film 13*c* is coated to a thickness of 100 nm and planarized. In this case, the SOG film may be coated directly on the gate electrode without forming an insulating film such as the films 12*a* and 13*a*. An insulating film may be deposited to a thickness of 600 nm and polished by CMP to planarize the surface thereof.

Next, an $Si_3N_4$ film 12*b* and an oxide film 13*b* are deposited to thicknesses of 50 nm and 300 nm, respectively.

The method of forming a contact hole may use the same techniques described with FIG. 27B.

In the embodiment shown in FIG. 27C, after the lower $Si_3N_4$ film 12*a* and oxide film 13*a* are formed, the SOG film 13*c* is formed and planarized. The upper oxide film 13*b* becomes flat. Therefore, a load on the upper $Si_3N_4$ film 12*b* can be lowered when the thick oxide film 13*b* is etched. Therefore, the upper $Si_3N_4$ film can be made thin.

In this embodiment, the $Si_3N_4$ film is used as the stopper film. As the stopper film material, polysilicon, metal oxide such as alumina, and the like may be used. Alumina is etched by RIE using $Cl_2$ or $BCl_3$ etchant gas or by Ar sputter etching. Polysilicon is etched by using $Cl_2$, $BCl_3$, or HBr etchant gas. If alumina and polysilicon are etched by chlorine or bromine containing gas, it is preferable to form an oxide film under the stopper film.

The double stopper structure of this embodiment allows the thickness of a stopper film to be made sufficiently thin. Therefore, an over-etch during etching a stopper film can be reduced and a sufficient breakdown voltage can be retained.

[15th Embodiment]

Figure 28:
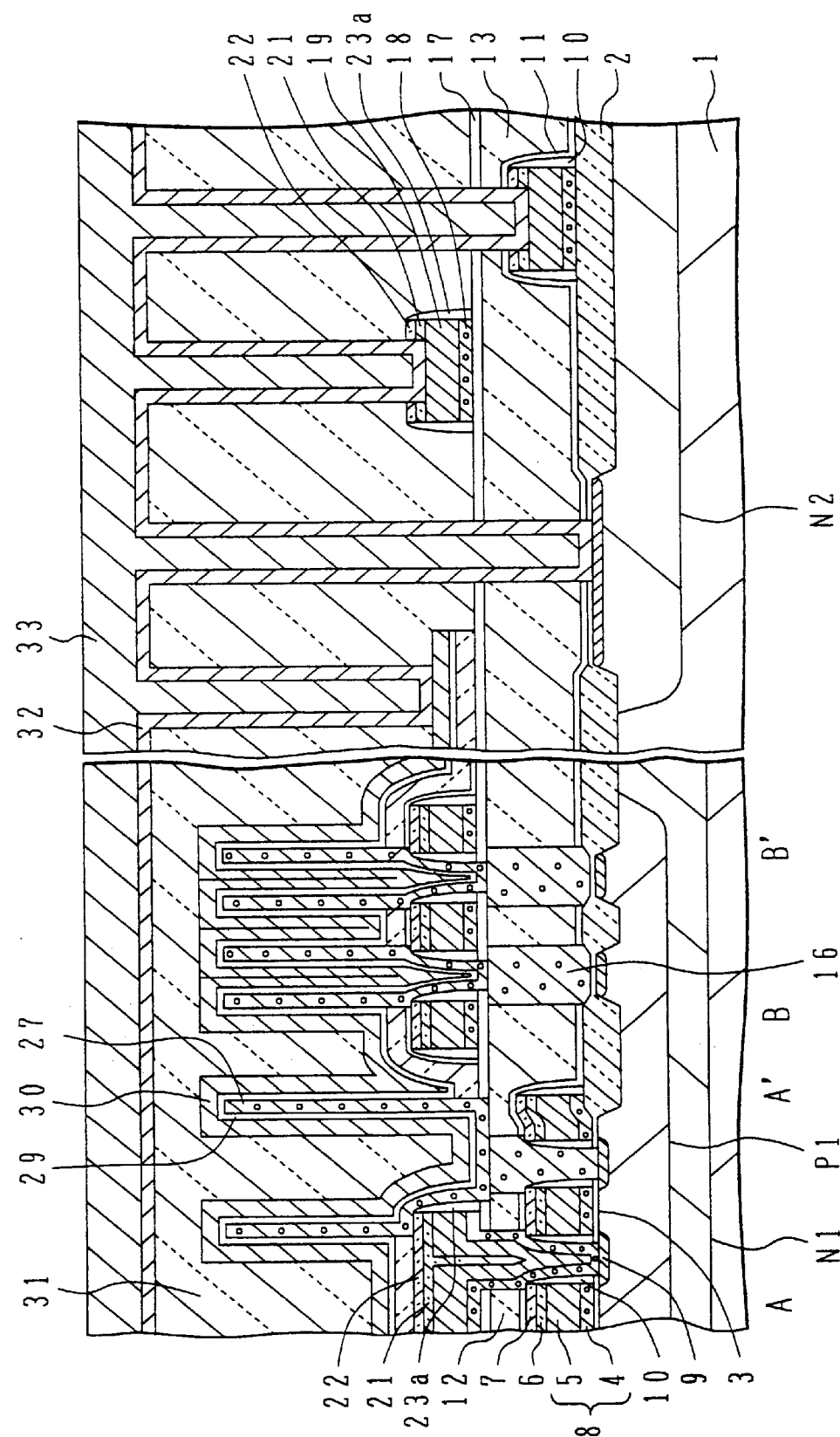
FIG. 28 is a cross sectional view of a semiconductor device according to fifteenth embodiment of the invention.
Figure 29:
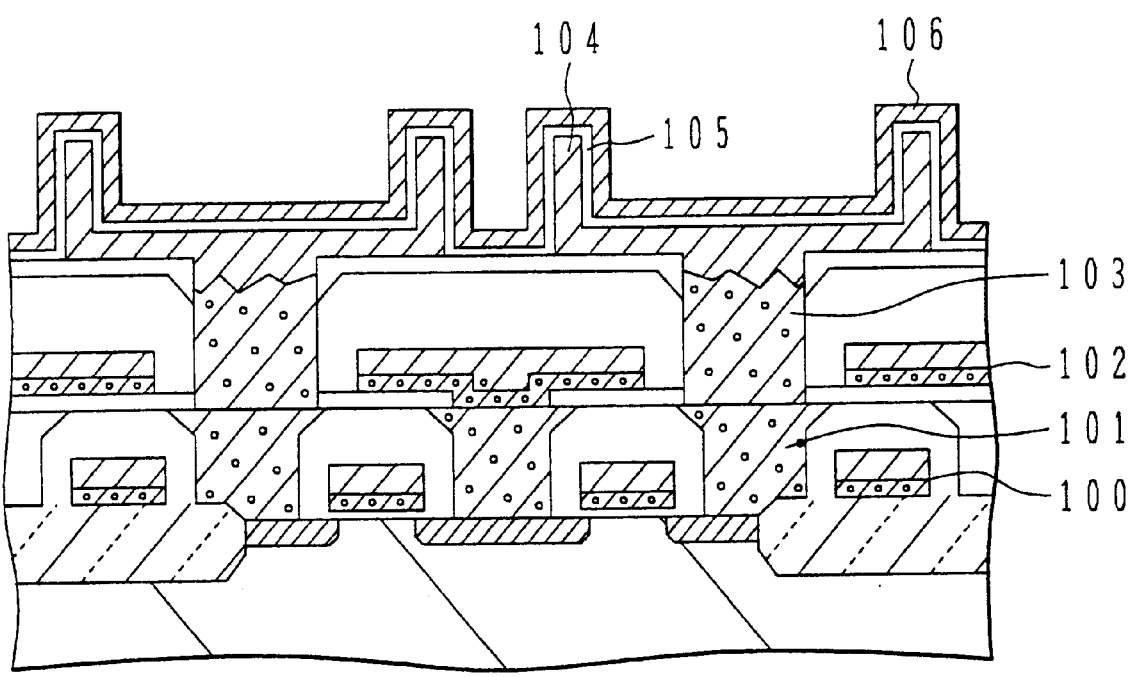
FIG. 29 is a cross sectional view of a conventional semiconductor device.

FIG. 28 is a cross sectional view of a semiconductor substrate showing the fifteenth embodiment of this invention. In a surface layer of a p-type semiconductor substrate 1, an n-type well N1 is formed, and a p-type well P1 is formed therein, in the memory cell area. In the peripheral circuit area, an n-type well N2 is formed. In the memory cell area, an n-channel transfer transistor is formed in the p-type well P1. In the peripheral circuit area, a p-channel transistor is formed in the n-type well N2. Here, a double-well may also be formed in the peripheral circuit area, and an n-channel transistor may be formed in a p-type well formed in an n-type well.

A field oxide film 2 is formed on the surface of the substrate to define active regions enclosed by the field oxide film 2. In the memory cell area, a polycrystalline silicon layer 4 and a tungsten silicide layer 5 are formed on a gate insulating film 3, to form a gate electrode 8. A silicon oxide film 6 and an SiON film 7 serving as an antireflection film are formed on the gate electrode 8. The SiON film 7, silicon oxide film 6 and gate electrode 8 are patterned by photolithography. Then, side wall insulating films 10 of SiN are formed on the side walls of the gate electrode structure. N-type impurities are doped on both sides of the gate electrode to form source/drain regions 9.

An SiN film 12 is formed on the whole surface of the substrate having the above-described gate electrode (word line). On the SiN film 12, a BPSG film 13 is formed to constitute an interlevel insulating film. A contact hole is formed through the BPSG film 13 and SiN film 12 for the contact of a storage electrode, and a polycrystalline silicon region 16 is embedded in the contact hole. The polycrystalline silicon region 16 is etched back or polished to form a coplanar surface with the BPSG film 13. A high temperature oxide (HTO) film 17 of silicon oxide is formed on the coplanar surface by CVD.

In the bit line contact region, a contact hole is formed through the HTO film 17, BPSG film 13, and SiN film 12. A wiring layer formed of a laminate of a polycrystalline silicon film 18 and a tungsten silicide film 19 is formed on the surface of the HTO film 17 to embed the inside of the contact hole. This wiring constitute the bit line. The bit line is insulated from the embedded polycrystalline silicon region 16 by the HTO film 17. On the surface of the bit line, a laminate of a silicon oxide film 21 and an SiN film 22 is formed and is simultaneously patterned with the bit line. On the side walls of the bit line structure, side wall spacers of SiN film 23a are formed.

A contact hole for a storage electrode is formed through the HTO film 17 using the SiN film 22 and SiN side wall spacers 23a as etching stoppers, to expose the polycrystalline silicon region 16.

On this structure, a polycrystalline silicon layer 27 constituting a storage electrode, a capacitor dielectric layer 29 of $Ta_2O_5$ formed on the surface of the polycrystalline silicon layer 27, and a TiN layer 30 formed on the surface of the capacitor dielectric layer 29 are formed to constitute a storage capacitor.

A BPSG film 31 is formed to embed the storage capacitor and to constitute an interlevel insulating film. The surface of the BPSG film 31 is planarized by etch back or polishing.

In the peripheral circuit region, contact holes reaching contact holes through the BPSG film 31, reaching the bit line, a wiring layer formed by the same structure as the bit line, word line, a wiring layer formed simultaneously with the word line, and a conductive region in the substrate surface are formed. Then, a wiring layer formed of a barrier layer 32 including TiN/Ti laminate and a W layer and a tungsten layer 33 is formed thereon.

In this structure, an SiN film is formed on the side walls of the gate electrode of a transfer transistor, and on the side walls of the bit line, to serve as an etching stopper. On the surface of the BPSG film 13, the SiN film is not formed, and a CVD oxide film 17 is formed directly thereon. Even in such a structure, by using the SiN film covering the upper and a side surfaces of the bit line as an etching stopper, a contact hole can be formed at a desired position.

The present invention has been described in connection with the preferred embodiments. The invention is not limited only to the above embodiments. It is apparent to those skilled in the art that various modifications, improvements, combinations and the like can be made without departing from the scope of the appended claims.

What is claimed is:

1. A method of manufacturing a semiconductor device having a memory cell area and a peripheral circuit area over a semiconductor substrate, comprising the steps of:

forming a transfer transistor in said memory cell area, said transfer transistor including a pair of impurity diffusion regions formed in said substrate and a gate electrode formed over said substrate between said pair of impurity diffusion regions;

forming a first insulating film covering the upper and side surfaces of said gate electrode;

forming a second insulating film over the semiconductor substrate covering said first insulating film and said transfer transistor;

forming a contact hole through said second insulating film, said contact hole reaching one of said impurity diffusion regions;

embedding a conductive layer in said contact hole to form a conductive plug for storage electrode contact;

forming a third insulating film over said second insulating film covering said conductive plug;

forming a bit line over said third insulating film;

forming a fourth insulating film over said third insulating film covering the upper and side surfaces of said bit line;

forming an aperture through said third insulating film over said conductive plug, being aligned with said fourth insulating film;

forming a storage electrode electrically connected to said conductive plug;

forming a dielectric film on a surface of said storage electrode; and forming an opposing electrode on a surface of said dielectric film.

2. A method of manufacturing a semiconductor device according to claim 1, wherein said second insulating film comprises a lower insulating film formed on said substrate covering said first insulating film, and an upper insulating film formed on the lower insulating film.

3. A method of manufacturing a semiconductor device according to claim 2, wherein said lower insulating film comprises a silicon nitride film.

4. A method of manufacturing a semiconductor device according to claim 2, wherein said step of forming a contact hole comprises an etching step utilizing said lower insulating film as an etching stopper.

5. A method of manufacturing a semiconductor device according to claim 2, wherein said step of forming the second insulating film comprises a step of planarizing said upper insulating film.

6. A method of manufacturing a semiconductor device according to claim 5, wherein said lower insulating film comprises a silicon nitride film, and said upper insulating film comprises an impurity doped silicon oxide film.

7. A method of manufacturing a semiconductor device according to claim 1, wherein said step of forming said contact hole forms another contact hole in said peripheral circuit area at the same time with said contact hole in said memory cell area.

8. A method of manufacturing a semiconductor device according to claim 2, further comprising the step of selectively removing said lower insulating film of the second insulating film in said peripheral circuit area after said lower insulating film of the second insulating film is formed.

9. A method of manufacturing a semiconductor device according to claim 1, wherein said step of forming said transfer transistor comprises the steps of forming a conductive layer, forming an anti-reflection film on the conductive layer, patterning said conductive layer, and thereafter removing said anti-reflection film.

10. A method of manufacturing a semiconductor device according to claim 9, wherein said step of removing said anti-reflection film includes the step of selectively removing said anti-reflection film in said peripheral circuit area.

11. A method of manufacturing a semiconductor device having a memory cell area and a peripheral circuit area over a semiconductor substrate, comprising the steps of:

forming a transfer transistor in the memory cell area of said substrate, said transfer transistor including a pair of impurity diffusion regions formed in the substrate and a gate electrode formed over the substrate between said pair of impurity diffusion regions;

forming a first insulating film over said substrate covering said transfer transistor;

forming a first contact hole through said first insulating film, said first contact hole reaching one of said pair of impurity diffusion regions;

embedding a conductive layer in said first contact hole to form a conductive plug for storage electrode contact;

forming a second insulating film over said first insulating film covering said conductive plug;

forming a second contact hole through said first and second insulating films, said second contact hole reaching the other of said pair of impurity diffusion regions;

forming a bit line extending over said second insulating film and connected via said second contact hole to the other of said pair of impurity diffusion regions;

forming a storage electrode electrically connected to said conductive plug, through said second insulating film, said storage electrode partially covering the bit line;

forming a dielectric film on a surface of said storage electrode; and forming an opposing electrode on a surface of said dielectric film.

12. A method of manufacturing a semiconductor device according to claim 11, further comprising the step of planarizing a surface of said first insulating film after said first insulating film is formed.

13. A method of manufacturing a semiconductor device according to claim 11, wherein said step of forming said second contact hole forms another second contact hole in said peripheral circuit area, at the same time with said second contact hole in said memory cell area.

14. A method of manufacturing a semiconductor device according to claim 11, wherein said step of forming said first insulating film comprises the steps of forming a lower insulating film on an area including'said transfer transistor, thereafter selectively removing said lower insulating film in said peripheral circuit area, and forming an upper insulating film.

15. A method of manufacturing a semiconductor device according to claim 11, wherein said step of forming said first insulating film comprises the step of forming an uppermost insulating film on a surface of said upper insulating film, further comprising the step of selectively removing said uppermost insulating film using said opposing electrode as a mask after said step of forming said opposing electrode.

16. A method of manufacturing a semiconductor device according to claim 11, wherein said step of forming said transfer transistor comprises the steps of forming a conductive layer on the substrate, forming an anti-reflection film on the conductive layer, thereafter patterning said conductive layer, and thereafter removing said anti-reflection film.

17. A method of manufacturing a semiconductor device according to claim 16, wherein said step of removing said anti-reflection film includes the step of selectively removing said anti-reflection film in said peripheral circuit area.

18. A method of manufacturing a semiconductor device having a memory cell area and a peripheral circuit area on a semiconductor substrate, comprising the steps of:

forming a transfer transistor in said memory cell area of said substrate, said transfer transistor including a pair of impurity diffusion regions formed in said substrate and a gate electrode formed on the substrate between said pair of impurity diffusion regions;

forming a first insulating film on the substrate covering said transfer transistor;

forming a first contact hole through said first insulating film, said first contact hole reaching one of said pair of impurity diffusion regions;

embedding a conductive layer in said first contact hole to form a conductive plug for storage electrode contact;

forming a second insulating film on said first insulating film covering said conductive plug;

forming a second contact hole through said second and first insulating films, said second contact hole reaching the other of said pair of impurity diffusion regions;

forming a bit line extending on said second insulating film and connected via said second contact hole to the other of said pair of impurity diffusion regions;

forming a third insulating film covering said bit line;

anisotropically etching said third insulating film to form a side spacer of said third insulating film on a side wall of said bit line;

etching said second insulating film by using said bit line and said side spacer as a mask to expose said conductive plug;

forming a storage electrode electrically connected to said conductive plug;

forming a dielectric film on a surface of said storage electrode; and forming an opposing electrode on a surface of said dielectric film.

19. A method of manufacturing a semiconductor device having a memory cell area and a peripheral circuit area on a semiconductor substrate, comprising the steps of:

forming a transfer transistor in the memory cell area of said substrate, said transfer transistor including a pair of impurity diffusion regions formed in the substrate and a gate electrode formed on the substrate between said pair of impurity diffusion regions;

forming a first insulating film on the substrate covering said transfer transistor;

forming first and second contact holes through said first insulating film, said first contact hole reaching one of said pair of impurity diffusion regions, and said second contact hole reaching the other of said pair of impurity diffusion regions;

forming a conductive layer extending on said first insulating film and electrically connected via said second contact hole to the other of said pair of impurity diffusion regions;

selectively etching said conductive layer to form a bit line, said bit line having a recess in said second contact hole;

forming a second insulating film covering said bit line;

anisotropically etching said second insulating film to leave said second insulating film on a side wall of said bit line and on said recess;

thereafter forming a storage electrode extending above said recess and electrically connected to the one of said pair of impurity diffusion regions;

forming a dielectric film on a surface of said storage electrode; and forming an opposing electrode on a surface of said dielectric film.

20. A method of manufacturing a semiconductor device having a memory cell area and a peripheral circuit area on a semiconductor substrate, comprising the steps of:

forming a transfer transistor in the memory cell area of said substrate, said transfer transistor including a pair of impurity diffusion regions formed in the substrate and a gate electrode formed on the substrate between said pair of impurity diffusion regions;

forming a first insulating film on the substrate covering said transfer transistor;

forming a first contact hole through said first insulating film, said first contact hole reaching one of said pair of impurity diffusion regions;

embedding a conductive layer in said first contact hole to form a conductive plug for storage electrode contact;

forming a second insulating film on said first insulating film covering said conductive plug;

forming a second contact hole through said second and first insulating films, said second contact hole reaching the other of said pair of impurity diffusion regions;

forming a bit line extending on said second insulating film and connected via said second contact hole to the other of said pair of impurity diffusion regions;

forming a third insulating film covering said bit line;

anisotropically etching said third insulating film to leave said third insulating film on a side wall of said bit line;

thereafter forming a storage electrode electrically connected to said plug;

forming a dielectric film on a surface of said storage electrode; and forming an opposing electrode on a surface of said dielectric film, wherein said step of forming said bit line includes the step of etching a conductive layer by a thickness larger than a total thickness of said conductive layer and said second insulating film.

* * * * *